US006444507B1

United States Patent
Miyasaka

(10) Patent No.: US 6,444,507 B1
(45) Date of Patent: Sep. 3, 2002

(54) FABRICATION PROCESS FOR THIN FILM TRANSISTORS IN A DISPLAY OR ELECTRONIC DEVICE

(75) Inventor: Mitsutoshi Miyasaka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/621,351

(22) Filed: Jul. 21, 2000

Related U.S. Application Data

(62) Division of application No. 09/068,716, filed as application No. PCT/JP96/03092 on Oct. 22, 1996, now Pat. No. 6,124,154.

(51) Int. Cl.$^7$ .............................................. H01L 21/84
(52) U.S. Cl. ...................................... 438/164; 438/166
(58) Field of Search ................................ 438/166, 151, 438/164; 257/75

(56) References Cited

U.S. PATENT DOCUMENTS

| | | | |
|---|---|---|---|
| 5,648,276 A | * | 7/1997 | Hara et al. |
| 5,811,328 A | | 9/1998 | Zhang et al. |
| 5,851,860 A | * | 12/1998 | Makita et al. |
| 5,953,595 A | * | 9/1999 | Gosain et al. |
| 6,063,654 A | * | 5/2000 | Ohtani |

FOREIGN PATENT DOCUMENTS

| | | |
|---|---|---|
| JP | 59-204275 A | 11/1984 |
| JP | 2-228042 A | 9/1990 |
| JP | 3-104209 A | 5/1991 |
| JP | 4-93079 A | 3/1992 |
| JP | 4-100238 A | 4/1992 |
| JP | 5-29622 A | 2/1993 |
| JP | 6-260644 A | 9/1994 |
| JP | 7-99321 A | 4/1995 |
| JP | 7-131031 A | 5/1995 |
| JP | 8-195494 A | 7/1996 |
| JP | 8-204202 A | 8/1996 |

OTHER PUBLICATIONS

Campo et al., "Influence of Rapid Thermal and Low Temperature Processing on the Electrical Properties of Polysilicon Thin Film Transistors", *IEEE Transactions on Semiconductor Manufacturing*, vol. 8, No. 3, Aug. 1995, pp. 298–303.

Wolf, *Silicon Processing for the VLSI Era vol. 1: Process Technology*, Lattice Press, 1986, p. 220.

Lee et al., "High Performance Low Temperature Polysilocon Thin Film Transistor Using ECR Plasma Thermal Oxide as Gate Insulator", *IEEE Electron Device Letters*, vol. 15, No. 8, Aug. 1994, pp. 301–303.

Mitra et al., "Low–Temperature Polysilicon TFT with Gate Oxide Grown by High–Pressure Oxidation", *IEEE Electron Device Letters*, vol. 12, No. 7, Jul. 1991, pp. 390–392.

Kato et al., "Damageless $H_2O/SiH_4$ Plasma–CVD for Gate $SiO_2$", *VLSI Technology Digest of Technical Papers*: 1993 *Symposium*, pp. 153–154.

Jelenkovic et al., "Thin Film Transistors Based on Sputtered Silicon and Gate Oxide Films", Electron Devices Meeting, 1996, IEEE Hong Kong, pp. 41–44.

* cited by examiner

Primary Examiner—Keith Christianson
Assistant Examiner—Stephen W. Smoot
(74) Attorney, Agent, or Firm—Oliff & Berridge PLC

(57) ABSTRACT

A fabrication process for a thin film transistor including, in the first process step, performing semiconductor layer formation processing, crystallization processing, and first gate insulator formation processing without exposing the substrate to atmosphere. In the second process step, performing rapid thermal processing of the first gate insulator layer and the semiconductor layer. In the third process step, performing patterning of the first gate insulator layer and the semiconductor layer. In the fourth process step, performing cleaning by etching the surface of the first gate insulator layer which has been contaminated by the resist mask. In the fifth process step, performing hydrogenation processing followed by formation of the second gate insulator layer on the surface of the first gate insulator layer.

12 Claims, 29 Drawing Sheets

(SOLID PHASE CRYSTALLIZATION BY RAPID THERMAL PROCESSING)
OR
(MELT CRYSTALLIZATION BY LASER IRRADIATION)

HYDROGEN  PLASMA        OXIDATION

RAPID THERMAL PROCESSING

REGION OF ENERGETIC
LIGHT IRRADIATION (SOLID PHASE CRYSTALLIZATION BY RAPID THERMAL PROCESSING)
OR
(MELT CRYSTALLIZATION BY LASER IRRADIATION)

HYDROGEN PLASMA    OXIDATION

FABRICATION PROCESS FOR THIN FILM TRANSISTORS IN A DISPLAY OR ELECTRONIC DEVICE

This is a Divisional of application Ser. No. 09/068,716 now U.S. Pat. No. 6,124,154, filed May 14, 1998, which is a national stage entry of PCT/JP96/03092 filed in Japan on Oct. 22, 1996. The entire disclosure of prior application Ser. No. 09/068,716 is hereby incorporated by reference in its entirety.

BACKGROUND OF THE INVENTION

1. Field of Invention

The present invention relates to the fabrication process of thin film transistors (abbreviated as TFT below). Further, in detail, the present invention relates to optimized technology for each thin film which comprises the thin film transistor.

2. Description of Related Art

In thin film transistors (TFT) that are used in applications such as active elements in liquid crystal displays, a top gate structure in which a gate insulator layer and gate electrode are formed on the top side of the channel region is often used. In the fabrication process for this type of TFT structure, after substrate 10A is prepared as shown in FIG. 25(A), underlevel protection layer 11A is formed on the surface of substrate 10A as shown in FIG. 25(B), after which semiconductor layer 12A consisting of an intrinsic amorphous silicon film is formed over the entire surface of substrate 10A. Next, semiconductor layer 12A is crystallized through laser annealing as shown in FIG. 25(C). Next, as shown in FIG. 26(A), resist mask 22A with a fixed mask pattern is formed; and semiconductor layer 12A is patterned using photolithography. Next, as shown in FIG. 26(B), gate insulator layer 13A consisting of a silicon oxide film is formed on the surface of semiconductor layer 12A by means of CVD. Next, as shown in FIG. 26(C), after conducting layer 21A consisting of a tantalum or other thin film is formed over the entire surface of substrate 10A by a means such as sputtering; gate electrode 15A is formed by patterning conducting layer 21A using photolithography as is shown in FIG. 26(D). Next, impurity ions are introduced into semiconductor layer 12A while using gate electrode 15A as a mask. As a result, source and drain regions 16A which are self-aligned with respect to gate electrode 15A are formed in semiconductor layer 12A; and the region of semiconductor layer 12A in which impurities ions were not introduced forms channel region 17A. Next, as shown in FIG. 26(E), after interlevel insulation film 18A consisting of a silicon oxide film is formed, source and drain electrodes 20A which form conducting junctions to source and drain regions 16A through contact holes 19A are formed. In this manner, TFT 30A is formed on the surface of substrate 10A. In this type of fabrication process, in the prior art, substrate 10A is exposed to atmosphere after a single process step is completed.

In the fabrication process of the prior art, however, when substrate 10A is exposed to atmosphere following completion of the annealing treatment of semiconductor layer 12A, the surface of crystallized semiconductor layer 12A can be oxidized through reactions to gaseous species, contaminated by hydrocarbons from the resist, for example, or contaminated by other impurities. In such a case, if gate insulator layer 13A is formed on the surface of semiconductor layer 12A that has been oxidized or contaminated, there will be a problem because the condition of the interface between channel region 17A and gate insulator layer 13A will deteriorate; and the electrical characteristics, such as the on current and the threshold voltage, of TFT 30A will worsen. Also, if, prior to crystallization by laser irradiation or other means, a natural oxide forms on semiconductor layer 12A as a result of the exposure of substrate 12A to atmosphere, there will be a problem because oxygen atoms will be incorporated into semiconductor layer 10A, the electrical conductivity of semiconductor layer 10A will vary widely, and the electrical characteristics of TFT 30A such as on current will worsen.

As a method to avoid such problems, a TFT fabrication process in which the semiconductor layer is not exposed to atmosphere is presented in Japanese Unexamined Patent Application Heisei 7-99321. In the process described as Example 2 in the aforementioned document, after substrate 10B is prepared as shown in FIG. 27(A), a phosphorous-doped semiconductor layer is formed on the surface. The semiconductor layer is patterned to form semiconductor layer islands 25B as shown in FIG. 27(B). Next, substrate 10B is inserted into a TFT fabrication unit and semiconductor layer 12B consisting of an amorphous silicon film is formed in vacuum using CVD as shown in FIG. 27(C). Next, as shown in FIG. 27(D), substrate 10B is laser annealed under vacuum. As a result, except for the region which becomes channel 17B, semiconductor layer 12B is phosphorous doped and source and drain regions 16B are formed. Next, as shown in FIG. 27(E), gate insulator layer 13B is formed on substrate 10B in vacuum using CVD; and substrate 10B is then removed from the TFT processing apparatus. At this point, the surface of semiconductor layer 12B is already covered by gate insulator layer 13B.

After this, as shown in FIG. 27(F), following photolithographic patterning of gate insulator layer 13B and semiconductor layer 12B, contact holes 19B are formed as shown in FIG. 28(A). After conducting layer 21B consisting of aluminum or other material is formed over the entire surface, gate electrode 15B is formed through further photolithography as shown in FIG. 28(B). Next, following formation of interlevel insulation film 18B as shown in FIG. 28(C), contact holes 26B are formed as shown in FIG. 28(D). Following formation of a conducting layer such as aluminum over the entire surface, the conducting layer is patterned by photolithography as shown in FIG. 28(E), and source and drain electrodes 20B are formed.

In this method, however, semiconductor layer 12B and gate insulator layer 13B are patterned simultaneously as shown in FIG. 27(F). As a result, as shown in FIGS. 28(A) and (B), when gate electrode 15B is formed during the next process steps through the patterning of conducting layer 21B which has been formed over the entire surface of substrate 10B, conducting layer 21B remains on the side walls of source and drain regions 16B. This leads to frequent occurrences of shorting between the source and drain regions, or between the source-gate and drain-gate regions. Further, there is also a problem with shorting to other TFTs on substrate 10B. In other words, in the fabrication process of the prior art, there is a problem with noticeably low yields of TFTs.

Moreover, in the prior art, in the process step shown in FIG. 27(D), silicon oxide species formed on top of semiconductor layer 25B or impurities from the resist or other sources may be incorporated into the semiconductor layer (mostly into source and drain regions) during laser melting. These impurities produce defects in the semiconductor layer and give rise to increases in off leakage current and threshold voltage shifts. Additionally, the surface of substrate 10B prior to the formation of semiconductor layer 12B is contaminated by the photolithography step to produce the source and drain. These impurities are intermixed in channel region 17B during crystallization causing a decrease in semiconductor layer film quality. Accordingly, in this prior art, since not only is the on current limited by impurities from the substrate surface, but the off current also increases as a result of oxygen (silicon oxide species) and contamination in the source and drain regions, it is not possible to produce high quality thin film semiconductor devices with large on-off current ratios.

Further, in this prior art, because gate insulator layer 13B formed by CVD is used in the as-deposited condition, the gate insulator layer film quality is not good and is known to lead to problems such as low gate-source breakdown voltages. As a result, there are problems both with the TFT electrical characteristics being poor as well as the yield and reliability being low. Additionally, a further problem exists since, as shown in FIG. 27(D), only laser annealing is done for semiconductor layer 12B which was formed by CVD. The result is retention of large stresses in the semiconductor layer which leads to a decrease in transistor characteristics.

SUMMARY OF THE INVENTION

Consequently, the present invention aims to solve the various problems mentioned above. The objective is to perform all process steps from the starting substrate to covering the surface of the semiconductor layer with the gate insulator layer without exposing the substrate to atmosphere, and, by producing a clean semiconductor layer/gate insulator layer interface by preventing contamination of the semiconductor layer surface from resist impurities, as well as by striving for high quality production of the semiconductor layer or of both the semiconductor layer and the gate insulator layer, to provide a fabrication process for high-yield, high-reliability TFTs.

TFT fabrication processes are mainly classified into two groups known as the low temperature process and the high temperature process. In the low temperature process, the maximum process temperature which is achieved by the entire substrate for a period of a few minutes or longer is not greater than approximately 600° C. whereas in the high temperature process, the maximum process temperature which is achieved by the entire substrate for a period of a few minutes or longer is not less than approximately 800° C. In contrast to the low temperature process in which the gate insulator layer is formed by a method such as CVD or PVD, the gate insulator layer is formed by a method such as thermal oxidation or high temperature oxidation (HTO) in the high temperature process. Additionally, in the high temperature process, thermal processing at a temperature between approximately 700 and 1200° C. for a period of a few minutes to a few hours may be performed as necessary. While Embodiments 1 through 4 as well as 7 and 8 of the present invention may be applicable for both the low and high temperature processes, the meaning of the formation of a clean semiconductor layer/gate insulator layer interface (MOS interface) at low temperature relates mainly to the low temperature process. Embodiments 5 and 6 of the present invention relate to the high temperature process.

[Embodiment 1]

The TFT fabrication process pertaining to Embodiment 1 is characterized by a fabrication process which includes at least a first process step which involves the formation of a semiconductor layer on a substrate which is isolated from atmosphere, followed by crystallization of said semiconductor layer in a non-oxidizing atmosphere without exposing said substrate to atmosphere, followed by formation of a first gate insulator layer on top of said semiconductor layer during which said substrate is not exposed to atmosphere; a second process step, following completion of the first process step, which involves thermal processing of said first gate insulator layer and said semiconductor layer; a third process step, following completion of the second process step, which involves patterning of said first gate insulator layer and said semiconductor layer; and a fourth process step, following completion of the third process step, which involves hydrogenation of said substrate followed by formation of a second gate insulator layer on the surface of said first gate insulator layer.

In the first process step of the present invention, because the substrate is not exposed to atmosphere from the formation of the semiconductor layer to the formation of the gate insulator layer, there is no formation of a dirty, natural oxide on the surface of the crystallized semiconductor layer as a result of reactions with the air or dust. At the same time, because the first gate insulator layer is formed prior to patterning of the semiconductor layer, the resist mask is formed on the surface of the first gate insulator layer but not on the surface of the semiconductor layer. Consequently, there is absolutely no contamination of the interface between the channel region and the gate insulator layer arising from hydrocarbons from the resist or other sources of impurities; and it is possible to obtain an extremely clean, good MOS interface. As a result, the electrical characteristics of the TFT such as on current and threshold voltage are improved.

In the second process step, the first gate insulator layer and the crystallized semiconductor layer are thermally processed. Prior to this thermal processing, the semiconductor atoms in the semiconductor layer are slightly displaced from their normal lattice positions and residual stresses caused by the crystallization are significantly present. Such minute lattice deviations and residual stresses are corrected by the thermal processing of the second process step. Accordingly, not only does the second process step relieve internal stresses in the semiconductor layer arising during the first process step from crystallization by either laser irradiation, melt crystallization, or rapid thermal annealing, but it also simultaneously further crystallizes the semiconductor layer to yield more nearly perfect crystals. Small amorphous regions existing between grains are crystallized, and irregular grain boundaries are converted to coincidence boundaries. Coincidence boundaries have two-dimensional periodicity and since dangling bonds are recombined, there are no deep-level states in the band gap. As a result, the probability of electron or hole scattering at the coincidence boundaries is greatly reduced and electrically superior interfaces are formed. Further, microcrystallites are recrystallized and grow into large grains; and the grain boundary area decreases significantly. The stress relief, crystallization, coincidence boundary formation, and further recrystallization afforded by the thermal processing of the second process step allows the attainment of extremely high quality semiconductor layers.

The thermal processing of the second process step additionally creates high quality first gate insulator layers. The low density, unstable first gate insulator layers formed by a method such as CVD are densified by the thermal processing of the second process step. Additionally, following thermal processing, the semiconductor atoms in the silicon or other semiconductor bond stably to the oxygen atoms to produce a stable material. As shown in FIG. 29, the weak, unstable chemical bonds between silicon atoms and oxygen atoms occurring in oxide layers formed at low temperature by methods such as CVD and PVD are converted into strong, stable bonds through the thermal processing of the second process step. Further, as shown in the flat band of the oxide layer before and after thermal processing in FIG. 30, the trap states for electrons and holes in the forbidden band (band gap) of the first gate insulator layer decrease after thermal processing. As a result of the improved quality of the first gate insulator layer, the injection of electrons and holes into the insulator layer is drastically reduced, the deterioration during TFT use decreases, and the reliability of the TFTs increases significantly. Also, because injection of electrons and holes from the semiconductor layer drain terminal into the insulator is difficult and there is no degradation of the TFTs, short channel TFTs are possible. Finally, the withstand voltage also increases, and the TFT stability improves dramatically.

Here, thermal processing inside a furnace is also acceptable for the thermal processing treatment, but rapid thermal annealing is even more desirable. In contrast to furnace thermal processing which occurs at temperatures between approximately 400 and 600° C. for times between approximately one and ten hours, temperatures of between approximately 700 and 1000° C. and times on the order of 0.1 second to less than about one minute are used in RTA. Because RTA uses a high temperature as compared to furnace processing, the effects of thermal processing described above are further enhanced. Throughput (processing time for a single substrate) also improves dramatically.

In RTA, optical energy is first absorbed in the semiconductor layer and the temperature of the semiconductor layer increases. Next, the first gate insulator layer is heated by the semiconductor layer which is underneath it, the temperature of the gate insulator layer rises, and thermal processing of the semiconductor layer and the first gate insulator layer is finished. Normally, because the temperature rise in transparent substrates is small, if a semiconductor layer is being processed, only regions in which the semiconductor layer remains significantly will be heated; and it is not possible to uniformly thermal process the entire substrate. In the present invention disclosure, however, because the thermal processing of the second process step occurs prior to the patterning of the semiconductor layer and the gate insulator layer, it is possible to thermally process both layers uniformly over the entire substrate.

In the fourth process step, the first gate insulator layer is hydrogenated after which the second gate insulator layer is formed. The semiconductor layer and first gate insulator layer are adversely affected by the release of hydrogen contained within the thin films and at the MOS interface during heating in the thermal processing of the second process step. The adverse effects are compensated, however, by hydrogenation during the fourth process step. Additionally, because the second gate insulator layer is formed after the patterning of the first gate insulator layer and the semiconductor layer and covers the side walls of the semiconductor layer, shorts between the gate electrode and semiconductor layer, or between the source region and the drain region, or between elements do not occur. Therefore, by means of the present invention, the yield and reliability are high.

In the present invention, the crystallization in the first process step is carried out by melt crystallization, by means such as laser irradiation for example, or rapid thermal annealing. It is desirable to perform such crystallization either in a hydrogen-containing atmosphere or a reducing, argon-containing atmosphere. It goes without saying that during crystallization of the semiconductor layer, the bonds between semiconductor atoms are broken and reformed. There are inevitably unpaired electrons (dangling bonds) following bond reformation. Broken bonds between semiconductor atoms and unpaired electrons are extremely active. Consequently, if oxygen or water, carbon monoxide or carbon dioxide, or dust come in contact with the semiconductor layer during this period, these species become incorporated into the semiconductor layer as impurities. When crystallization is performed in pure hydrogen or under a hydrogen-containing atmosphere of an inert gas such as helium, nitrogen, or argon, the chemically active electron pairs are terminated by hydrogen thereby avoiding the incorporation of impurities into the semiconductor layer as mentioned above. It is thus possible to obtain high purity, high quality crystalline semiconductor layers.

It is desirable to have an atmosphere composed of a reducing gas such as hydrogen or monosilane ($SiH_4$) in argon as the atmosphere in which melt crystallization, such as that performed by laser irradiation, occurs. In melt crystallization, the semiconductor atoms are easily scattered or the semiconductor layer surface can roughen. Such phenomena are minimized by performing melt crystallization under an atmosphere containing relatively high atomic weight species such as argon. This is because the high atomic weight species carry out the role of forcing down the molten semiconductor layer surface. Additionally, the reducing gas such as hydrogen or silane diluted in argon terminates the chemically active species in the crystallization process to produce a high purity crystalline layer.

In the present invention, it is desirable to perform the aforementioned second process step in a hydrogen-containing atmosphere, an oxygen-containing atmosphere, or a water vapor-containing oxidizing atmosphere. If the heating is carried out in a hydrogen gas atmosphere, the dangling bonds in the semiconductor layer, the first gate insulator layer, or the MOS interface can be terminated. If thermal processing is carried out in an oxygen gas atmosphere, the unbonded silicon atoms in the first gate insulator layer are forced to bond to oxygen, and it is possible to improve the insulator layer. Performing the thermal processing in a water vapor-containing oxidizing atmosphere simultaneously increases the degree of oxidation of the oxide layer (the value of x in $SiO_x$ approaches 2) as is found in thermal processing under an oxygen atmosphere and also more effectively improves the Si—O—Si chemical bonds as well as more effectively reduces the trap states in the insulator layer to again produce a quality first gate insulator layer.

[Embodiment 2]

The TFT fabrication process pertaining to Embodiment 2 of the present invention is characterized by a fabrication process which includes the crystallization of the semiconductor layer in the TFT fabrication process pertaining to Embodiment 1 of the present invention as described above, followed by hydrogenation of the semiconductor layer prior to formation of the first gate insulator layer. Accordingly, the TFT fabrication process pertaining to Embodiment 2 is characterized by a fabrication process which includes at least a first process step which involves the formation of a semiconductor layer on a substrate which is isolated from atmosphere, followed by crystallization of said semiconductor layer in a non-oxidizing atmosphere without exposing said substrate to atmosphere, followed by hydrogenation of said substrate during which said substrate is not exposed to atmosphere, followed by formation of a first gate insulator layer on top of said semiconductor layer during which said substrate is not exposed to atmosphere; a second process step, following completion of the first process step, which involves thermal processing of said first gate insulator layer and said semiconductor layer; a third process step, following completion of the second process step, which involves patterning of said first gate insulator layer and said semiconductor layer; and a fourth process step, following completion of the third process step, which involves hydrogenation of said substrate followed by formation of a second gate insulator layer on the surface of said first gate insulator layer.

With such a process in which hydrogenation is performed immediately following crystallization, it is possible to terminate and stabilize the chemically active surface and grain boundaries of the semiconductor layer. In the present invention, a natural oxide does not form on the semiconductor layer surface because the substrate is not exposed to atmosphere following crystallization. Consequently, uniform hydrogenation may be carried out without the effects of a natural oxide layer. Hydrogenation of semiconductor layers in the prior art has required long time periods of up to several hours because the diffusion of hydrogen in insulator layers is slow. In the present invention, however, direct hydrogenation of the semiconductor layer is possible so that the processing time can be reduced to somewhere between approximately 10 seconds and 5 minutes depending on the thickness and degree of crystallinity of the semiconductor layer. Despite the short hydrogenation times, the electrical conductivity of the semiconductor layer is remarkably stable with the result being an improvement in the electrical characteristics of the TFT as given by the on and off currents.

In this invention as well, the crystallization in the first process step is carried out by melt crystallization, by means such as laser irradiation for example, or solid phase crystallization such as rapid thermal annealing. For the reasons explained previously, it is desirable to perform such crystallization either in a hydrogen-containing atmosphere or a reducing, argon-containing atmosphere.

In this invention as well, it is desirable to perform the aforementioned second process step in a hydrogen-containing atmosphere, an oxygen-containing atmosphere, or a water vapor-containing oxidizing atmosphere. The reasons are again as explained previously.

[Embodiment 3]

The TFT fabrication process pertaining to Embodiment 3 of the present invention is characterized by a fabrication process in which an oxygenation treatment is performed in addition to the hydrogenation treatment during the first process step of the TFT fabrication process pertaining to Embodiment 2 of the present invention as described above. Accordingly, the TFT fabrication process pertaining to Embodiment 3 of the present invention is characterized by a fabrication process which includes at least a first process step which involves the formation of a semiconductor layer on a substrate which is isolated from atmosphere, followed by crystallization of said semiconductor layer in a non-oxidizing atmosphere without exposing said substrate to atmosphere, followed by hydrogenation and oxidation, performed consecutively in the sequence listed, of said substrate during which said substrate is not exposed to atmosphere, followed by formation of a first gate insulator layer on top of said semiconductor layer during which said substrate is not exposed to atmosphere; a second process step, following completion of the first process step, which involves thermal processing of said first gate insulator layer and said semiconductor layer; a third process step, following completion of the second process step, which involves patterning of said first gate insulator layer and said semiconductor layer; and a fourth process step, following completion of the third process step, which involves hydrogenation of said substrate followed by formation of a second gate insulator layer on the surface of said first gate insulator layer.

The crystalline semiconductor layer contains both unsatisfied bonds which can be terminated by hydrogen and unsatisfied bonds which cannot be terminated by hydrogen. Those unsatisfied bonds which cannot be terminated by hydrogen are terminated by oxygen in this invention, and it is possible to obtain good semiconductor devices with steep subthreshold (transistor on/off properties) characteristics. This phenomenon is particularly effective for the MOS interface. If the effective oxidation is carried out, a thin, high quality oxide film of about 20 angstroms to 300 angstroms is easily formed on the semiconductor surface; and a clean MOS interface is obtained. The semiconductor layer with a chemically active surface also reacts quickly with oxygen, and the oxidation can be performed in a short time which ranges from approximately 10 seconds to approximately 5 minutes. The oxidation can be performed by methods such as oxygen plasma irradiation, water plasma irradiation, water-containing oxygen plasma irradiation, hydrogen peroxide ($H_2O_2$) plasma irradiation, hydrogen peroxide-containing oxygen plasma irradiation, and ozone ($O_3$) irradiation.

In this invention as well, the crystallization in the first process step is carried out by melt crystallization, by means such as laser irradiation for example, or solid phase crystallization such as rapid thermal annealing. For the reasons explained previously, it is desirable to perform such crystallization either in a hydrogen-containing atmosphere or a reducing, argon-containing atmosphere.

In this invention as well, it is desirable to perform the aforementioned second process step in a hydrogen-containing atmosphere, an oxygen-containing atmosphere, or a water vapor-containing oxidizing atmosphere. The reasons are again as explained previously.

[Embodiment 4]

The TFT fabrication process pertaining to Embodiment 4 of the present invention is characterized by a fabrication process in which the surface of the first gate insulator layer, which has been contaminated by the resist mask used during the patterning of the semiconductor layer, is cleaned. Accordingly, the TFT fabrication process pertaining to Embodiment 4 of the present invention is characterized by a fabrication process which includes at least a first process step which involves the formation of a semiconductor layer on a substrate which is isolated from atmosphere, followed by crystallization of said semiconductor layer in a non-oxidizing atmosphere without exposing said substrate to atmosphere, followed by formation of a first gate insulator layer on top of said semiconductor layer during which said substrate is not exposed to atmosphere; a second process step, following completion of the first process step, which involves thermal processing of said first gate insulator layer and said semiconductor layer; a third process step, following completion of the second process step, which involves patterning of said first gate insulator layer and said semiconductor layer; a fourth process step, following completion of the third process step, which involves cleaning of the surface of said first gate insulator layer; and a fifth process step, immediately following completion of the fourth process step, which involves hydrogenation of said substrate followed by formation of a second gate insulator layer on the surface of said first gate insulator layer.

With such a process, although the surface of the first gate insulator layer is contaminated by the resist mask used during the patterning of the semiconductor layer and the first gate insulator layer, the contamination of the gate insulator layers is kept to a minimum because the contaminated portion is cleaned prior to formation of the second gate insulator layer. Consequently, the fixed charges in the gate insulator layer are reduced and the threshold voltages of the transistors are stabilized throughout the lots. Additionally, the variations in transistor properties are reduced even with respect to long term continuous use, and the transistor reliability is remarkably improved. Also, because the withstand voltage of the gate insulator layer increases, along with an improvement in reliability comes the possibility of reducing the thickness of the gate insulator layer. In the description of the second process step in the first embodiment of the present invention, it was explained that short channel TFTs are possible by means of the present invention. Combining this and the reduction in thickness of the gate insulator layer, it becomes possible to apply the scaling principle to TFT elements just as is done in LSI technology. By applying an LDD structure to the present invention, a submicron TFT with a channel length of approximately 0.5 to 1 $\mu$m, and a gate insulator layer thickness of from approximately 100 angstroms to 300 angstroms can be realized.

The cleaning of the surface of the first gate insulator layer in the aforementioned fourth process step of the present invention includes etching of the first gate insulator layer by such techniques as wet etching by an aqueous solution containing hydrofluoric acid (HF) or dry etching by a hydrogen, $CHF_3$, $NF_3$, or $SF_6$ plasma.

As a result, only the surface layer of the first gate insulator layer contaminated by the resist mask is removed and the semiconductor layer is also not exposed to atmosphere during this period since the clean, remaining first gate insulator layer protects the semiconductor layer. In such a fashion, because a clean MOS interface is preserved and it is possible to form the second gate insulator layer on top of a high quality first gate insulator layer, the electrical characteristics of the TFT are stabilized.

In this invention as well, the crystallization in the first process step is carried out by melt crystallization, by means such as laser irradiation for example, or rapid thermal annealing. For the reasons explained previously, it is desirable to perform such crystallization either in a hydrogen-containing atmosphere or a reducing, argon-containing atmosphere.

In this invention as well, it is desirable to perform the aforementioned second process step in a hydrogen-containing atmosphere, an oxygen-containing atmosphere, or a water vapor-containing oxidizing atmosphere. The reasons are again as explained previously.

In the fabrication process of Embodiments 1 through 4 of the present invention, it is desirable to carry out all process steps including and after the formation of the second gate insulator layer at temperatures of no more than approximately 350° C. By so doing, because the semiconductor layer and first gate insulator, which are hydrogenated just prior to formation of the second gate insulator layer, as well as the second gate insulator layer are not exposed to high temperatures, the hydrogen within these layers and at the interface is not expelled; and it is possible to avoid the degradation in TFT elements which accompanies such loss of hydrogen.

[Embodiment 5]

The TFT fabrication process pertaining to Embodiment 5 of the present invention is characterized by the use of a high temperature process. Accordingly, the TFT fabrication process pertaining to Embodiment 5 of the present invention is characterized by a fabrication process which includes at least a first process step which involves the formation of a semiconductor layer on a substrate which is isolated from atmosphere, followed by crystallization of said semiconductor layer in a non-oxidizing atmosphere without exposing said substrate to atmosphere, followed by formation of a first gate insulator layer on top of said semiconductor layer during which said substrate is not exposed to atmosphere; a second process step, following completion of the first process step, which involves patterning of said first gate insulator layer and said semiconductor layer; and a third process step, following completion of the second process step, which involves thermal treatment of said substrate in an oxidizing environment and the formation on the surface of said semiconductor layer of an oxide layer as a second gate insulator layer.

In the first process step of the present invention as well, because the substrate is not exposed to atmosphere from the formation of the semiconductor layer to the formation of the gate insulator layer, there is no formation of a dirty, natural oxide on the surface of the crystallized semiconductor layer as a result of reactions with the air or dust. At the same time, because the first gate insulator layer is formed prior to patterning of the semiconductor layer, the resist mask is formed on the surface of the first gate insulator layer but not on the surface of the semiconductor layer. Consequently, following formation of the oxide layer on the surface of the semiconductor layer in the third process step there are absolutely no impurities such as carbon compounds in the gate insulator layer, and a high purity gate insulator layer is formed. As a result, the electrical characteristics of the TFT such as on current and threshold voltage are improved.

In the third process step of the present invention, because the formation of the oxide layer which acts as the second gate insulator layer on the semiconductor layer surface is carried out by thermal processing between approximately 900° C. and 1200° C., the semiconductor layer crystallized in the first process step is improved by means such as the release of stress. This means the progression of stress release, crystallization of grain boundaries, formation of coincidence boundaries, and recrystallization as explained with reference to the second process step in Embodiment 1 of the present invention. In Embodiment 5, the thermal processing occurs at higher temperatures and over a long time period such that the effects are increased dramatically. In Embodiment 5 of the present invention, it is possible to obtain an extremely good semiconductor layer since the film quality of the high quality semiconductor layer obtained in the first process step is further remarkably improved in the third process step. Further, because the film quality of the first gate insulator layer is improved through densification of the first gate insulator layer, for example, the reliability of TFTs so fabricated is high. The circumstances concerning these parts are the same as explained previously with respect to the second process step in Embodiment 1 of the present invention. Also, because the second gate insulator layer is formed through thermal oxidation following patterning of the first gate insulator layer and the semiconductor layer and completely covers the side walls of the semiconductor layer, the various types of shorts described previously do not occur in the present invention. As a result, the yield and reliability from this invention are high.

In this invention as well, the crystallization in the first process step is carried out by melt crystallization, by means such as laser irradiation for example, or rapid thermal annealing. For the reasons explained previously, it is desirable to perform such crystallization either in a hydrogen-containing atmosphere or a reducing, argon-containing atmosphere.

[Embodiment 6]

The TFT fabrication process pertaining to Embodiment 6 of the present invention is characterized by a fabrication process which includes the first process step in the TFT fabrication process pertaining to Embodiment 5 of the present invention as described above, followed by thermal processing of the semiconductor layer and first gate insulator layer in the second process step. Accordingly, the TFT fabrication process pertaining to Embodiment 6 is characterized by a fabrication process which includes at least a first process step which involves the formation of a semiconductor layer on a substrate which is isolated from atmosphere, followed by crystallization of said semiconductor layer in a non-oxidizing atmosphere without exposing said substrate to atmosphere, followed by formation of a first gate insulator layer on top of said semiconductor layer during which said substrate is not exposed to atmosphere; a second process step, following completion of the first process step, which involves thermal process of said first gate insulator layer and said semiconductor layer; a third process step, following completion of the second process step, which involves patterning of said first gate insulator layer and said semiconductor layer; and a fourth process step, following completion of the third process step, which involves thermal treatment of said semiconductor layer of an oxide layer as a second gate insulator layer.

In the present invention, the semiconductor layer improves in the same fashion as in the second process step of Embodiment 1 of the present invention since the first gate insulator and the semiconductor layer are thermally processed in the second process step here as well. Additionally, the reliability of TFTs fabricated using this procedure is high because the first gate insulator layer densifies during heating. The semiconductor and first gate insulator layers which have been improved in this fashion are further improved to produce higher quality films as a result of the thermal oxidation which occurs in the fourth process step. For the thermal processing in the second process step, thermal processing in a furnace is also acceptable, but rapid thermal processing allows higher temperatures such that the effects of thermal processing described previously can be increased further and it becomes possible to obtain other effects such as high throughput. In this case as well, because the rapid thermal processing is performed prior to patterning, the degree of thermal absorption is uniform across the entire substrate.

In this invention as well, the crystallization in the first process step is carried out by melt crystallization, by means such as laser irradiation for example, or rapid thermal annealing. For the reasons explained previously, it is desirable to perform such crystallization either in a hydrogen-containing atmosphere or a reducing, argon-containing atmosphere.

In this invention as well, it is desirable to perform the aforementioned second process step in a hydrogen-containing atmosphere, an oxygen-containing atmosphere, or a water vapor-containing oxidizing atmosphere. The reasons are again as explained previously.

[Embodiment 7]

In each of the inventions described above, the gate insulator layer and the semiconductor layer are thermally processed following formation of the first gate insulator layer. In contrast, as in Embodiment 7 and 8 of the present invention, it is also possible to fabricate high quality semiconductor devices in a process in which the substrate is not exposed to atmosphere following formation of the semiconductor layer up to the formation of the first gate insulator layer, and, further, in which the semiconductor layer is hydrogenated or oxidized. As a result, TFTs with high yield and high reliability can be produced.

The TFT fabrication process pertaining to Embodiment 7 of the present invention is characterized by a fabrication process which includes at least a first process step which involves the formation of a semiconductor layer on a substrate which is isolated from atmosphere, followed by crystallization of said semiconductor layer in a non-oxidizing atmosphere without exposing said substrate to atmosphere, followed by at least either hydrogenation or oxidation treatment of said substrate without exposing said substrate to atmosphere, followed by formation of a first gate insulator layer on top of said semiconductor layer during which said substrate is not exposed to atmosphere; a second process step, following completion of the first process step, which involves patterning of said first gate insulator layer and said semiconductor layer; and a third process step, following completion of the second process step, which involves the formation of a second gate insulator layer on the surface of said first gate insulator layer.

In the present invention, a natural oxide does not form because the surface of the semiconductor layer is not exposed to atmosphere following crystallization. Consequently, during subsequent hydrogenation or oxidation, there are no effects from a natural oxide layer; and it is possible to uniformly and effectively effect hydrogenation or oxidation in a short time. The electrical conductivity of the semiconductor layer is stable and there is an improvement in the electrical characteristics of the TFT such as the on current. Also, because the first gate insulator layer is formed prior to patterning of the semiconductor layer, the resist mask is formed on the surface of the first gate insulator layer but not on the surface of the semiconductor layer. Consequently, there is no contamination of the semiconductor layer surface from the resist, and the interface condition between the channel region and the gate insulator layer is good. Additionally, because the formation of the second gate insulator layer follows the patterning of the first gate insulator layer and the semiconductor layer and covers the semiconductor side walls, there is also the advantage of none of the previously described shorts occurring.

In this invention as well, the crystallization in the first process step is carried out by melt crystallization, by means such as laser irradiation for example, or solid phase crystallization such as rapid thermal annealing. For the reasons explained previously, it is desirable to perform such crystallization either in a hydrogen-containing atmosphere or a reducing, argon-containing atmosphere.

[Embodiment 8]

The TFT fabrication process pertaining to Embodiment 8 of the present invention is characterized by a fabrication process which includes at least a first process step which involves the formation of a semiconductor layer on a substrate which is isolated from atmosphere, followed by crystallization of said semiconductor layer in a non-oxidizing atmosphere without exposing said substrate to atmosphere, followed by at least either hydrogenation or oxidation treatment of said substrate without exposing said substrate to atmosphere, followed by formation of a first gate insulator layer on top of said semiconductor layer during which said substrate is not exposed to atmosphere; a second process step, following completion of the first process step, which involves patterning of said first gate insulator layer and said semiconductor layer; a third process step, following completion of the second process step, which involves cleaning the surface of the first gate insulator layer; and a fourth process step, following completion of the third process step, which involves the formation of a second gate insulator layer on the surface of said first gate insulator layer.

In Embodiment 8, the TFT electrical characteristics are stable because of the cleaning of the first gate insulator layer which is contaminated by the resist mask during patterning of the semiconductor layer. Here, only the surface layer of the first gate insulator layer is removed and striving for cleanliness, the semiconductor layer is not exposed to atmosphere. Consequently, because it is possible to absolutely prevent dirty oxides on the semiconductor surface, the TFT electrical characteristics are further stabilized.

The cleaning of the surface of the first gate insulator layer in the aforementioned third process step of the present invention includes etching of the first gate insulator layer by such techniques as wet etching by an aqueous solution containing hydrofluoric acid (HF) or dry etching by a hydrogen, CHF3, NF3, or SF6 plasma.

In this invention as well, the crystallization in the first process step is carried out by melt crystallization, by means such as laser irradiation for example, or solid phase crystallization such as rapid thermal annealing. For the reasons explained previously, it is desirable to perform such crystallization either in a hydrogen-containing atmosphere or a reducing, argon-containing atmosphere.

BRIEF DESCRIPTION OF THE DRAWINGS

FIGS. 18(A)–8(G) are a cross-section process diagram showing process steps following the steps shown in FIGS. 17(A)–17(E) for the TFT fabrication process of Example 2 of the present invention.

DETAILED DESCRIPTION OF THE PREFERRED EMBODIMENTS

The fundamental principles and configurations of the present invention will be explained below with reference to the accompanying figures.

Among the examples of the embodiments of the present invention which are to be explained from this point, Embodiment 1 through 4 as well as 6 through 8 are TFT fabrication procedures which principally follow the low temperature process whereas a portion of the process in Embodiments 5 and 6 follows the high temperature process. As used here, the low temperature process means a process in which the maximum temperature (reached by the entire substrate simultaneously) is less than about 600° C. In contrast, the high temperature means a process in which the maximum temperature (reached by the entire substrate simultaneously) is approximately 800° C. or higher, and in which a high temperature process such as thermal oxidation of silicon at a temperature between 700° C. and 1200° C. is employed.

[Outline of Embodiment 1]

Figure 1:
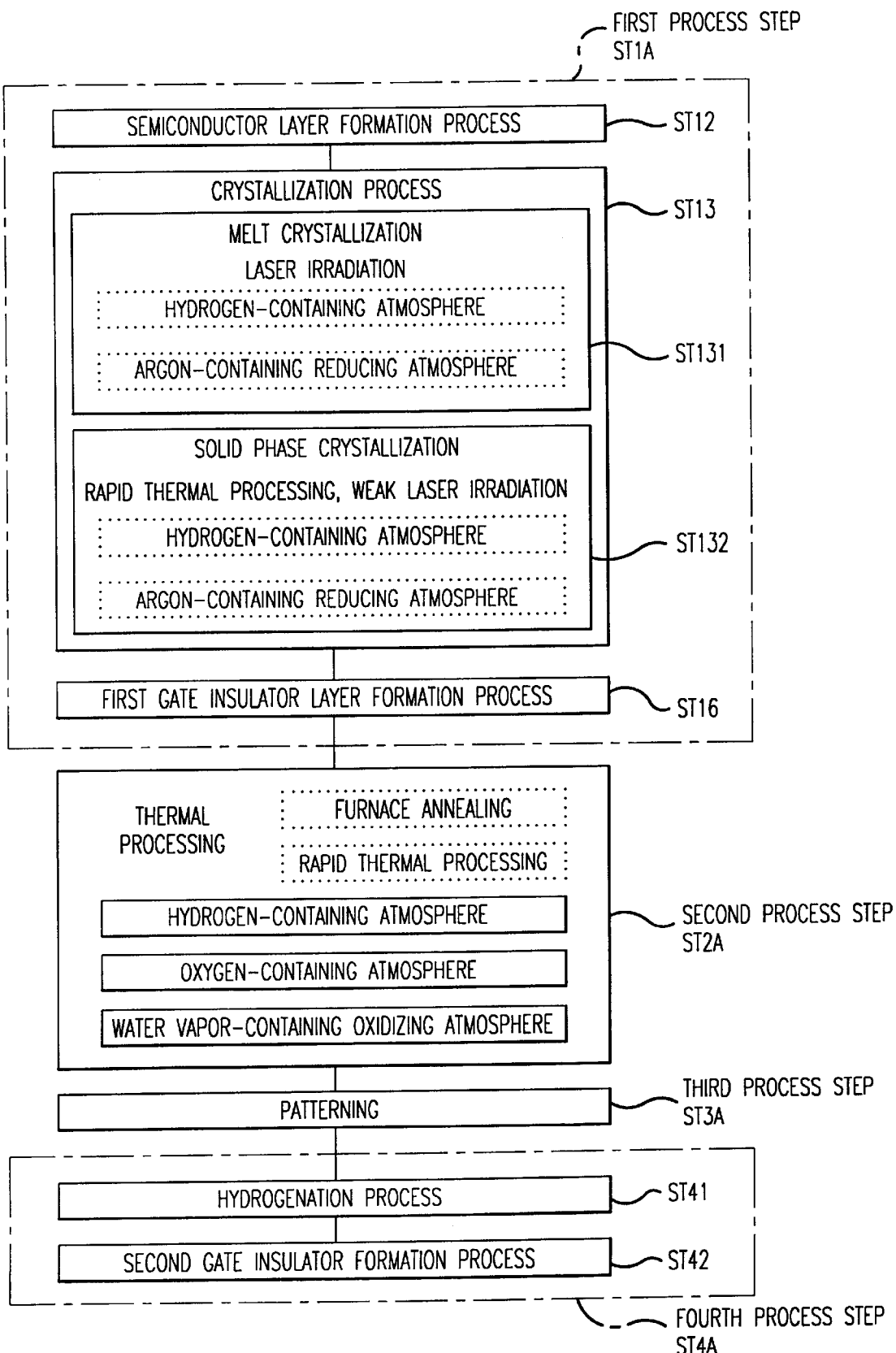
FIG. 1 shows a processing chart for the TFT fabrication process related to Embodiment 1 of the present invention.

The fabrication process to which Embodiment 1 of the present invention applies is mainly applicable to TFTs fabricated by the low temperature process. This will be explained with reference to FIG. 1. As can be seen from FIG. 1, in the first process step ST1A, a semiconductor layer which may be amorphous, polycrystalline, or a mixture of amorphous and polycrystalline states is formed on a substrate which is isolated from atmosphere (semiconductor layer formation process ST12). In all the configurations of the present invention, in addition to being applicable to single element films such as silicon (Si) and germanium (Ge), the following types of semiconductor films are also possible: group IV compound semiconductor films such as silicon germanium ($Si_xGe_{1-x}$: 0<x<1), silicon carbide ($Si_xC_{1-x}$: 0<x<1), and germanium carbide ($Ge_xC_{1-x}$: 0<x<1); II–IV compound semiconductor films such as gallium arsenide (GaAs), and indium antimonide (InSb); II–VI compound semiconductor films such as cadmium selenide (CdSe). The present invention is also applicable to higher compound semiconductor films such as silicon germanium gallium arsenide ($Si_xGe_yGa_zAs_z$: x+y+z=1) as well as N-type semiconductor films in which donor elements such as phosphorous (P), arsenic (As), or antimony (Sb) have been added and P-type semiconductors in which acceptor elements such as boron(B), aluminum (Al), gallium (Ga), and indium (In) have been added.

In forming such semiconductor layers, CVD methods such as APCVD, LPCVD, and PECVD as well as PVD methods such as sputtering or evaporation may be used. In all film formation methods, however, film formation is done without exposing the substrate to atmosphere and is done in a non-oxidizing environment. LPCVD, PECVD, sputtering, and evaporation are done at reduced pressure (a vacuum environment) while APCVD is done at atmospheric pressure or at increased pressure. When semiconductor films are deposited by CVD in the present invention, the films are deposited using as source gases chemical species containing the constitutive elements of the films. For example, when the semiconductor film is silicon (Si), a silane such as monosilane ($SiH_4$), disilane ($Si_2H_6$), trisilane ($Si_3H_8$), or dichlorosilane ($SiH_2Cl_2$) is used as a source gas. In the present patent specification, disilane and trisilane are called higher silanes ($Si_nH_{2n+2}$: n is an integer greater than or equal to 2). If germanium is the semiconductor film, germane ($GeH_4$) is used, and phosphine ($PH_3$) and diborane ($B_2H_6$) can be used in addition if phosphorous (P) or boron (B) are to be added to the semiconductor film. Although chemical species containing the constitutive elements of the various types of semiconductor films mentioned above can be used as source gases, it is preferable to use hydrogenated species of the constitutive elements since some of the source gases will always be incorporated into the semiconductor film. For example, silicon films grown from dichlorosilane ($SiH_2Cl_2$) will always contain chlorine (Cl) to some extent. This incorporated Cl can be a factor in the degradation of transistor properties when the silicon film is used as the active layer in a thin film semiconductor device. Therefore, monosilane ($SiH_4$), a hydrogenated form of the constituent element, is preferable over dichlorosilane. As high a purity as possible for the source gases, and dilution gases if need be, is desirable. Considering that costs increase as the technological difficulties in producing high purity gases grow, a purity of 99.9999% or higher is desirable. The background pressure of semiconductor film deposition equipment is normally on the order of $10^{-6}$ Torr, and the process pressure is from 0.1 Torr to a few Torr. Therefore, the ratio of the incorporation of impurities from the background pressure in the film growth step is on the order of $10^{-5}$ to $10^{-6}$. The purity of the source or dilution gases is sufficient if it is equivalent to the ratio of the process pressure to the background pressure of the equipment using the gases. As a result, a purity of 99.999% or more (impurity ratio of $1\times10^{-5}$ or less) for gases flowing in the deposition equipment is desirable in the present invention. If the purity is 99.9999% (impurity ratio of $1\times10^{-6}$ or less), there is absolutely no problem in use as a source gas; and, in the ideal case in which the purity is ten times that of the ratio of the background pressure to the process pressure (99.99999% in the present example; impurity ratio of $1\times10^{-7}$ or less), the incorporation of impurities from the gases need not even be considered.

Next, without exposing the substrate to atmosphere, the semiconductor film is sequentially crystallized (crystallization ST13) in a non-oxidizing atmosphere following formation of the semiconductor layer. In all the configurations of the present invention, crystallization can be carried out by short-time energy supply using optical energy such as from laser light, electromagnetic energy, or the acceleration of particles. When the originally deposited semiconductor layer is amorphous or a mixture of amorphous and microcrystalline material, this process is known as crystallization. On the other hand, if the originally deposited semiconductor layer is polycrystalline, the process is known as recrystallization. In this specification of the present invention, both are simply referred to as "crystallization" unless it is necessary to make a distinction. If the energy from laser light or other source is high, the semiconductor layer will crystallize by initially melting and then solidifying upon cooling. This is known as melt crystallization in the present invention. Conversely, crystallization in which the semiconductor layer does not melt but proceeds in the solid state is known as solid phase crystallization (SPC). Solid phase crystallization can be divided mainly into three types: furnace-SPC in which crystallization occurs at temperatures from 550° C. to 650° C. in a furnace for times ranging from a few hours to several tens of hours, rapid thermal annealing (RTA) in which crystallization occurs in a very short time frame ranging from less than one second up to about one minute at temperatures of approximately 700° C. to 1000° C., and very short time-SPC (VST-SPC) using low energy such as from a laser. Although all three types are suitable for use in the present invention, melt crystallization, RTA and VST-SPC are particularly appropriate when considered from the viewpoint of processing which allows high productivity for large substrates. The reason for this is that in these crystallization methods, the irradiation time is extremely short and the whole substrate is not heated simultaneously to a high temperature during crystallization of the semiconductor layer since the irradiated area is localized with respect to the entire substrate area; and, therefore, no heat-induced deformation or cracking of the substrate occurs. For embodiments in which optical energy is supplied to the semiconductor layer, there are laser annealing in which the semiconductor layer is irradiated by laser light and lamp annealing in which the semiconductor layer is irradiated by lamp light. For an embodiment in which accelerated particles are supplied to the semiconductor layer, there is ion bombardment. In this method, $SiH_4^+$ accelerated to between approximately 10 keV and 100 keV or GeH$_4^+$ accelerated to between approximately 20 keV and 200 keV is implanted into the semiconductor layer with the substrate temperature between approximately 300° C. and 600° C. The ion acceleration energy is supplied to the semiconductor atoms and effects crystallization.

Following any of these crystallization treatments, the first gate insulator layer is sequentially formed on top of the crystalline semiconductor without exposing the substrate to atmosphere (first gate insulator layer formation ST16). In the formation of the first gate insulator layer as well, CVD methods such as APCVD, LPCVD, and PECVD as well as PVD methods such as sputtering or evaporation may be used. In all film formation methods, however, film formation is done without exposing the substrate to atmosphere. When silicon oxide is used as the first gate insulator layer, monosilane or disilane diluted in argon or nitrogen, and oxygen or nitrous oxide are used for the case of APCVD. With LPCVD, gases such as monosilane or disilane, and nitrous oxide are used. With PECVD, gases such as monosilane, disilane, or TEOS, and oxygen or nitrous oxide are used. With sputtering, sputtering is carried out in an argon atmosphere containing hydrogen, for example.

Next, in the second process step ST2A, the first gate insulator layer and the semiconductor layer are thermally processed by a process such as rapid thermal annealing or furnace annealing.

Next, as the third process step ST3A, the desired resist pattern is formed on top of the first gate insulator layer, and the first gate insulator layer and the semiconductor layer are patterned.

Next, in the fourth process step ST4A, the substrate on which the polycrystalline semiconductor layer and the first gate insulator layer have been formed is hydrogenated (ST41). This hydrogenation is performed by annealing in a hydrogen-containing atmosphere at atmospheric pressure in an APCVD reactor, by hydrogen annealing or hydrogen plasma using LPCVD in a hydrogen-containing atmosphere at a reduced pressure of between approximately 1 Torr and 100 Torr, by hydrogen plasma in a PECVD reactor, or by argon-hydrogen plasma in an argon-hydrogen gas atmosphere in a sputtering unit. Following this, the second gate insulator layer is formed sequentially on the surface of the first gate insulator layer without exposing the substrate to atmosphere (second gate insulator layer formation ST42). Consequently, this film formation is formation of a silicon oxide film in the APCVD, LPCVD, PECVD reactors or sputtering reactor used for hydrogenation in ST41.

In the present invention, the crystallization in the first process step ST1A is performed by melt crystallization ST131 using, for example, laser irradiation; or solid phase crystallization ST132 using rapid thermal annealing or weak laser irradiation. It is desirable to perform this crystallization ST13 in a hydrogen-containing or argon-containing reducing atmosphere.

In the present invention, it is desirable to perform the second process step ST2A in a hydrogen-containing or oxygen-containing atmosphere, or in a water vapor-containing oxidizing atmosphere.

[Outline of Embodiment 2]

The fabrication process to which Embodiment 2 of the present invention applies is mainly applicable to TFTs fabricated by the low temperature process. This will be explained with reference to FIG. 2.

Figure 2:
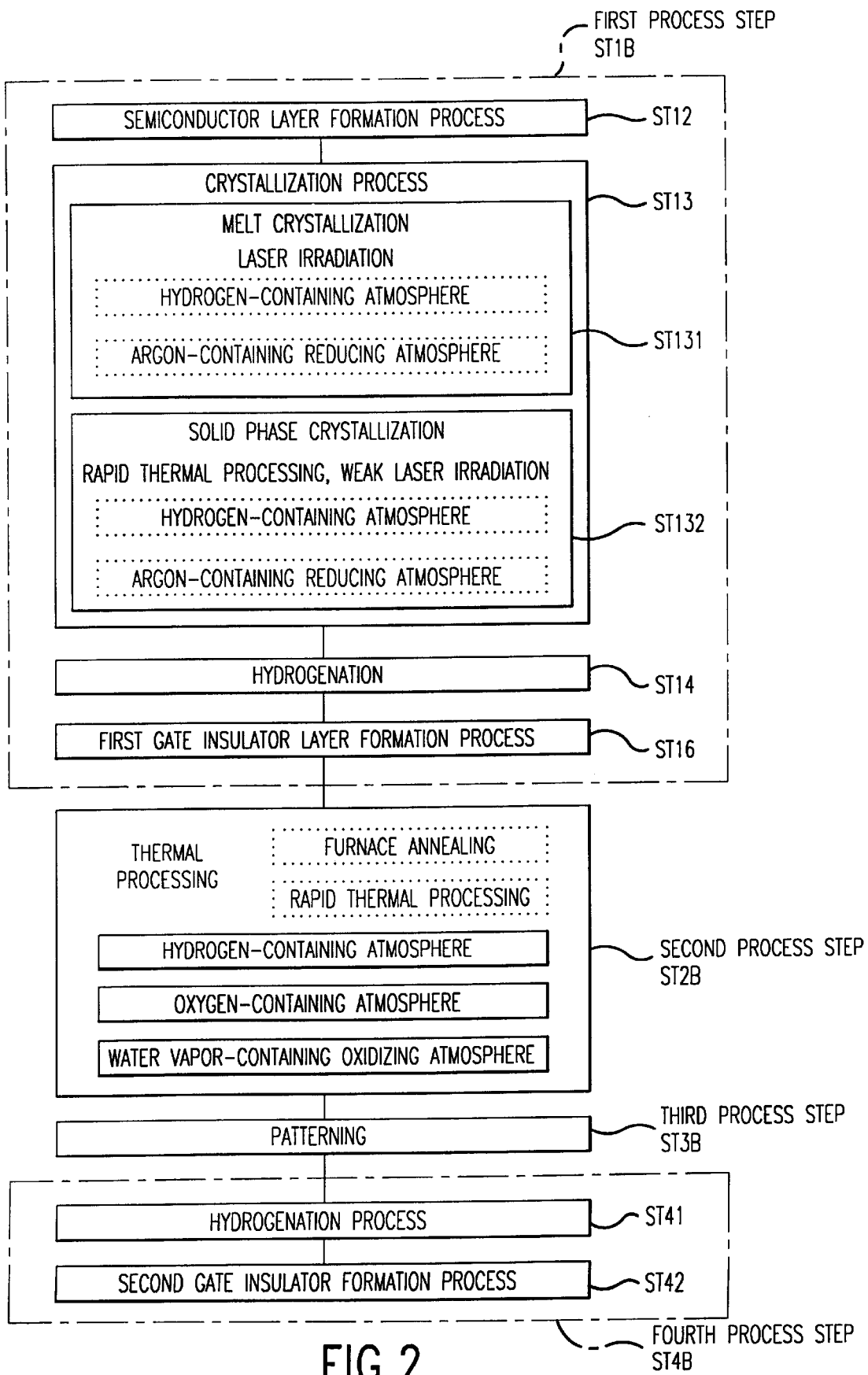
FIG. 2 shows a processing chart for the TFT fabrication process related to Embodiment 2 of the present invention.

As can be seen from FIG. 2, the fabrication process of the present invention is similar to that of the fabrication process of Embodiment 1 in that in the first process step ST1B, semiconductor layer formation ST12, crystallization ST13, and first gate insulator layer formation ST16 are performed consecutively without exposing the substrate to atmosphere. The present invention is characterized by the hydrogenation of the semiconductor layer in step ST14 which is performed following semiconductor layer crystallization ST13 and before first gate insulator layer formation ST16 during the first process step ST1B. Hydrogenation step ST14 which takes place at this point is similar to hydrogenation ST41 (fourth process step ST4A) in Embodiment 1 explained previously and is performed either by hydrogen annealing in an argon gas atmosphere containing 3% hydrogen using an APCVD reactor at atmospheric pressure, or by hydrogen annealing or hydrogen plasma in a hydrogen gas atmosphere at reduced pressure between approximately 1 Torr and 100 Torr using LPCVD, or by hydrogen plasma irradiation in a PECVD reactor, or by argon-hydrogen plasma irradiation in a sputtering unit. Additionally, first gate insulator layer formation ST16, which involves silicon oxide layer formation, is performed immediately after hydrogenation ST14 in the APCVD reactor, LPCVD reactor, PECVD reactor, or sputtering unit in which hydrogenation was performed. Through hydrogenation ST14, it is possible to terminate and stabilize the active surface of the semiconductor layer with hydrogen. Further, because hydrogenation ST14 is performed consecutively following crystallization ST13 without exposing the substrate to atmosphere, no natural oxide forms on the surface of the semiconductor layer. Consequently, during hydrogenation ST14, there are no effects from a natural oxide and it is possible to uniformly and effectively hydrogenate in a very short time period. As a result, the electrical conductivity of the semiconductor layer is stabilized and the electrical characteristics such as the TFT on current are improved.

Following this, the fabrication process is the same as in Embodiment 1. In the second process step ST2B, the first gate insulator layer and the semiconductor layer are thermally processed by a process such as rapid thermal annealing. Next, in the third process step ST3B, the first gate insulator layer and the semiconductor layer are patterned. Next, in the fourth process step ST4B, following hydrogenation ST41 of the substrate, the second gate insulator layer is formed sequentially on the surface of the first gate insulator layer without exposing the substrate to atmosphere (second gate insulator layer formation ST42).

[Outline of Embodiment 3]

The fabrication process pertaining to Embodiment 3 of the present invention is mainly applicable to TFTs fabricated by the low temperature process. This will be explained with reference to FIG. 3.

Figure 3:
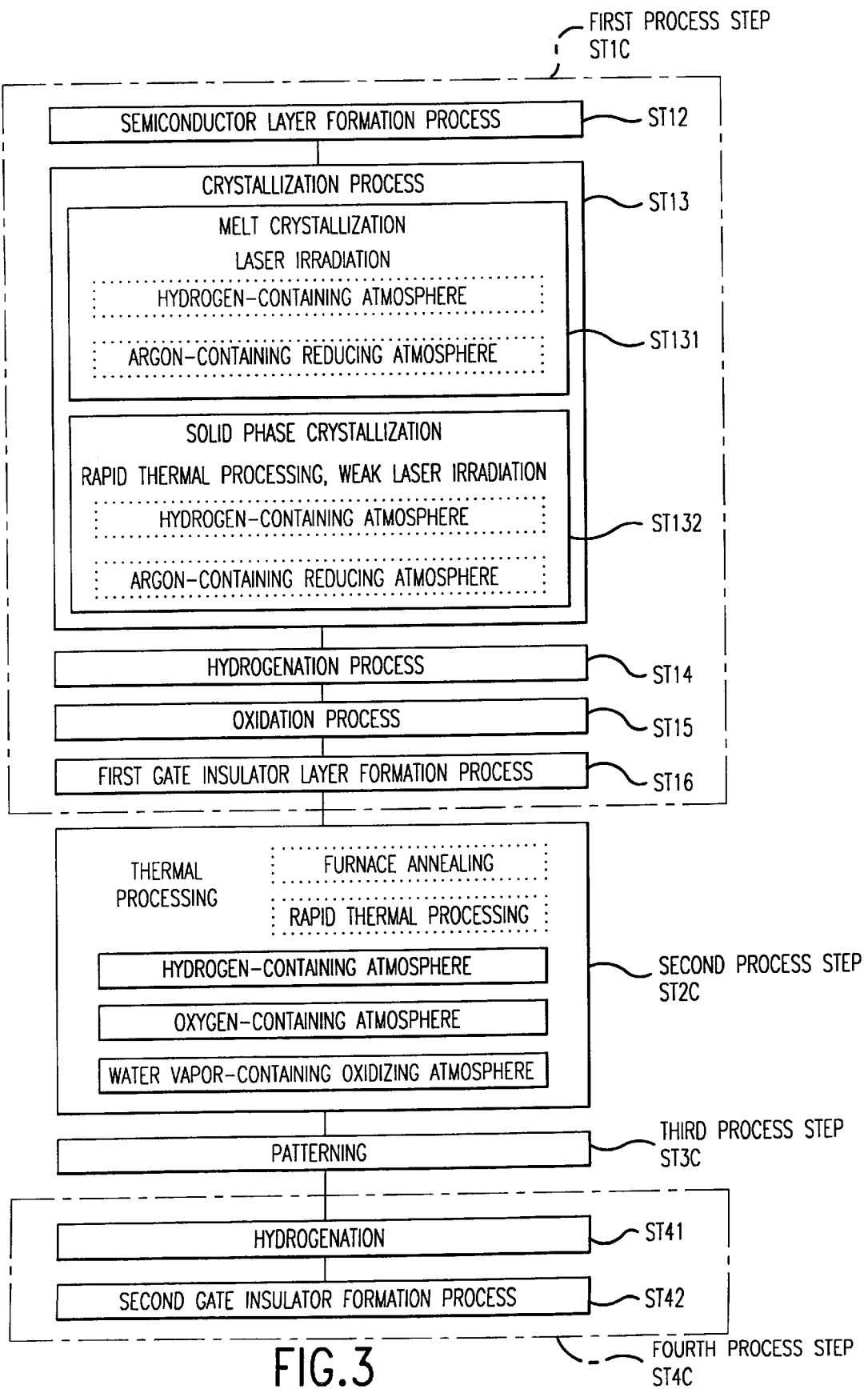
FIG. 3 shows a processing chart for another TFT fabrication process related to Embodiment 3 of the present invention.

As can be seen from FIG. 3, the fabrication process of the present invention is similar to that of the fabrication process of Embodiment 1 in that in the first process step ST1C, semiconductor layer formation ST12, crystallization ST13, and first gate insulator layer formation ST16 are performed consecutively without exposing the substrate to atmosphere. In this first process step ST1C, along with hydrogenation ST14 of the semiconductor layer, oxidation ST15 of the semiconductor layer is performed following semiconductor layer crystallization ST13 and before first gate insulator layer formation ST16. When this oxidation ST15 is done under a vacuum, it can be done using a plasma of oxygen or water vapor, a mixture of oxygen and water vapor, or nitrous oxide. When this oxidation ST15 is done under atmospheric pressure, it can be done by annealing in an oxygen or water vapor atmosphere, an oxygen-water vapor atmosphere, or a nitrous oxide atmosphere. It is also possible to use ozone. Because oxidation ST15 can easily produce a high quality oxide layer through the reaction between oxygen and the active surface of the semiconductor layer, it is possible to extremely easily form a gate insulator layer having a clean MOS interface.

Following this, the fabrication process is the same as in Embodiment 1. In the second process step ST2C, the first gate insulator layer and the semiconductor layer are thermally processed by a process such as rapid thermal annealing. Next, in the third process step ST3C, the first gate insulator layer and the semiconductor layer are patterned. Next, in the fourth process step ST4C, following hydrogenation ST41 of the substrate, the second gate insulator layer is formed sequentially on the surface of the first gate insulator layer without exposing the substrate to atmosphere (second gate insulator layer formation ST42).

The fabrication of a TFT of this embodiment is described later as Example 1.

[Outline of Embodiment 4]

The fabrication process pertaining to Embodiment 4 of the present invention is mainly applicable to TFTs fabricated by the low temperature process. This will be explained with reference to FIG. 4.

Figure 4:
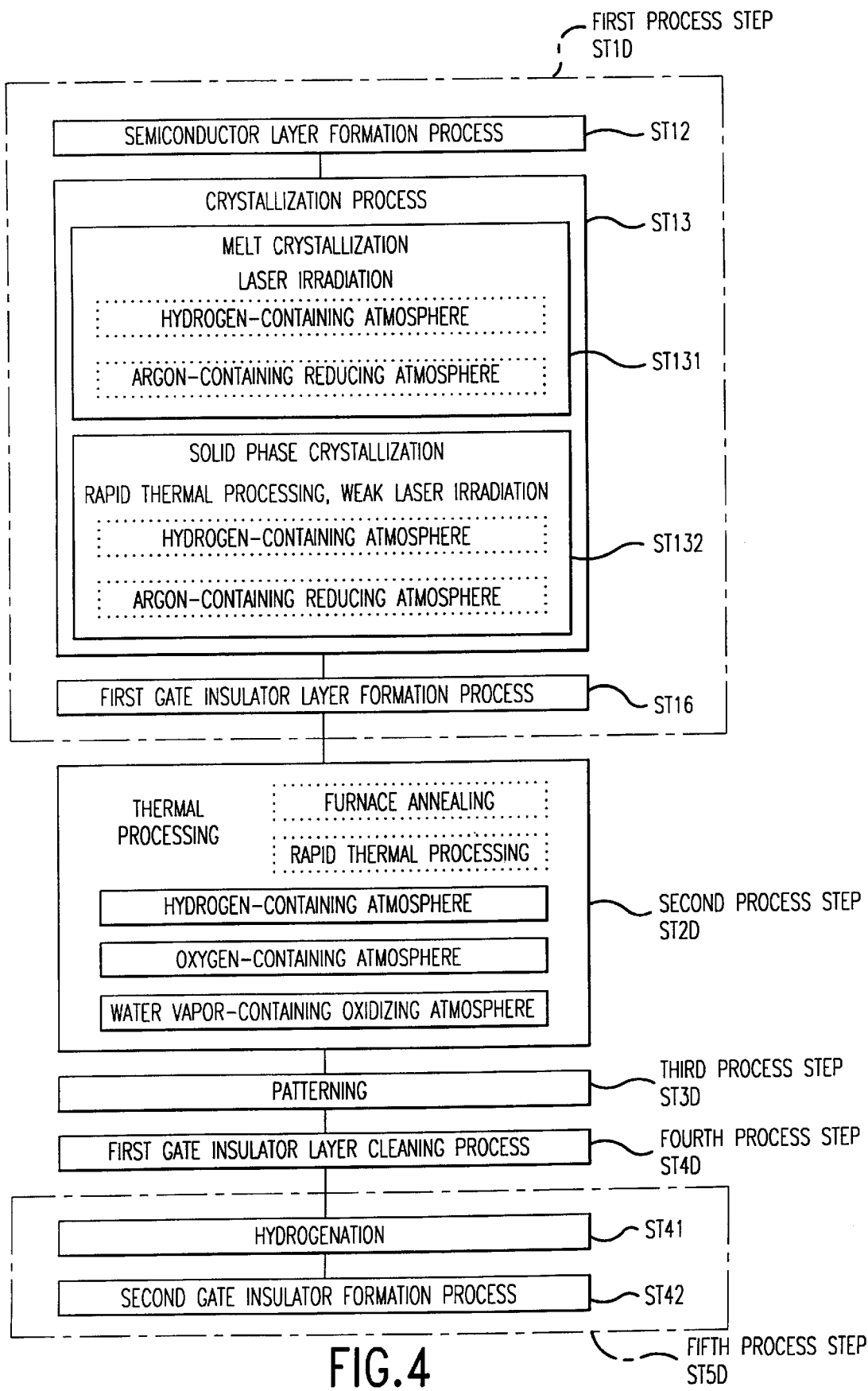
FIG. 4 shows a processing chart for the TFT fabrication process related to Embodiment 4 of the present invention.

As can be seen from FIG. 4, the fabrication process of the present invention is similar to that of the fabrication process of Embodiment 1 in that in the first process step ST1D, semiconductor layer formation ST12, crystallization ST13, and first gate insulator layer formation ST16 are performed consecutively without exposing the substrate to atmosphere. Next, in the second process step ST2D, the first gate insulator layer and the semiconductor layer are thermally processed by a process such as rapid thermal annealing. Next, in the third process step ST3D, the first gate insulator layer and the semiconductor layer are patterned. Next, in the present invention, the surface of the first gate insulator layer which has become contaminated by the resist mask used during semiconductor layer patterning, is cleaned by etching or other process (fourth process step ST4D). In the cleaning, either wet etching with a hydrofluoric acid based etchant or dry etching with hydrogen, tetrafluoromethane, nitrogen trifluoride, or sulfur hexafluoride (SF6) can be used. Dry etching is particularly applicable in order to combine this cleaning step with the immediately following hydrogenation step ST41 in the fifth process step ST5D so as to avoid exposing the substrate to atmosphere.

Through such cleaning of the contaminated first gate insulator layer, the TFT electrical characteristics are stabilized. Further, because only the surface layer of the first gate insulator layer contaminated by the resist mask is removed, the semiconductor layer is not exposed to atmosphere during the process. Consequently, it is possible to absolutely avoid contaminated oxidation of the semiconductor layer surface and stabilize the TFT electrical characteristics.

Following this, the fabrication process is the same as in Embodiment 1. In the fifth process step ST5D, following hydrogenation ST41 of the substrate, the second gate insulator layer is formed sequentially on the surface of the first gate insulator layer without exposing the substrate to atmosphere (second gate insulator layer formation ST42). It is most desirable not to expose the substrate to atmosphere following cleaning of the first gate insulator layer ST4D just described to formation of the second gate insulator layer ST42.

The fabrication of a TFT of this embodiment is described later as Example 2.

[Outline of Embodiment 5]

One component of the fabrication process pertaining to Embodiment 5 of the present invention is mainly applicable to TFTs fabricated by the high temperature process. This will be explained with reference to FIG. 5.

Figure 5:
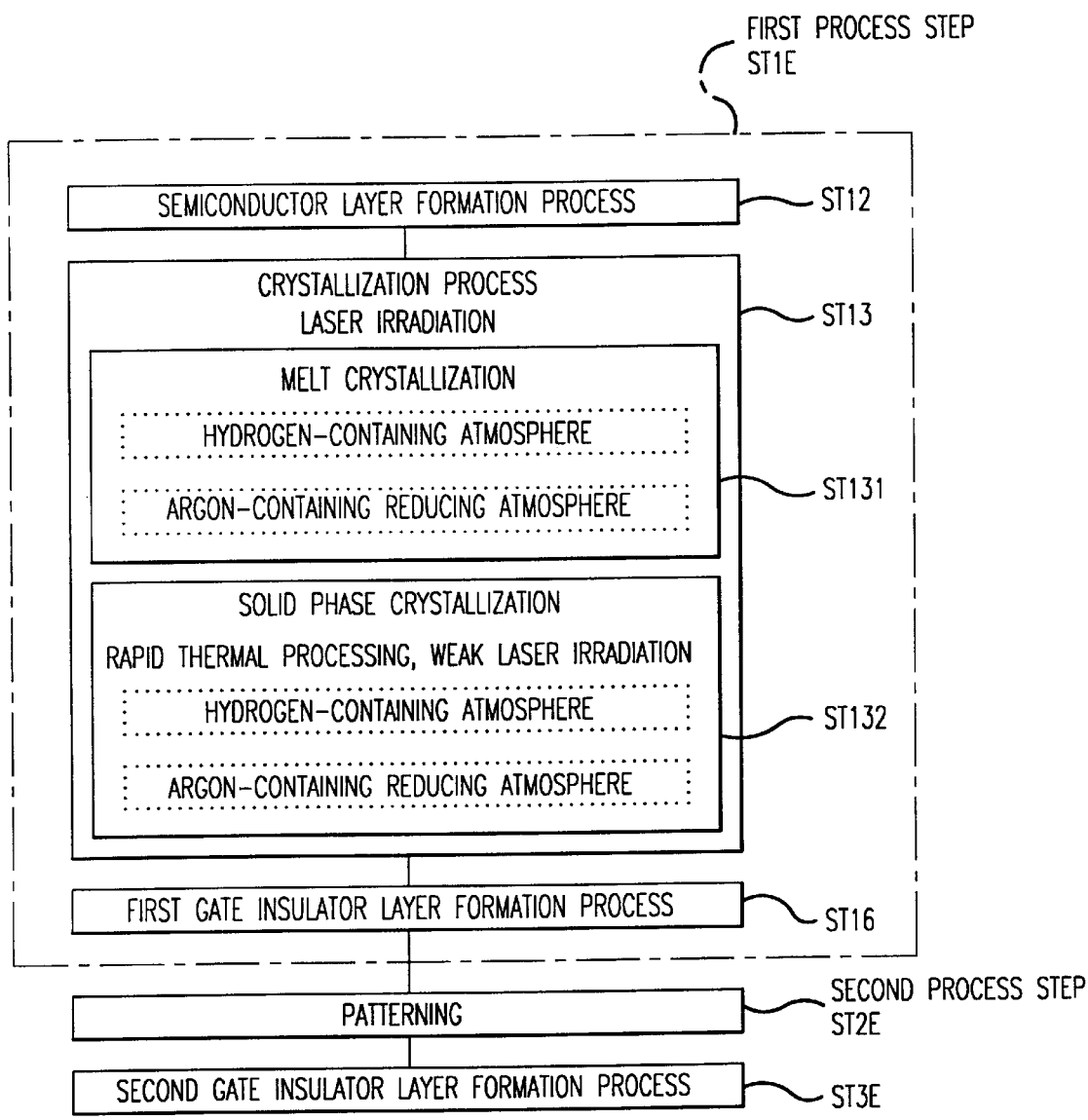
FIG. 5 shows a processing chart for the TFT fabrication process related to Embodiment 5 of the present invention.

As can be seen from FIG. 5, the fabrication process of the present invention as well is similar to that of the fabrication process of Embodiment 1 in that in the first process step ST1E, semiconductor layer formation ST12, crystallization ST13, and first gate insulator layer formation ST16 are performed consecutively without exposing the substrate to atmosphere.

Next, in the present invention, the gate insulator layer and semiconductor layer are patterned as the second process step ST2E.

Next, as the third process step ST3E in the present invention, the substrate is thermally processed in an oxidizing atmosphere; and an oxide layer is formed on the semiconductor layer surface as the second gate insulator layer. During the formation of this oxide layer, for example, the use of a CVD method such as APCVD, LPCVD, or PECVD used in the first gate insulator formation step ST16 in accordance with Embodiment 1 described before, or a PVD method such as sputtering or evaporation, either of which is followed by thermal processing in an atmosphere such as oxygen or nitrogen at a temperature between approximately 800° C. and 1200° C. is also acceptable. Alternatively, thermal processing in an atmosphere of oxygen, water vapor, or an oxygen-hydrogen mixture at a temperature between approximately 800° C. and 1200° C. is also acceptable. Additionally, there is also high temperature oxidation (HTO method) by CVD using monosilane and oxygen between approximately 700° C. and 1000° C.

[Outline of Embodiment 6]

The TFT fabrication process pertaining to Embodiment 6 of the present invention is similar to the TFT fabrication process of Embodiment 5 of the present invention, and the high temperature process is used in one component of the process. This will be explained with reference to FIG. 6.

Figure 6:
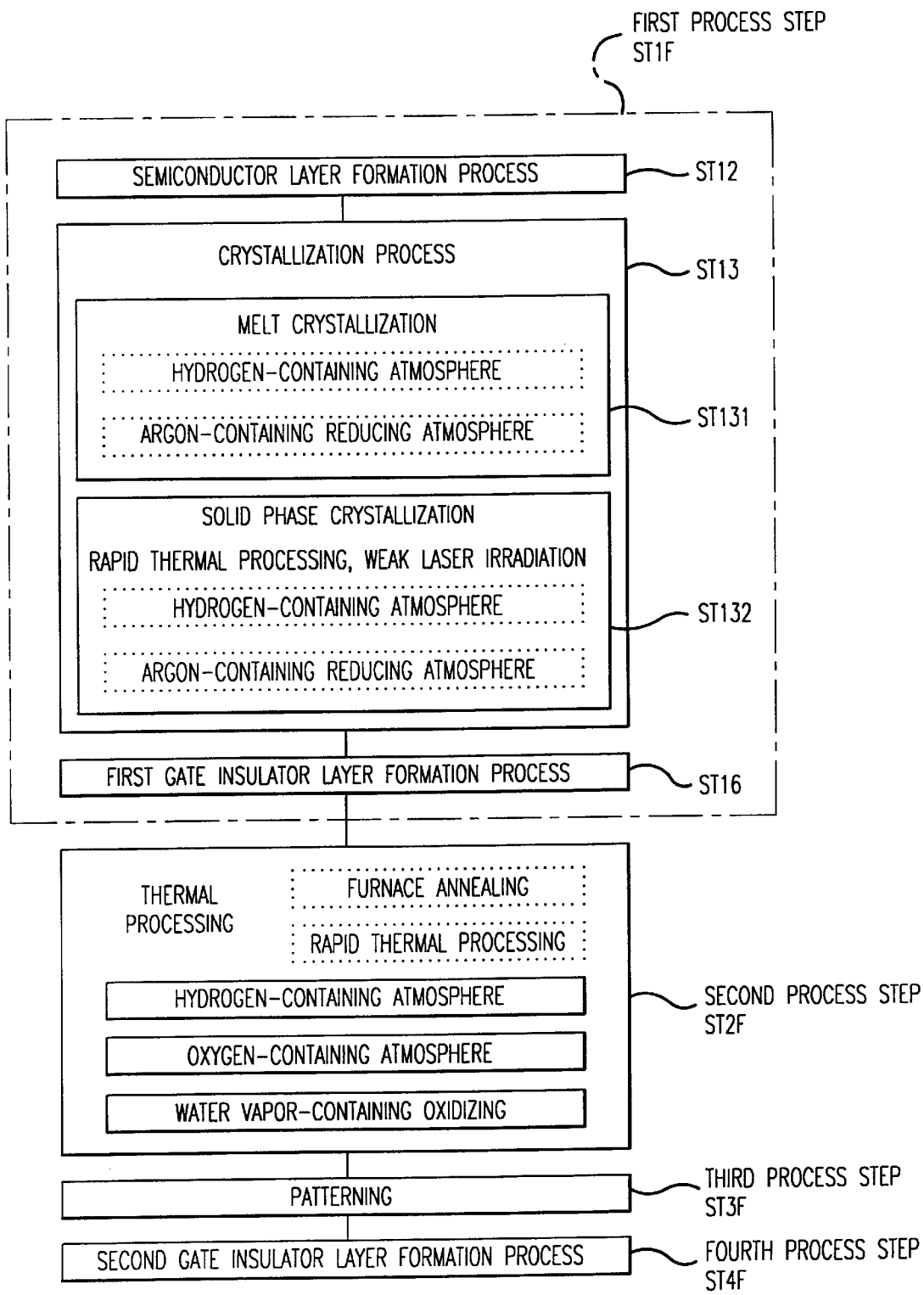
FIG. 6 shows a processing chart for another TFT fabrication process related to Embodiment 6 of the present invention.

As can be seen from FIG. 6, in the first process step ST1F, semiconductor layer formation ST12, crystallization ST13, and first gate insulator layer formation ST16 are performed consecutively without exposing the substrate to atmosphere.

Next, in the present invention, the gate insulator layer and semiconductor layer are thermally processed by means such as rapid thermal annealing as the second process step ST2F.

Following this, the fabrication process is the same as in Embodiment 5. In the third process step ST3F, the gate insulator layer and semiconductor layer are patterned. Next, in the fourth process step ST4F, the substrate is annealed in an oxidizing atmosphere, and a oxide layer is formed on the semiconductor layer surface as the second gate insulator layer.

In the present invention as well, it is desirable to perform the second process step ST2F in a hydrogen-containing atmosphere, an oxygen-containing atmosphere, or a water vapor-containing atmosphere.

The fabrication of a TFT of this embodiment is described later as Example 3.

[Outline of Embodiment 7]

The fabrication process pertaining to Embodiment 7 of the present invention is mainly applicable to TFTs fabricated by the low temperature process. This will be explained with reference to FIG. 7.

Figure 7:
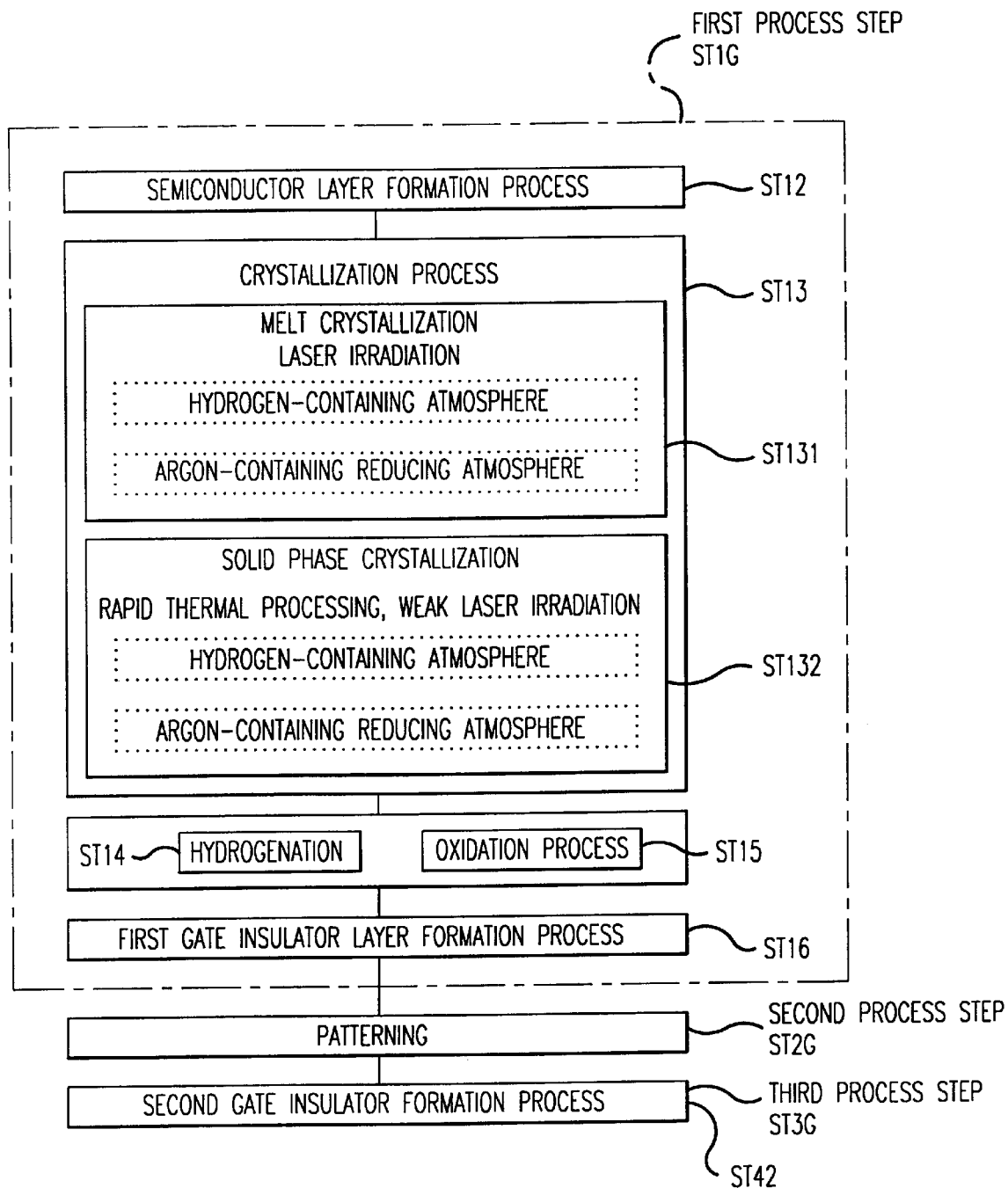
FIG. 7 shows a processing chart for the TFT fabrication process related to Embodiment 7 of the present invention.

As can be seen from FIG. 7, the fabrication process of the present invention is similar to that of the fabrication processes of Embodiment 1 through Embodiment 6 in that in the first process step ST1G, semiconductor layer formation ST12, crystallization ST13, and first gate insulator layer formation ST16 are performed consecutively without exposing the substrate to atmosphere. In this first process step ST1G in the present invention, at least hydrogenation ST14 or oxidation ST15 is performed on the semiconductor layer following crystallization ST13 of the semiconductor layer and prior to first gate insulator layer formation ST16. Ideally, the processing sequence from formation of the underlevel protection layer just before formation of the semiconductor layer to the formation of the first gate insulator layer is done continuously without exposing the substrate to atmosphere.

Following this, the first gate insulator layer and semiconductor layer are patterned in the second process step ST2G. Next, in the third process step ST3G, the second gate insulator layer is formed on the surface of the first gate insulator layer (second gate insulator layer formation ST42).

The fabrication of a TFT of this embodiment is described later as Example 4.

[Outline of Embodiment 8]

The fabrication process pertaining to Embodiment 8 of the present invention is mainly applicable to TFTs fabricated by the low temperature process. This will be explained with reference to FIG. 8.

Figure 8:
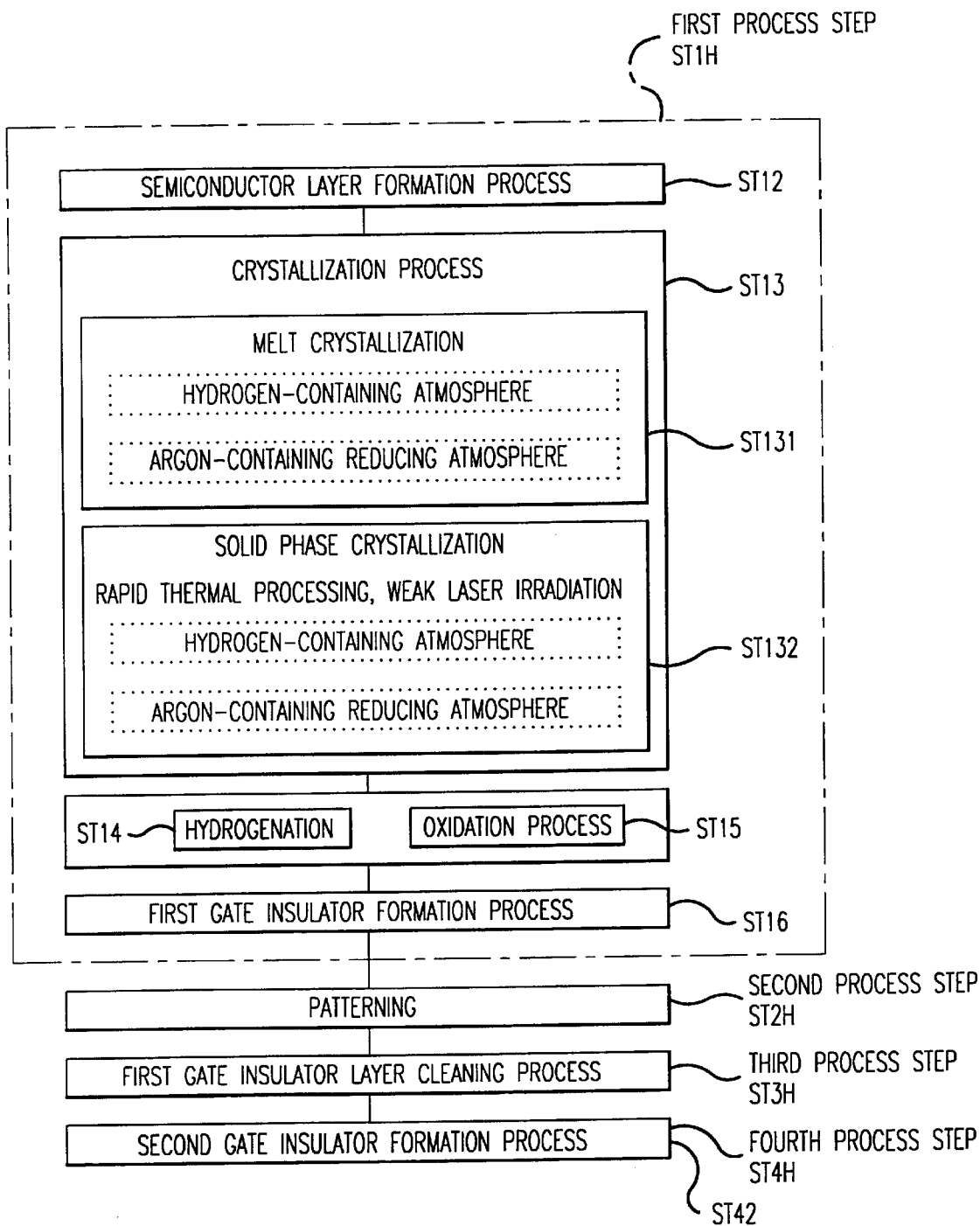
FIG. 8 shows a processing chart for another TFT fabrication process related to Embodiment 8 of the present invention.

As can be seen from FIG. 8, the fabrication process of the present invention is similar to that of the fabrication process of Embodiment 7 in that in the first process step ST1H, semiconductor layer formation ST12, crystallization ST13, and first gate insulator layer formation ST16 are performed consecutively without exposing the substrate to atmosphere. Further, in the first process step ST1H, at least hydrogenation ST14 or oxidation ST15 is performed on the semiconductor layer following crystallization ST13 of the semiconductor layer and prior to first gate insulator layer formation ST16.

Next, the first gate insulator layer and semiconductor layer are patterned in the second process step 2H. Following completion of second process step 2H, the surface of the first gate insulator layer is cleaned in the third process step 3H. Next, in the fourth process step 4H, the second gate insulator layer is formed on the surface of the first gate insulator layer (second gate insulator layer formation ST42). In the third process step 3H, either the entire layer or the surface of the first gate insulator layer contaminated by the resist mask used in the patterning of the semiconductor layer is removed by etching or other means to produce a clean material. In the cleaning, either wet etching with a hydrofluoric acid based etchant or dry etching with hydrogen, tetrafluoromethane, nitrogen trifluoride, or sulfur hexafluoride can be used in the same manner described for Embodiment 4. When performing dry etching, it is desirable to perform cleaning of the first gate insulator layer ST3H and formation of the second gate insulator layer ST4H consecutively without exposure to the atmosphere.

The fabrication of a TFT of this embodiment is described later as Example 5.

[Overview of the TFT Fabrication Equipment]

Figure 9:
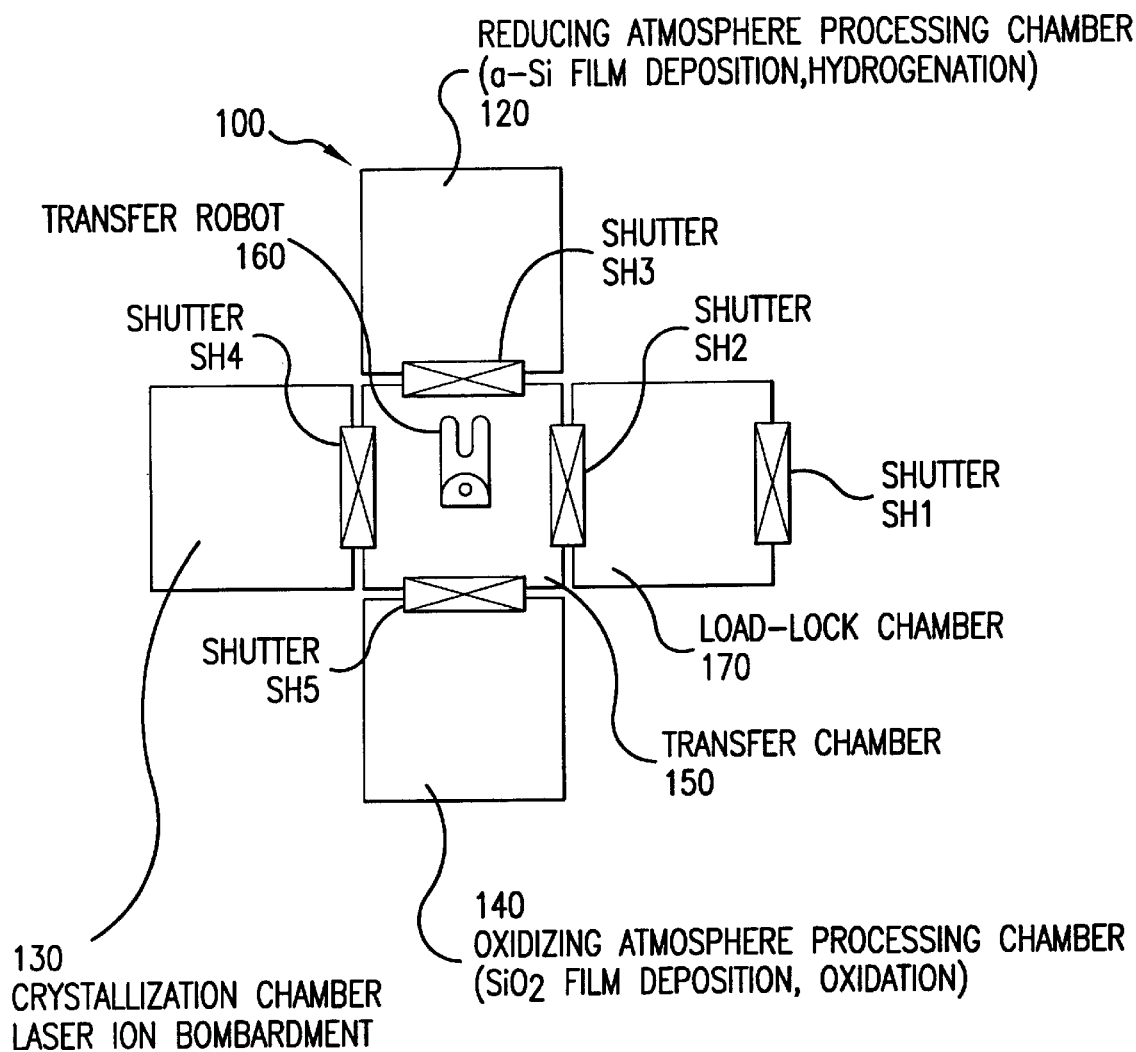
FIG. 9 is a schematic diagram showing one typical example of a TFT fabrication unit.
Figure 10:
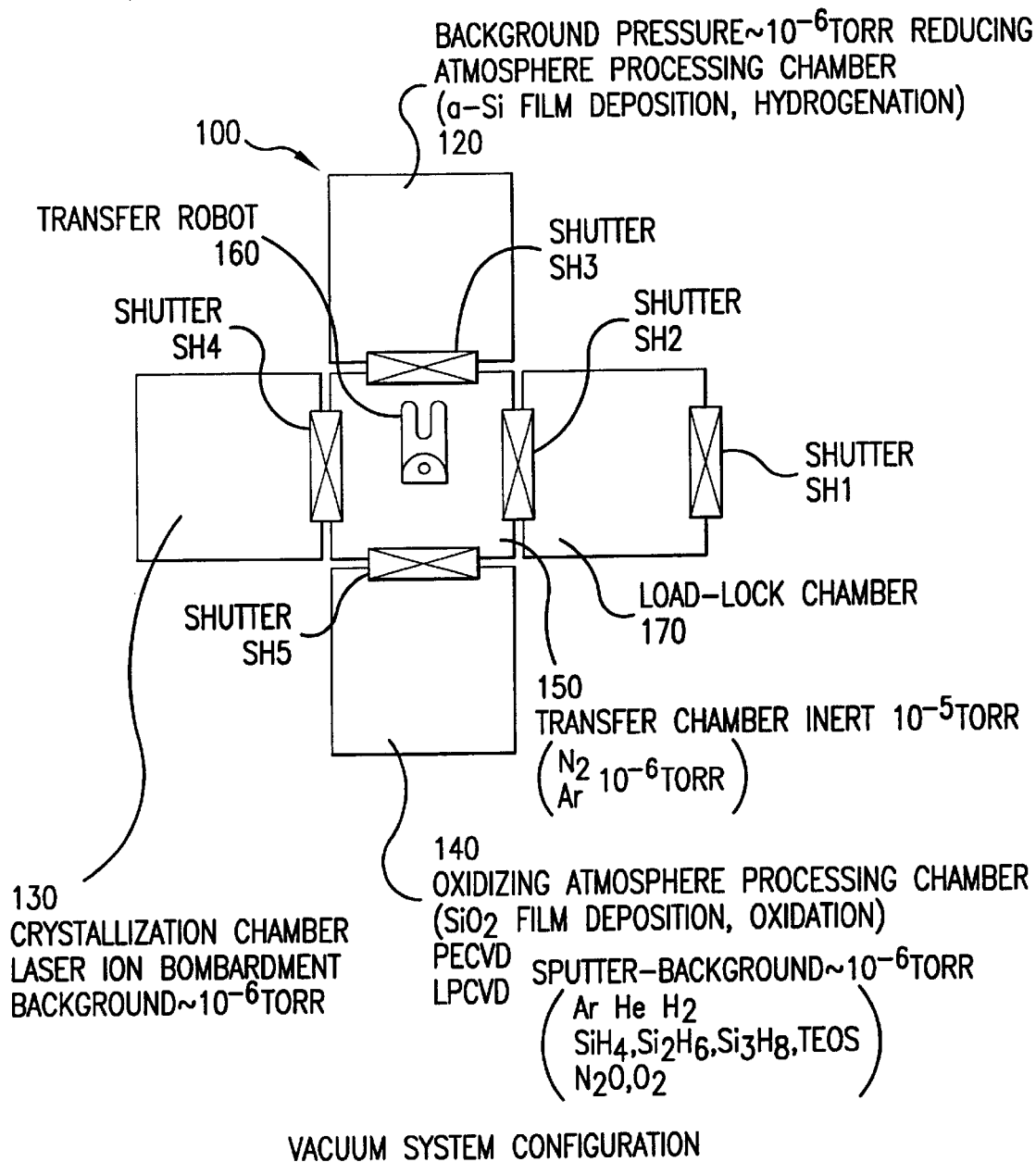
FIG. 10 is a schematic diagram showing one typical example of a TFT fabrication unit when configured as a vacuum system.
Figure 11:
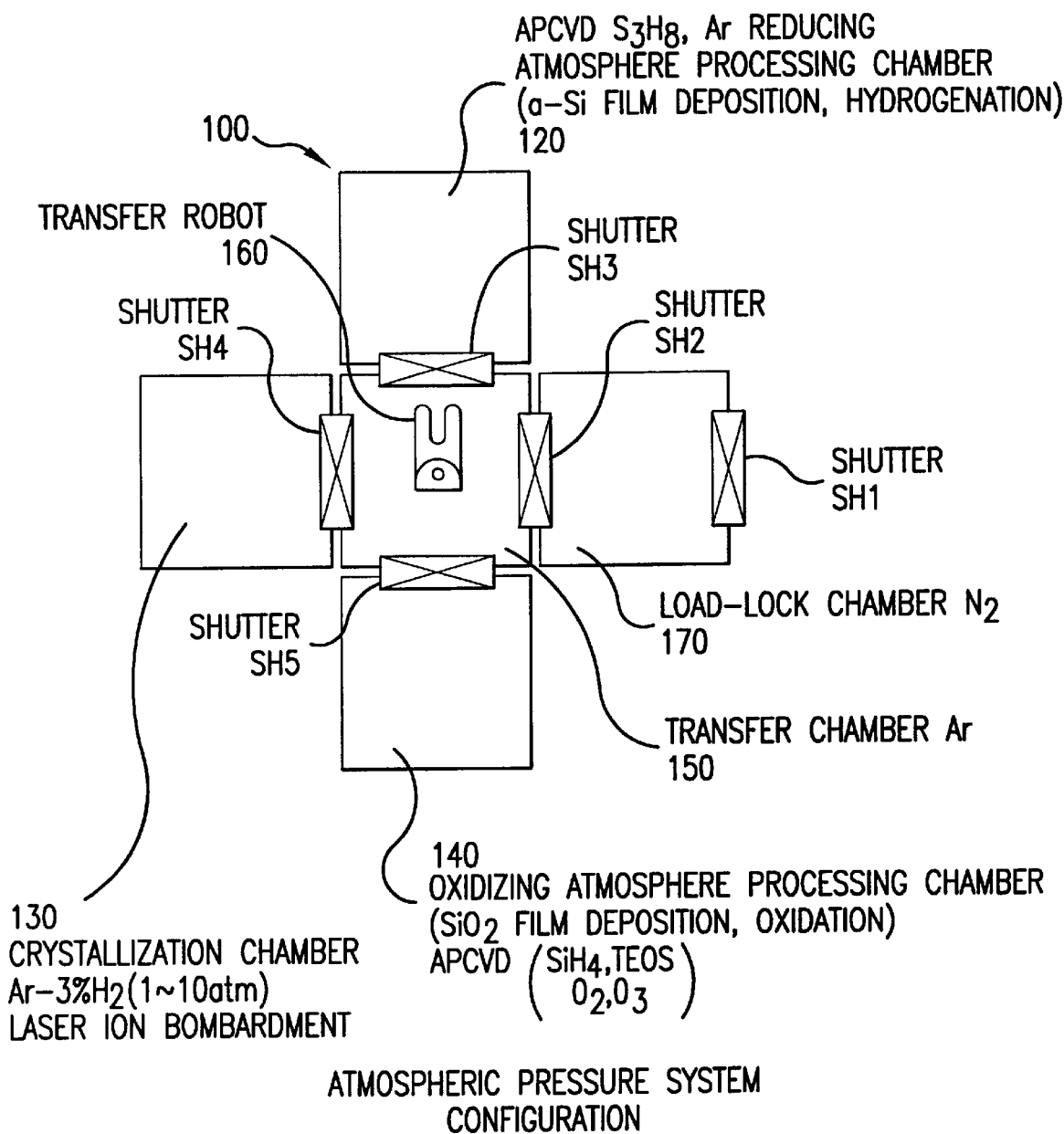
FIG. 11 is a schematic diagram showing one typical example of a TFT fabrication unit when configured as an atmospheric pressure system.

Before explaining each individual example, an overview of the multichamber TFT fabrication equipment which can be used for each example will be presented with reference to FIGS. 9 through 11. FIG. 9 is a schematic diagram showing the fundamental configuration of the multichamber TFT fabrication equipment. FIG. 10 is a schematic diagram showing the fundamental configuration of the multichamber TFT fabrication equipment when used as a vacuum system, and FIG. 11 is a schematic diagram showing the fundamental configuration of the multichamber TFT fabrication equipment when used as an atmospheric pressure system.

In FIG. 9, TFT fabrication unit 100 is composed of reducing atmosphere chamber 120 (CVD reactor) in which semiconductor films can be formed by CVD or PVD and hydrogenation can be performed; crystallization chamber 130 in which crystallization can be carried out by laser annealing, RTA, or ion bombardment; oxidizing atmosphere chamber 140 (CVD reactor) in which oxide layers can be formed by CVD or PVD and oxidation can be performed; and transfer chamber 150 connected to the previously mentioned processing chambers via shutters SH3, SH4, and SH5, respectively. Transfer robot 160 is located in transfer chamber 150 in order to transfer the substrates to and from the various processing chambers. Transfer chamber 150 is connected to load-lock chamber 170 via shutter SH2, and load-lock chamber 170 is composed of a substrate transfer entry and exit which can open and close via shutter SH1. When the multichamber TFT fabrication unit is configured as a vacuum system, vacuum pumping units (not shown in the figures) such as dry pumps or turbomolecular pumps as well as fixed gas supply units are connected to the various processing chambers. It is possible for all the processing chambers to handle the substrates while isolated from atmosphere. FIG. 10 shows one example of this. Load-lock chamber 170 can be held from 1 atmosphere to about $10^{-5}$ Torr. Reducing atmosphere chamber 120 has a background pressure less than about $10^{-6}$ Torr, and can admit gases such as argon or helium, hydrogen, monosilane, disilane, and trisilane. Here, semiconductor layer formation by a means such as PECVD, LPCVD, or sputtering as well as hydrogenation is possible. Crystallization chamber 130 has a background pressure less than about $10^{-6}$ Torr, and can admit gases such as argon or hydrogen. Here, crystallization by a means such as laser annealing, RTA, or ion bombardment is possible. Oxidizing atmosphere chamber 140 has a background pressure less than about $10^{-6}$ Torr, and can admit gases such as argon or helium, hydrogen, monosilane, disilane, trisilane, TEOS, nitrous oxide, and oxygen. Here, silicon oxide layer formation by a means such as PECVD, LPCVD, or sputtering as well as oxidation is possible. Transfer chamber 150 has a background pressure less than about $10^{-6}$ Torr, and can admit inert gases such as argon or nitrogen at a pressure of about $10^{-5}$ Torr.

When the multichamber TFT fabrication unit is configured as an atmospheric pressure system, various gas supply units are connected to the various processing chambers; and it is possible for all the processing chambers to handle the substrates while isolated from atmosphere. As shown in FIG. 11, load-lock chamber 170 can admit an inert gas such as nitrogen. Reducing atmosphere chamber 120 can admit a reducing gas such as trisilane or hydrogen or an inert gas such as argon. Here, semiconductor layer formation by APCVD and hydrogenation are possible. Crystallization chamber 130 can admit argon containing less than about 10% hydrogen, and crystallization by a means such as laser annealing or RTA is possible at a pressure between approximately 1 atmosphere and 10 atmospheres. Oxidizing atmosphere chamber 140 can admit gases such as monosilane or TEOS, nitrous oxide, oxygen, and ozone. Here, silicon oxide layer formation by APCVD and oxidation are possible. Transfer chamber 150 can admit inert gases such as argon.

Figure 12A:
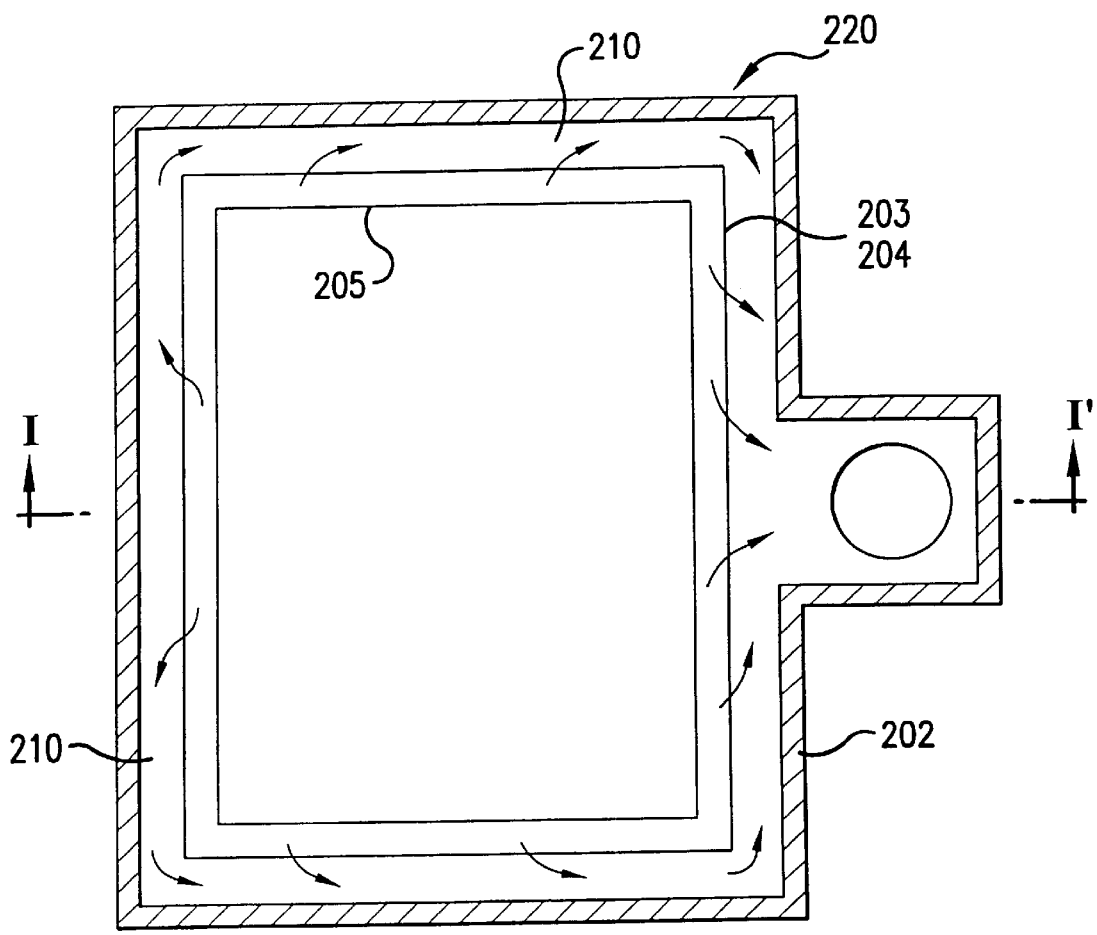
FIGS. 12(A) and 12(B) show the configuration of the plasma CVD chamber of the TFT fabrication unit shown in FIG. 9.
Figure 12B:
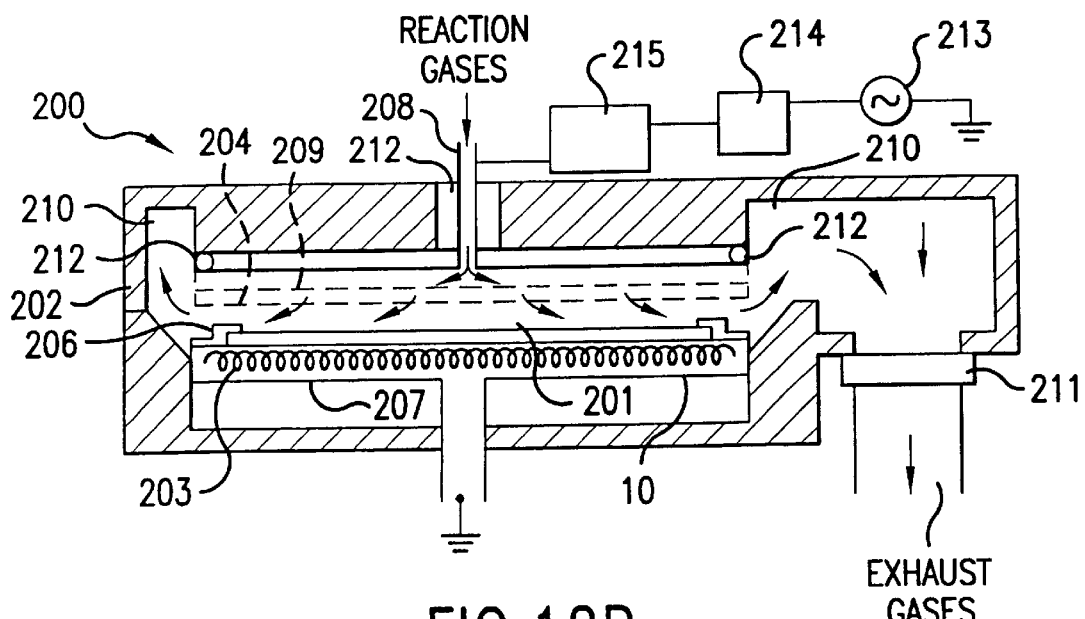

FIG. 12(A) is a schematic plan view of the region of the reaction chamber of the oxidizing atmosphere chamber or reducing atmosphere chamber of the TFT fabrication unit shown in FIGS. 9 through 11 when configured plasma CVD use, and FIG. 12(B) shows the cross-section indicated by line I–I' in FIG. 12(A). Plasma CVD reactor 200 in this example is a capacitively-coupled type, and the plasma is generated between parallel plate electrodes using a high frequency power supply. Reaction chamber 201 is isolated from the outside by reaction vessel 202, which is in turn a reduced pressure condition of from about 5 mTorr to 5 Torr during film formation. Inside reaction vessel 202, lower plate electrode 203 and upper plate electrode 204 is reaction chamber 201. This example uses 410 mm×510 mm parallel plate electrodes, and the distance between the electrodes is variable. The volume of reaction chamber 201 varies from 2091 cm$^3$ and 10455 cm$^3$ depending on changes in the separation between electrodes. Variation in distance between the parallel plate electrodes can be achieved by moving the position of lower electrode 203 up and down, and it is possible to set an arbitrary distance. When the electrode separation distance is set to a value, the deviation of the electrode separation distance over the parallel plate electrode surfaces is a mere 0.1 mm. As a result, the deviation in the electrical field strength that appears between the electrodes is 1.0% or less over the parallel plate electrode surfaces; and a plasma is generated uniformly within reaction chamber 201. A glass or other type of large substrate 10 on which thin film deposition is to take place is placed on top of lower plate electrode 203 and 2 mm of the edge of substrate 10 is held down by shadow frame 206. Shadow frame 206 has been omitted from FIG. 12(A) to make the configuration of the unit easy to understand. Heater 207 is installed within lower plate electrode 203 to heat substarte 10. The temperature of lower plate electrode 203 can be set freely from 25° C. to 400° C. When the temperature of the electrode is set to a given value, except for the peripheral 5 mm, the temperature distribution over the surface of lower plate electrode 203 is within ±1.0° C. relative to the set-point temperature. Even if the size of the substrate 10 were 400 mm×500 mm, the temperature deviation over the substrate surface can be maintained to within ±2.0° C. or less. For example, if a conventional glass substrate (such as Corning Japan's #7059, Nippon Electric Glass Co., Ltd.'s OA-2, or NH TechnoGlass's NA35) were used as substrate 10, shadow frame 206 would hold substrate 10 down to prevent it from deforming concavely by the heat from heater 207 as well as to prevent unnecessary thin films from being formed on the edges and back surface of the substrate. The reaction gas, which is made up of source gases and additional gases as need be, flows through tube 208 and is introduced into upper plate electrode 204. It then flows between gas diffusion plates 209 located inside upper plate electrode 204, and flows from the entire surface of the upper plate electrode 204 into the reaction chamber 201 at a virtually uniform pressure. If film formation is taking place, some of the reaction gas will be ionized when it exits the upper plate electrode 204 and cause a plasma to be generated between the parallel plate electrodes. From a part to all of the reaction gas will participate in film formation. In contrast, residual reaction gas has not participated in film formation and gases formed as a result of the film-forming chemical reaction will become exhaust gases and be discharged through exhaust port 210 which is in the top of the peripheral section of reaction vessel 202. It is desirable for the conductance of exhaust port 210 to be 100 times or more of the conductance between the parallel plate electrodes. In addition, the conductance between the parallel plate 209 is also sufficiently larger than the conductance of gas diffusion plate 209; and that desired is also 100 times or more of the conductance of gas diffusion plate 209. In such a manner, reaction gas can flow into reaction chamber 201 at essentially a uniform pressure from the entire surface of the large 410 mm×510 mm upper plate electrode; and, at the same time, exhaust gases are discharged in all directions from reaction chamber 201 at a uniform flow rate. The flow rates of the various reaction gases are adjusted to designated values by mass flow controllers (not shown) prior to entering tube 208. In addition, the pressure within reaction chamber 1201 is adjusted to the desired value by conductance valve 211, which is located at the exit of the exhaust port. A pumping system (not shown), such as a turbomolecular pump, is located on the exhaust side of conductance valve 211. In this example, an oil-free magnetic levitation turbomolecular pump is used as part of the pumping system, and the background pressure within the reaction chamber is set to the 10$^{-7}$ Torr level. In FIG. 12(A) and (B), arrows are used to show the flow of the gases. Both reaction vessel 202 and lower plate electrode 203 are at ground potential. These and upper plate electrode 204 are electrically isolated by insulation ring 212. When a plasma is generated, RF waves that are generated from oscillation supply 213 (power supply) are applied to upper plate electrode 204 through matching circuit 215 after amplification by amplifier 214. The plasma CVD reactor 120 used in this example, as mentioned above, has elaborate inter-electrode interval and gas flow control which makes it a thin film formation reactor that is able to handle even large substrates of 400 mm×500 mm. By adhering to these basic design concepts, the reactor can easily handle further enlargements in the substrate. Actually, it is possible to produce a reactor that can handle even larger substrates of 550 mm×650 mm. Although an RF power supply is used in this example, power supplies which generate microwaves or VHF waves may also be used. Also, with an RF power supply, it is also acceptable to use any of the integer multiples of the industrial RF frequency (13.56 MHz) which include 27.12 MHz, 40.6 MHz, 54.24 MHz, and 67.8 MHz. Such frequency modification can be easily accomplished by changing oscillation supply 213, amplifier 214 and matching circuit 215. For an electromagnetic wave plasma, if the frequency is increased, the electron temperature within the plasma will increase and radicals can easily be created. For the deposition of a silicon nitride film, monosilane or disilane is used as the reaction gas. When depositing a silane nitride film, ammonia (NH3) or nitrogen is added to these silanes. Further, when depositing a silicon oxide film, nitrous oxide (N2O) or Oxygen (O2) is added to these silanes. Alternatively, forming an oxide layer with an organic silane such as TEOS (Si—(O—CH2—(CH3)4)) and oxygen for example, is also acceptable. In addition to noble gases such as helium (He), argon (Ar) or neon (Ne), hydrogen (H2) or Nitrogen (N2) can be used as dilution gases.

Figure 13:
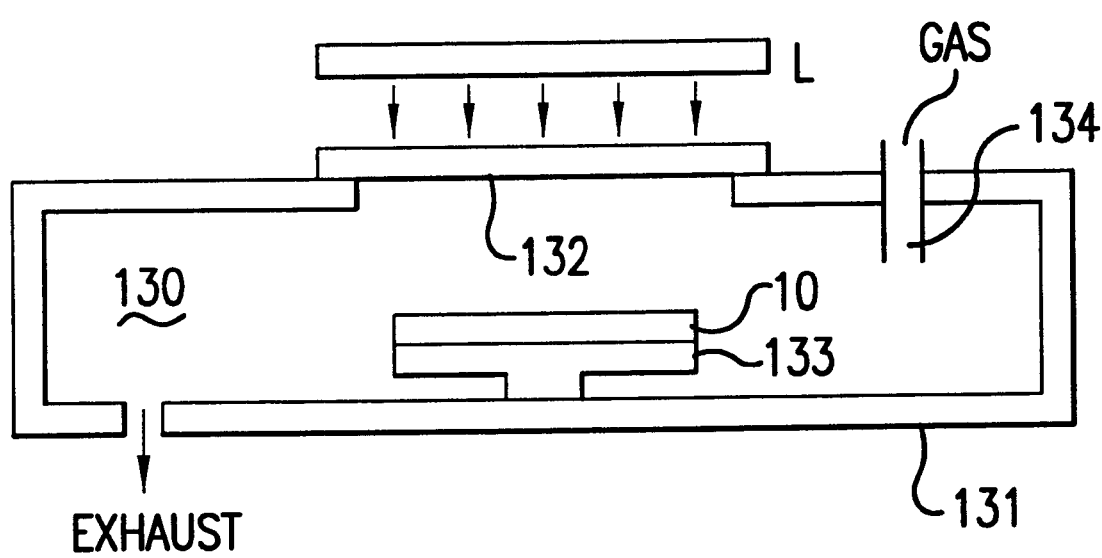
FIG. 13 shows the configuration of the crystallization chamber of the TFT fabrication unit shown in FIG. 9.

FIG. 13 is a schematic cross-sectional view of the region of the processing chamber of the crystallization chamber of the TFT fabrication unit shown in FIGS. 9 through 11 when configured for laser annealing or RTA use. As shown in FIG. 13, quartz window 132 is located at the top of housing 131 of crystallization chamber 130. Through quartz window 132, it is possible to irradiate substrate 10 atop holder 133 with high energy light from lamp L for RTA use or laser light. A heater is located inside of holder 133 so that it is possible to heat the substrate from about 25° C. to approximately 400° C. Since this holder can move forwards and backwards, the entire surface of substrate 10 can be irradiated by light from lamp L. Gases such as argon or hydrogen can be introduced into crystallization chamber 130 through introduction pipe 134 such that it is possible to anneal under these gas atmospheres. Lamp L is outfitted with reflection mirrors and a focusing lens system, but these essential components are omitted from the figure.

As explained above, in the TFT fabrication process of the present invention, the substrate is not exposed to atmosphere from formation of the underlevel protection layer to formation of the semiconductor layer and first gate insulator layer formation. Subsequently, formation of the second gate insulator layer following patterning of the first gate insulator layer and the semiconductor layer is a special characteristic. As a result, by means of the present invention, the surface of the crystallized semiconductor layer following annealing is not influenced by oxidation or contamination. Consequently, because the interface condition between the channel region and the gate insulator layer is good, the electrical properties of the TFT including such things as the on current and the threshold voltage improve. Further, because the first gate insulator layer is formed prior to patterning of the semiconductor layer, the resist mask is not formed on the surface of the semiconductor layer. Consequently, the semiconductor layer is not contaminated by the resist; and, further, there is no contamination from the surface of the underlevel protection layer such that a high purity, high quality crystalline semiconductor layer can be obtained. Additionally, the second gate insulator layer is formed after patterning of the first gate insulator layer and the semiconductor layer; and, because the side walls of the semiconductor layer are covered, shorts cannot develop. Because of this, yield and reliability increase as a result of the present invention.

When the first gate insulator layer and the semiconductor layer are rapidly thermal processed, the degree of crystallinity among other things increases and it is possible to obtain high quality semiconductor layers. Also, the first gate insulator layer densifies uniformly. Because a high quality first gate insulator layer is possible, the reliability of TFTs fabricated with such a layer is increased even further.

When hydrogenating the first gate insulator followed by formation of the second gate insulator layer, the deterioration of the first gate insulator layer caused by the release of hydrogen in the previously mentioned rapid thermal processing step can be recovered through the hydrogenation step.

As a result of thermal processing during the formation of an oxide layer as the second gate insulator layer, the stress in the semiconductor layer is relieved. Therefore, it is possible to obtain high quality semiconductor layers. The first gate insulator layer is also heated and densifies during this step such that TFTs fabricated with such layers have high reliability.

The Best Mode for Implementing the Invention

EXAMPLE 1

An example of the present invention will be explained with reference to FIGS. 14A through 14F and other figures. The fabrication process for the TFT included here includes the process steps shown in FIG. 3, and, consequently, also includes the fabrication process of FIGS. 1 and 2. The process steps from FIG. 14(B) to FIG. 14(E) are performed in TFT fabrication unit 100 shown in FIGS. 9 through 11.

Figure 14A:
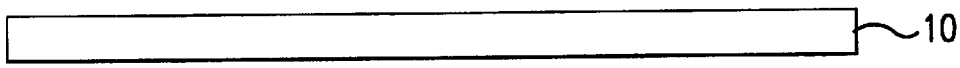
FIGS. 14(A)–(F) are a cross-section process diagram of one portion of the TFT fabrication process of Example 1 of the present invention.

In this example, first, as shown in FIG. 14(A), a glass or other type of substrate 10 which has been cleaned by ultrasonic cleaning or other methods is prepared and inserted into transfer chamber 150 of TFT fabrication unit 100 via load-lock chamber 170. After reaching a pressure of between approximately $10^{-7}$ Torr and $10^{-1}$ Torr, substrate 10 is transferred from transfer chamber 150 to oxidizing atmosphere chamber 140 (plasma CVD reactor).
(First Process Step ST1C)

Figure 14B:
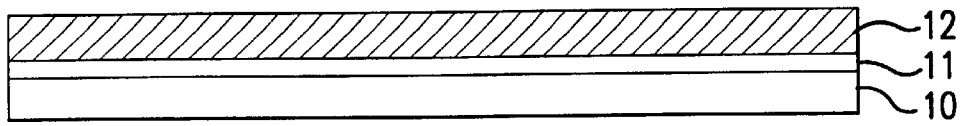

Next, as shown in FIG. 14(B), underlevel protection layer 11 consisting of a silicon oxide film is formed to a thickness of approximately 200 nm by plasma CVD over the entire surface of substrate 10 in the interior of oxidizing atmosphere chamber 140, which is at reduced pressure, at a substrate temperature of between approximately 150° C. and 450° C. (underlevel protection layer formation process). At this point, the source gas may consist of a mixture of monosilane and nitrous oxide or TEOS and oxygen, for example. When a silicon nitride film is used as the underlevel protection layer, silane and ammonia are a good combination. It is further possible to use an insulating layer such as a silicon nitride film or a multilayer film as underlevel protection layer 12.

Next, substrate 10 is transferred from oxidizing atmosphere chamber 140 into reducing atmosphere chamber 120 via transfer chamber 150 without exposing it to atmosphere. Inside reducing atmosphere chamber 120 which is at a reduced pressure and contains argon gas, semiconductor layer 12 consisting of an amorphous silicon film is formed to a thickness of approximately 60 nm by plasma CVD over the entire surface of substrate 10 at a substrate temperature of between approximately 150° C. and 450° C. (semiconductor layer formation process ST12). At this point, it is possible to use disilane or monosilane, for example, as the source gas.

Figure 14C:
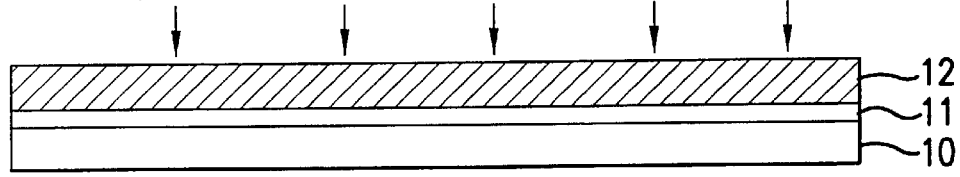

Next, substrate 10 is transferred from reducing atmosphere chamber 120 into crystallization chamber 130 via transfer chamber 150. During this time, from reducing atmosphere chamber 120 to transfer chamber 150 and crystallization chamber 130, substrate 10 is maintained in either a reduced pressure or a non-oxidizing atmosphere, and is not exposed to atmosphere. In crystallization chamber 130, as shown in FIG. 14(C), at least the surface layers of semiconductor layer 12 are melt crystallized through irradiation by high energy light (laser light or RTA light) from lamp L while either under vacuum (reduced pressure) or in a non-oxidizing atmosphere such as a hydrogen-containing atmosphere or a forming gas (a reducing atmosphere composed of approximately 10% hydrogen in argon) atmosphere at a pressure of ~1 atmosphere or greater (crystallization process ST13/solid phase crystallization by rapid thermal annealing process ST132). Here, the surface of substrate 10 and the surface of semiconductor layer 12 are not contaminated by resist or other contaminants; and, further, no oxide layer is formed. Consequently, crystallized semiconductor layer 12 has no impurity incorporation from the crystallization and is extremely pure. Additionally, the crystalline grains grow large as a result of the absence of impurities. The high energy light from lamp L irradiates the surface of semiconductor layer 12 with a fixed width, but the region of irradiation moves along with the movement of substrate 10. Each region of substrate 10 is rapidly heated by the light from lamp L for a time between approximately $10^{-9}$ seconds to the order of seconds at the most. Thus, semiconductor layer 12 is crystallized by melt crystallization or solid phase crystallization and becomes a crystalline semiconductor layer. Because the entire substrate 10 does not receive large thermal stresses simultaneously, strain and other problems do not develop.

Figure 14D:
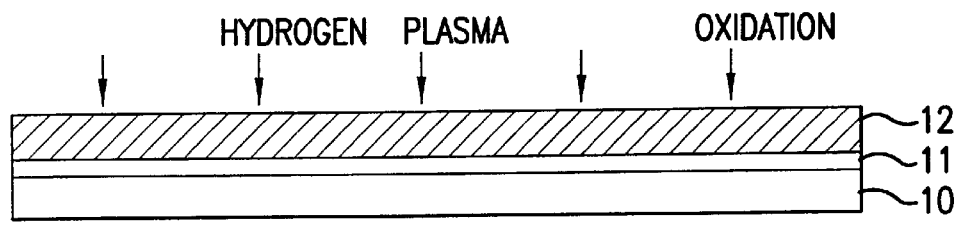

Next, substrate 10 is transferred from crystallization chamber 130 into reducing atmosphere chamber 120 via transfer chamber 150. During this time, from crystallization chamber 130 to transfer chamber 150 and reducing atmosphere chamber 120, substrate 10 is maintained in either a reduced pressure or a non-oxidizing atmosphere and is not exposed to atmosphere. In reducing atmosphere chamber 120, as shown in FIG. 14(D), substrate 10 is maintained at reduced pressure and irradiated by hydrogen plasma; and the defects existing in melt crystallized semiconductor layer 12 are reduced. That is, unpaired bonds in the silicon film existing in semiconductor layer 12 are terminated (hydrogenation process ST14).

Next, substrate 10 is transferred from reducing atmosphere chamber 120 into oxidizing atmosphere chamber 140 via transfer chamber 150 without exposing it to atmosphere. Inside oxidizing atmosphere chamber 140, following hydrogen plasma irradiation, substrate 10 is irradiated with oxygen plasma and oxidation process ST15 is performed. Although normally the surface of a layer crystallized for a short time on the order of seconds in vacuum or a non-oxidizing atmosphere is extremely active such that it is easily contaminated by air-borne particulates if exposed to air, this active surface is terminated by hydrogen in the present example and therefore stabilized. If a high purity oxygen plasma is used, a high quality plasma layer is easily formed through the reaction of oxygen and the active surface, which makes possible the extremely easy formation of a gate insulator layer having a clean MOS interface. A purity of approximately 99.9999% or more is desirable for the oxygen gas used to create the oxygen plasma, and a background pressure of approximately $10^{-6}$ Torr or better with respect to the pressure during oxygen plasma processing is required. For example, when oxygen plasma processing takes place at 1 Torr, a high vacuum of better than approximately $10^{-6}$ Torr is necessary for the background pressure.

Figure 14E:
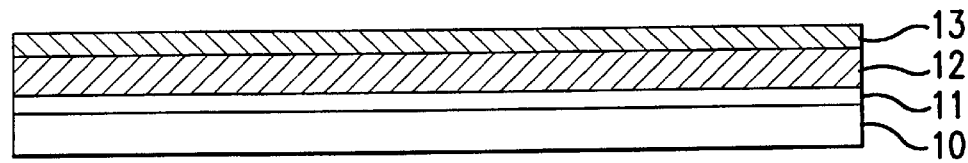

Next, as shown in FIG. 14(E), substrate 10 is maintained at a reduced pressure, and first gate insulator layer 13 consisting of a silicon oxide film is formed to a thickness of between 10 and 50 nm by plasma CVD over the entire surface of substrate 10 at a substrate temperature of between approximately 150° C. and 450° C. (first gate insulator layer formation process ST16). At this point, a mixture of monosilane and nitrous oxide or TEOS and oxygen, for example, may be used as the source gas.

(Second Process Step ST2C)

Figure 14F:
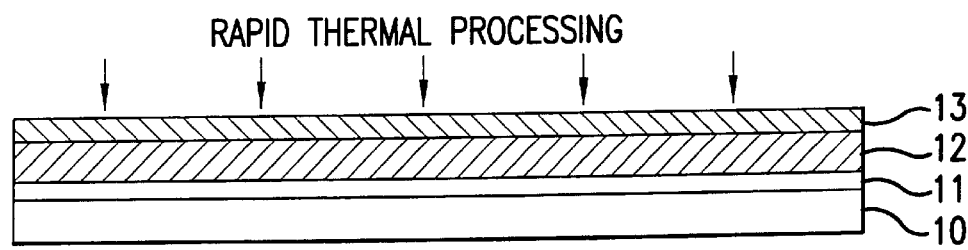
Figure 29:
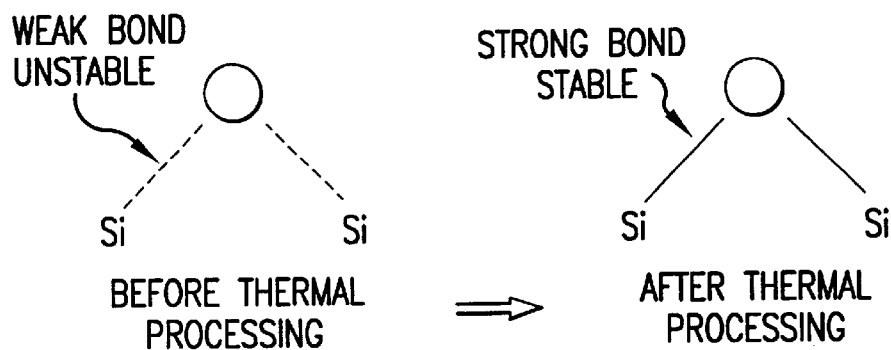
FIG. 29 is an explanatory diagram showing the bonding between silicon atoms and oxygen atoms before and after the first gate insulator layer has been thermally processed in the present invention.
Figure 30:
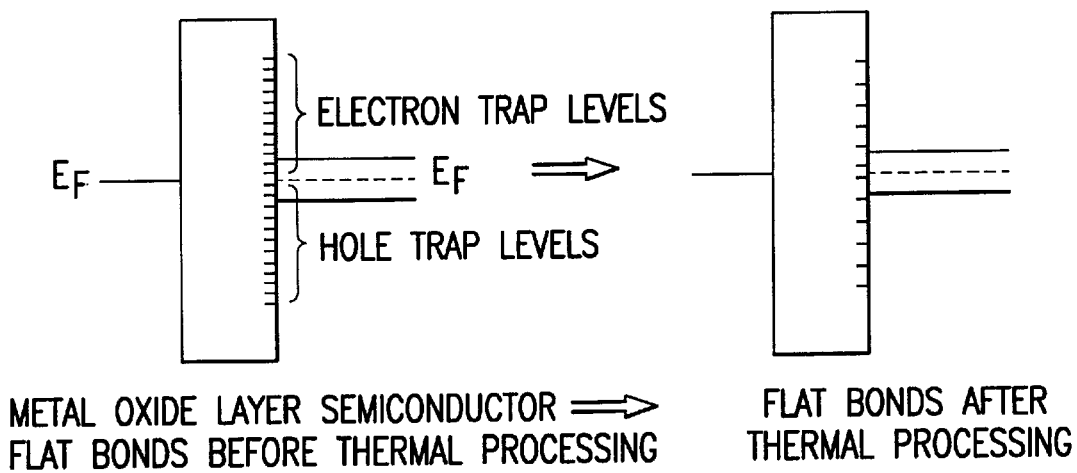
FIG. 30 is an explanatory diagram showing the flat bands before and after the first gate insulator layer has been thermally processed in the present invention.

Next, substrate 10 is transferred from oxidizing atmosphere chamber 140 into crystallization chamber 130 via transfer chamber 150. In crystallization chamber 130, as shown in FIG. 14(F), rapid thermal processing of semiconductor layer 12 and first gate insulator layer 13 is carried out. This rapid thermal processing relieves the stress in the semiconductor layer and further advances crystallization. Because only a portion of substrate 10 is heated for a time on the order of seconds in the rapid thermal processing, no strain or other problem is generated in substrate 10. During this process, first gate insulator layer 13 receives heat from underlying semiconductor layer 12, reaches a high temperature, and the insulating properties improve through densification. Also, because the rapid thermal processing occurs before patterning, the degree of thermal absorbance is uniform over the entire surface of substrate 10. This rapid thermal processing can be done in a nitrogen gas atmosphere for example in crystallization chamber 130. On the other hand, if the rapid thermal processing is done in a hydrogen-containing atmosphere, the dangling bonds (Si—O—*) in the silicon film which constitutes first gate insulator layer 13 are hydrogenated to become Si—O—H, for example; and the fixed charge can be reduced. Further, if the rapid thermal processing is done in an oxygen-containing atmosphere, the silicon atoms (Si—*) in the unsatisfied bonds in first gate insulator layer 13 can be bonded as in Si—O—Si, and it is possible to improve the insulating layer. Also, if the rapid thermal processing is done in a water-containing oxidizing atmosphere, in addition to being able to grow a thicker first gate insulator layer 13, the film quality improvement described in FIGS. 29 and 30 can be more nearly perfectly achieved. Performing multiple rapid thermal processing in these atmospheres sequentially is also acceptable.

Figure 15A:
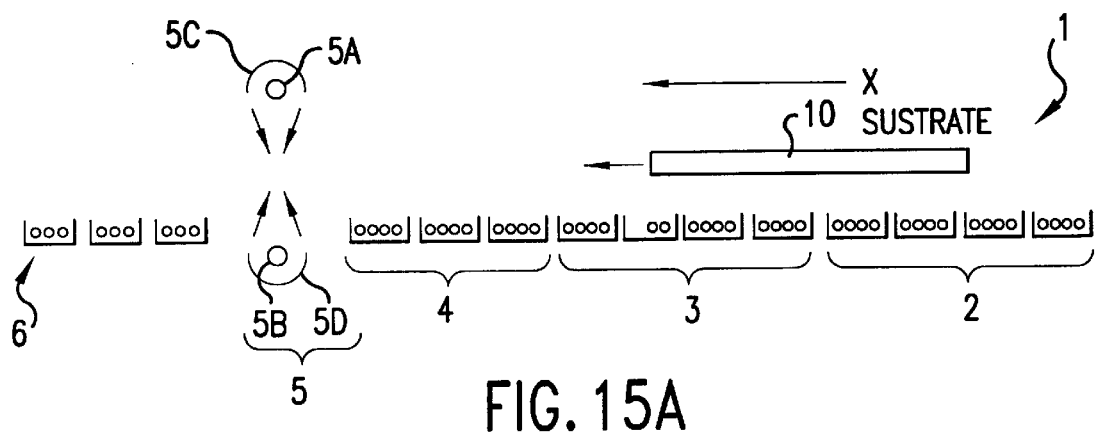
FIGS. 15(A)–15(C) are explanatory diagrams of another rapid thermal processing unit used in the rapid thermal processing step.
Figure 15B:
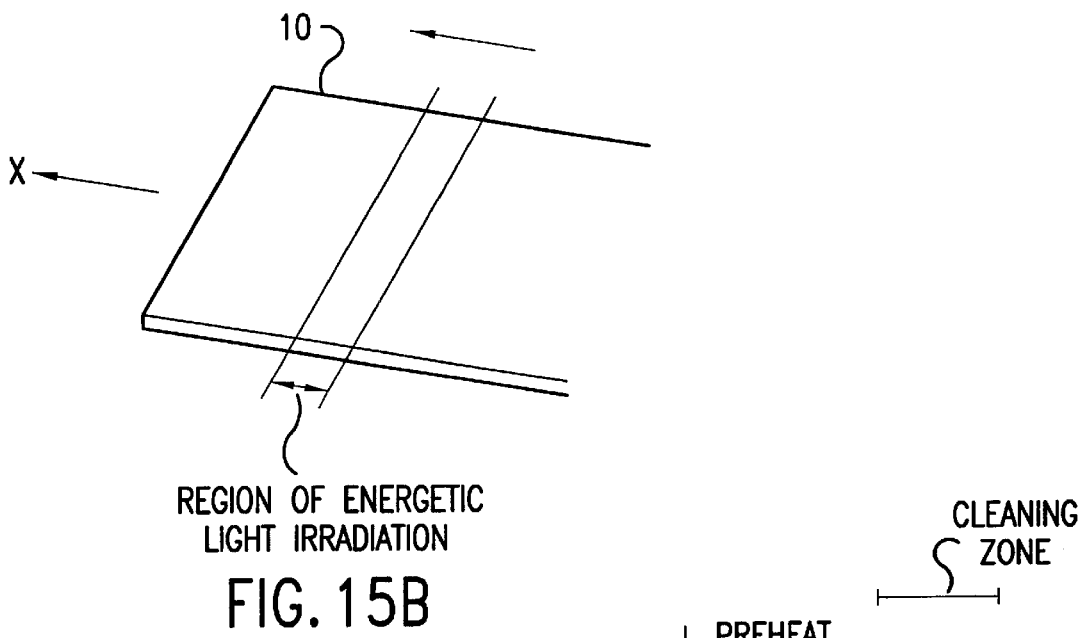
Figure 15C:
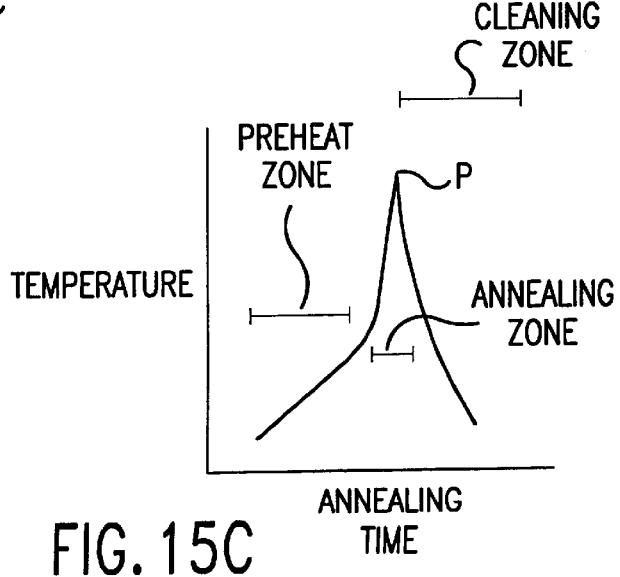

The rapid thermal processing in the second process step may also be done after removing substrate 10 from TFT fabrication unit 100 following completion of first gate insulator layer formation process ST16 and employing the rapid thermal processing unit shown in FIG. 15(A). Looking from the up-stream side to the down-stream side of the direction of substrate 10 transport (the direction of arrow X), this rapid thermal processing unit 1 is composed of first preheat zone 2, second preheat zone 3, third preheat zone 4, annealing zone 4, and cleaning zone 6. There are heaters in the first to third preheat zones 2 to 4. In annealing zone 5, arc lamps 5A and 5B and reflectors 5C and 5D are arranged in order to irradiate transported substrate 11 with energetic light. Here, as shown in FIG. 15 (B), because the energetic light irradiation area on substrate 10 has a fixed width, the rapid thermal processing time of substrate 10 is determined in accordance with the transport speed of substrate 10. As shown in FIG. 15(C), the temperature in the rapid thermal processing temperature profile rises rapidly in annealing zone 5, and the peak temperature P is attained near the exit of the annealing zone. Normally, the maximum temperature near the exit of annealing zone 5 is controlled as the annealing temperature.

(Third Process Step ST3C)

Figure 16A:
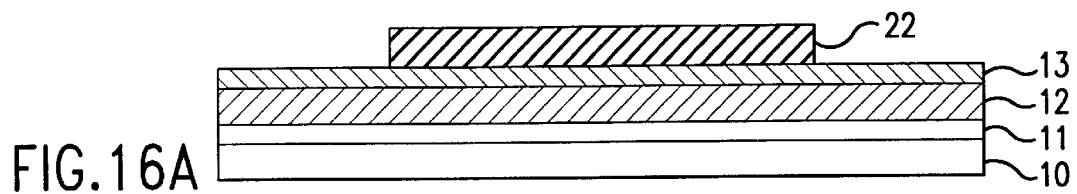
FIGS. 16(A)–16(F) are a cross-section process diagram showing process steps following the steps shown in FIGS. 14(A)–(F) for the TFT fabrication process of Example 1 of the present invention.
Figure 16B:
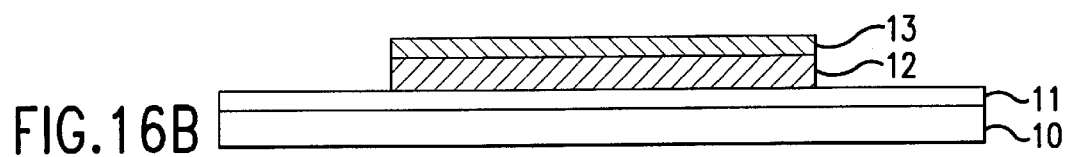

Next, as shown in FIG. 16(A), resist mask 22 with the prescribed mask pattern is formed on the surface of gate insulator layer 13. As shown in FIG. 16(B), first gate insulator layer 13 and semiconductor layer 12 are patterned using photolithography technology.

(Fourth Process Step ST4C)

Next, hydrogenation ST41 is carried out for semiconductor layer 12 and first gate insulator layer 13 by means such as hydrogen plasma irradiation using a plasma CVD reactor. Hydrogen plasma irradiation is done because hydrogen is liberated from semiconductor layer 12 and first gate insulator layer 13 during heating in the second process step ST2C (rapid thermal processing) leading to degradation. This type of hydrogenation usually requires two to five hours depending on the thickness of the gate insulator layer; but, because the layer thickness is 10 to 50 nm in the present example, hydrogenation from between approximately 30 seconds to 20 minutes is sufficient.

Figure 16C:
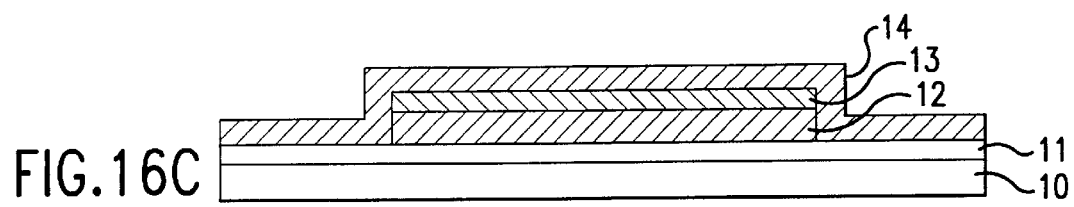

Next, as shown in FIG. 16(C), second gate insulator layer 14 consisting of a silicon oxide film is formed over the entire surface of substrate 10 by plasma CVD at a substrate temperature of between approximately 150° C. and 450° C. (second gate insulator formation process ST42). It is desirable to perform hydrogenation and second insulator layer formation continuously without exposing the substrate to atmosphere. As a result, second gate insulator layer 14 covers both the surface and sides of semiconductor layer 12; and it is possible to maintain the insulating properties at the edge regions. It is desirable to make second gate insulator layer 14 have excellent step coverage by using TEOS, for example. Of course, it is also acceptable to use a mixture of monosilane and nitrous oxide as the source gas for this purpose. While it is desirable to perform hydrogen plasma irradiation and second gate insulator layer 14 formation consecutively, it is also acceptable to perform them non-consecutively in different pieces of equipment.

(Process Steps Following the Fourth Process Step)

Figure 16D:
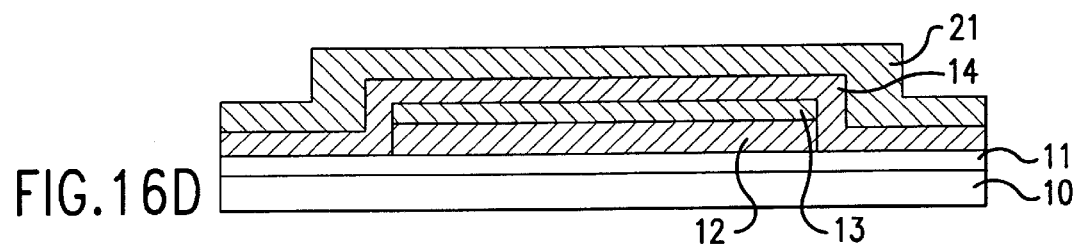
Figure 16E:
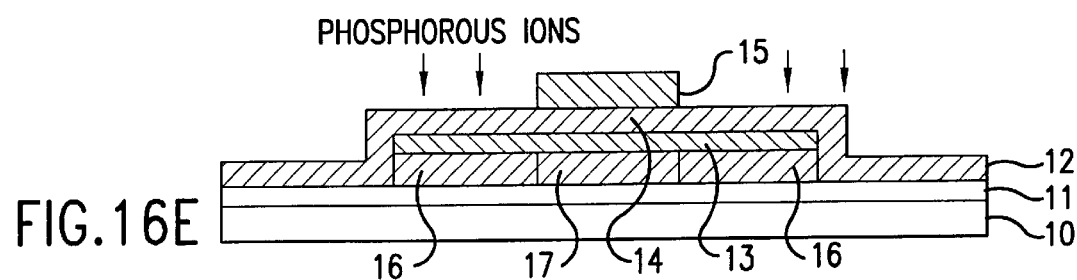

Subsequent process steps are all performed at temperatures of 350° C. or less. First, as shown in FIG. 16(D), conducting layer 21 consisting of a tantalum or other type of thin film is formed over the entire surface of substrate 10 by a means such as sputtering. It is also possible to form the tantalum thin film (conducting layer 21) by CVD or another method. Next, as shown in FIG. 16(E), conducting layer 21 is patterned using photolithography; and gate electrode 15 is formed on the surface of second gate insulator layer 14. Next, with gate electrode 15 as a mask, phosphorous ions (impurity ions), for example, are introduced into semiconductor layer 12. As a result, source and drain regions 16 are formed in a self-aligned manner in semiconductor layer 12 with respect to gate electrode 15, and the region in which impurity ions were not introduced becomes channel region 17. A bucket-type non-mass separating ion implanter (ion doping unit), for example, can be used for this impurity incorporation; and phosphine ($PH_3$) diluted by hydrogen to a concentration of approximately 5% can be used as a source gas. When producing a p-channel TFT, diborane ($B_2H_6$) diluted by hydrogen to a concentration of approximately 5% is good for a source gas.

Figure 16F:
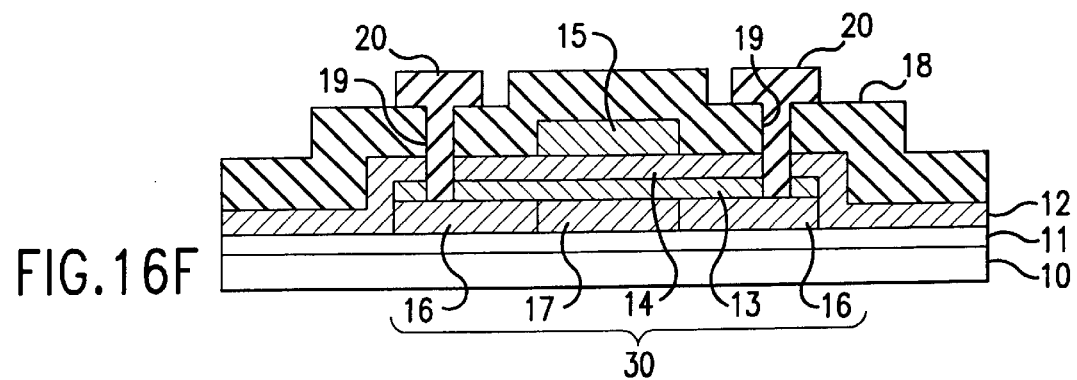

Next, as shown in FIG. 16(F), interlevel insulation film 18 consisting of silicon oxide is formed by a method such as plasma CVD. A mixture of TEOS and oxygen gas can be used for the source gas at this point as well. Next, activation of implanted phosphorous ions and improvement of interlevel insulation film 18 is performed through annealing in an oxygen atmosphere at 300° C. for approximately one hour. Next, following the formation of contact holes 19, source and drain electrodes 20 forming electrical contacts to source and drain regions 16 by way of contact holes 19 are formed. In such a fashion, TFT 30 is formed on the surface of substrate 10.

In this example as well as those to be explained below, when TFT 30 is formed to be used as a switching element in the active matrix of a liquid crystal display panel, gate electrode 15 is formed as one part of a scan line and one or the other of source and drain electrodes 20 is formed as a data line. The other electrode of source and drain electrodes 20 is formed as one part of a pixel electrode or an electrode which electrically connects to a pixel electrode. Further, in this example as well as those to be explained below, in one example, it is also acceptable to form among source and drain regions 16 a low concentration or offset region with respect to the edge of gate electrode 15.

Principle Effects of Example 1

In the fabrication process for the TFT of the present example, in the first process step ST1C, because substrate 10 is not exposed to atmosphere from the formation of underlevel protection layer 11 to the formation of first gate insulator layer 13, the surface of semiconductor layer 12 is not subjected to contamination from the surface of underlevel protection layer 11. Also, the surface of semiconductor layer 12 is not affected by dirty oxidation or contaminants. Additionally, because first gate insulator layer 13 is formed during the first process step ST1C prior to patterning of semiconductor layer 12 in the third process step, the surface of semiconductor layer 12 is not contaminated by resist. Consequently, the interface condition between channel region 17 and gate insulator layer 13 is good. Further, because hydrogenation ST14 and oxidation ST15 follow crystallization processing ST13, along with a good interface condition between channel region 17 and gate insulator layer 13, hydrogenation ST14 can be performed without the effects of a natural oxide. Because of this, it is possible to uniformly obtain a large effect from short-time hydrogen plasma processing, and the electrical conductivity of semiconductor layer 10 is stable. As a result, the electrical characteristics such as TFT on current and threshold voltage improve.

In the second process step ST2C, as a result of the rapid thermal processing of first gate insulator layer 13 and semiconductor layer 12, along with being able to obtain a good semiconductor layer 12, first gate insulator layer 13 densifies; and the reliability of TFT 30 fabricated using these processes is high. Because rapid thermal processing is done prior to patterning, the entire surface of substrate 10 can be processed uniformly.

In the fourth process step ST4C, as a result of hydrogenation ST41 of first gate insulator layer 13, it is possible to recover the degradation which results during the heating in the rapid thermal processing in the second process step ST2C. Further, as a result of the formation of first gate insulator layer 13 prior to patterning of semiconductor layer 12, although first gate insulator layer 13 does not remain on the side walls of semiconductor layer 12 following these patternings, the side walls of semiconductor layer 12 are covered by second gate insulator 14 because second gate insulator layer 14 having good step coverage is formed in the fourth process step ST4C prior to formation of gate electrode 15 which functions as conducting layer 21. Consequently, there are no shorts to other TFTs formed on the same substrate; and yield and reliability are high.

Because all processing steps following the fourth process step ST4C are performed at 350° C. or less, hydrogen contained within second gate insulator layer 14 is not liberated. If high temperature processing is performed following formation of second gate insulator layer 14, longtime re-hydrogenation of second gate insulator layer 14 is necessary. In the present example, because second gate insulator layer 14 is not exposed to high temperatures, hydrogen remains bonded in stable configurations and final hydrogenation is not necessary.

In this example, substrate 10 is removed from TFT fabrication unit 100 following formation of first gate insulator layer 13; and superior results are obtained. If the semiconductor surface has been stabilized, however, it is also possible to remove substrate 10 following completion of hydrogenation ST14 or oxidation ST15 shown in FIG. 14(D), pattern the semiconductor layer, and subsequently fabricate a TFT using process steps identical to process steps of the prior art. Although the MOS interface and gate insulator layer are inferior to those produced using the present invention when such a process is used, it is possible to produce TFTs with characteristics far superior to TFTs of the prior art while using the same number of process steps.

EXAMPLE 2

Among the individual process steps in this example, those which are in common with the first example have the same conditions and the details will be omitted. This example corresponds to the fabrication process explained with reference to FIG. 4.

(First Process Step ST1D)

Figure 17A:
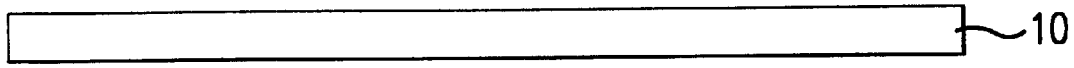
FIGS. 17(A)–17(E) are a cross-section process diagram of one portion of the TFT fabrication process of Example 2 of the present invention.
Figure 17B:
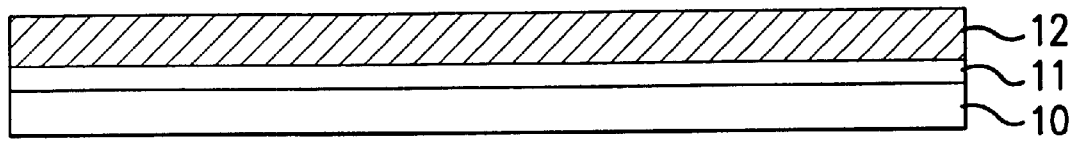

In this example, as shown in FIG. 17(A), a glass or other type of substrate 10 which has been cleaned by ultrasonic cleaning or other techniques is prepared. Substrate 10 is placed in oxidizing atmosphere chamber 140, which is at reduced pressure; and, as shown in FIG. 17(B), underlevel protection layer 11 consisting of a silicon oxide film is formed to a thickness of approximately 200 nm by plasma CVD over the entire surface of substrate 10 at a substrate temperature of between approximately 150° C. and 450° C. (underlevel protection layer formation process).

Next, substrate 10 is moved into reducing atmosphere chamber 120 without exposing it to atmosphere. Inside reducing atmosphere chamber 120 which is at a reduced pressure and contains argon gas, semiconductor layer 12 consisting of an amorphous silicon film is formed to a thickness of approximately 60 nm by plasma CVD over the entire surface of substrate 10 at a substrate temperature of between approximately 150° C. and 450° C. (semiconductor layer formation process ST12).

Figure 17C:
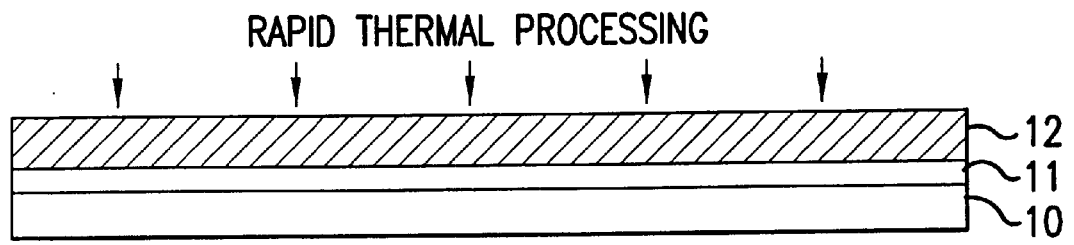

Next, substrate 10 is moved into crystallization chamber 130 without exposure to atmosphere. In crystallization chamber 130, as shown in FIG. 17(C), at least the surface layers of semiconductor layer 12 are crystallized through irradiation by high energy light (RTA light) from lamp L while either under vacuum (reduced pressure) or in a non-oxidizing atmosphere such as a hydrogen-containing atmosphere or a forming gas (a reducing atmosphere composed of less than about 10% hydrogen in argon) atmosphere at a pressure of 1 atmosphere or greater (crystallization process ST13/solid phase crystallization by rapid thermal annealing process ST132). Here, instead of solid phase crystallization by rapid thermal processing ST132, the crystallization of semiconductor layer 12 by means of melt crystallization ST131 through a method such as laser annealing either under vacuum or in a non-oxidizing atmosphere such as a hydrogen-containing atmosphere or a forming gas atmosphere at a pressure of 1 atmosphere or greater is also acceptable.

Figure 17D:
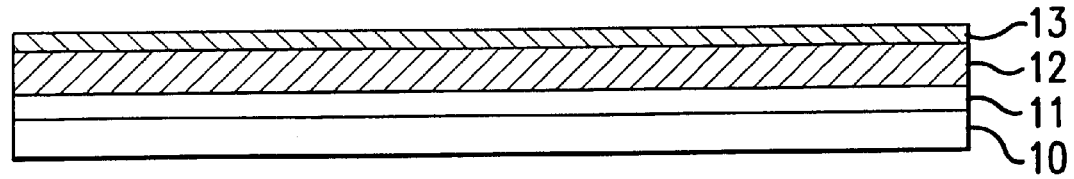

Next, substrate 10 is transferred into oxidizing atmosphere chamber 140 without exposure to atmosphere. In oxidizing atmosphere chamber 140, as shown in FIG. 17(D), substrate 10 is maintained at a reduced pressure, and first gate insulator layer 13 consisting of a silicon oxide film is formed to a thickness of between 10 and 50 run by plasma CVD over the entire surface of substrate 10 at a substrate temperature of between approximately 150° C. and 450° C. (first gate insulator layer formation process ST16). If hydrogenation by a means such as hydrogen plasma irradiation and oxidation by a means such as oxygen plasma irradiation are performed consecutively immediately prior to this first gate insulator layer formation, the transistor properties improve even further and the advisability of so doing is the same as that in Example 1.

(Second Process Step ST2D)

Figure 17E:
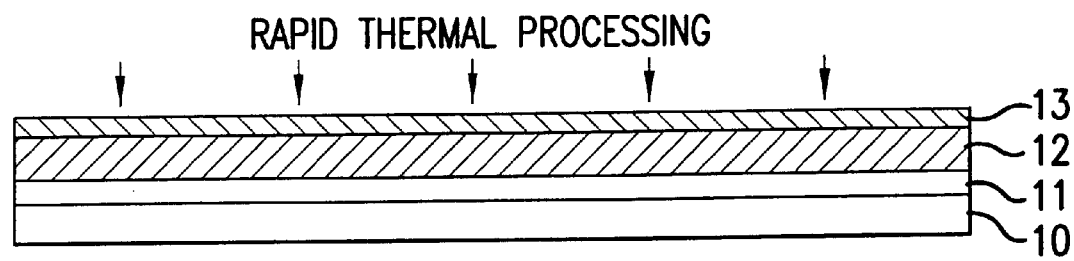

Next, as shown in FIG. 17(E), rapid thermal processing of semiconductor layer 12 and first gate insulator layer 13 is carried out. In this rapid thermal processing, although the crystallization of semiconductor layer 12 is local, it proceeds throughout the entire layer. Because only a portion of substrate 10 is heated for a time on the order of seconds in the rapid thermal processing, no strain or other problem is generated in substrate 10. During this process, first gate insulator layer 13 receives heat from underlying semiconductor layer 12, reaches a high temperature, and the film properties improve through densification. Also, because the rapid thermal processing occurs before patterning, rapidly thermal processing can occur uniformly. This rapid thermal processing can be done in a hydrogen-containing atmosphere, an oxygen-containing atmosphere, or a water vapor-containing atmosphere in crystallization chamber 130. Performing multiple rapid thermal processing in these atmospheres sequentially is also acceptable.

(Third Process Step ST3D)

Figure 18A:
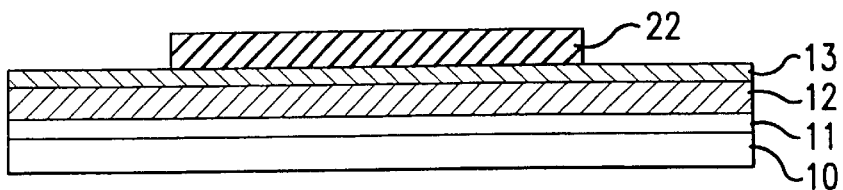
Figure 18B:
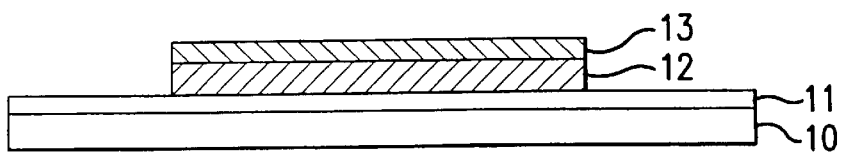

Next, as shown in FIG. 18(A), resist mask 22 with the prescribed mask pattern is formed on the surface of gate insulator layer 13. As shown in FIG. 18(B), first gate insulator layer 13 and semiconductor layer 12 are patterned using photolithography technology.

(Fourth Process Step ST4D)

Figure 18C:
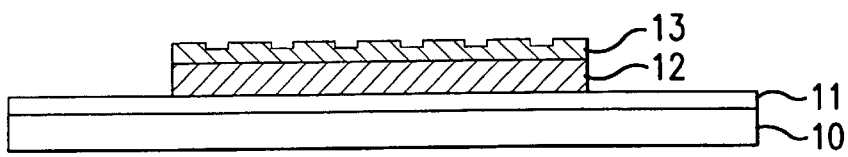

Next, as shown in FIG. 18(C), the surface of first gate insulator layer 13 is removed by dry etching under reduced pressure; and the surface of first gate insulator layer 13 is cleaned. In this step, etching of first gate insulator layer 13 by wet etching is also acceptable. Here, because only the surface of first gate insulator layer 13 is etched, there is no contamination of semiconductor layer 12 in the etching step. During dry etching, although it is acceptable to use the etching gases mentioned previously ($CF_4$, $NH_3$, $SF_6$, etc.), the components of these etching gases (C, N, S, F, etc.) are incorporated into the gate insulator layer and are a cause of degradation in the quality of the insulating layer. Consequently, it is desirable to perform dry etching in a vacuum of approximately 10 mTorr or less by means of high purity hydrogen or oxygen. By so doing, it is possible to produce a high purity gate insulator layer; and reduction of the insulator layer fixed charge and improvement of the withstand voltage can be easily accomplished.

(Fifth Process Step ST5D)

Figure 18D:
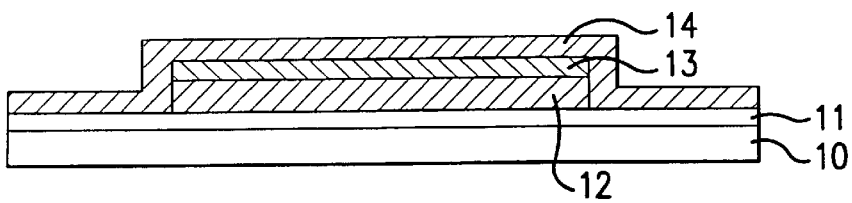

Immediately following the fourth process step ST4D, hydrogenation ST41 of first gate insulator layer 13 is achieved through hydrogen plasma irradiation of first gate insulator layer 13. Next, as shown in FIG. 18(D), second gate insulator layer 14 consisting of a silicon nitride film, for example, is formed over the entire surface of substrate 10 by plasma CVD at a substrate temperature of between approximately 150° C. and 450° C. (second gate insulator formation process ST42). As a result, second gate insulator layer 14 covers both the surface and sides of semiconductor layer 12; and it is possible to maintain the insulating properties at the edge regions. If second gate insulator layer 14 is made a nitride film, because the dielectric constant of the entire insulating layer is large, a high on current can be obtained. Using a silicon oxide layer formed using TEOS, for example, as the second gate insulator layer leads to excellent step coverages. As a result, the yield with respect to electrical shorts increases. When using dry etching for cleaning the first gate insulator layer, it is desirable to perform from this fourth process step to the formation of the second gate insulator layer consecutively without exposure to atmosphere. This is because mere exposure of the substrate to atmosphere following completion of cleaning of the first gate insulator layer will result in contamination of the surface of the first gate insulator layer.

(Process Steps Following the Fifth Process Step)

Figure 18E:
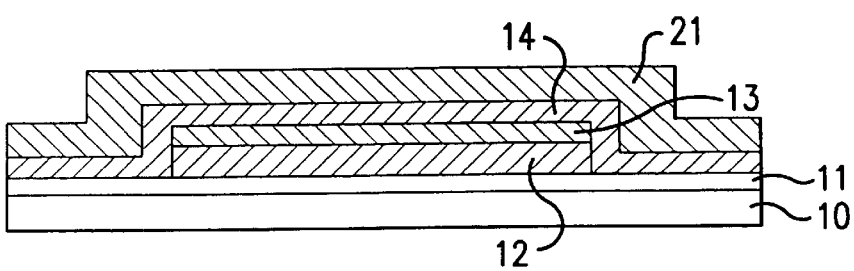
Figure 18F:
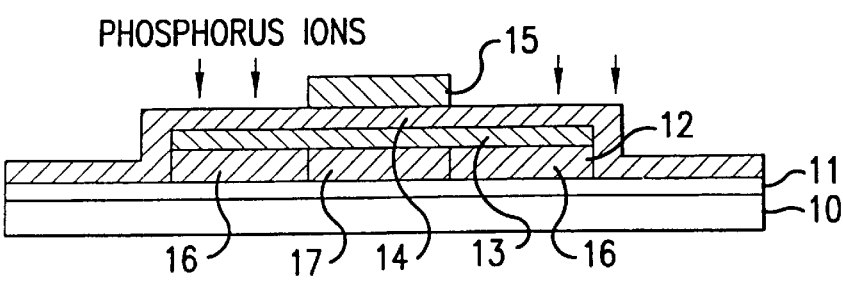
Figure 18G:
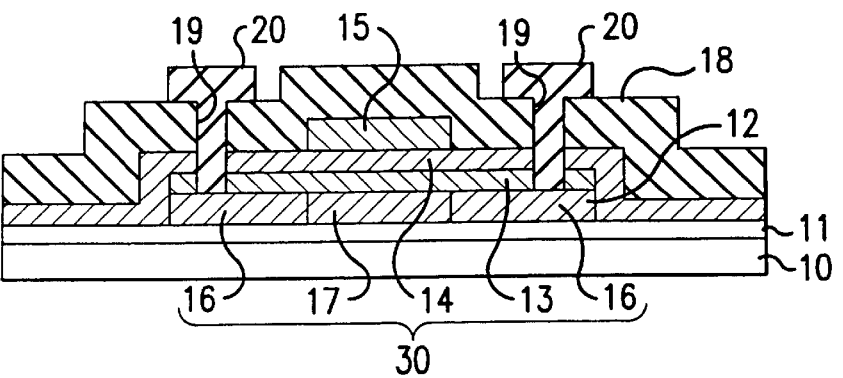

Subsequent processing steps, as shown in FIG. 18(E) to (G) are the same as in Example 1 and the detailed explanations will be omitted.

The Principle Effects of Example 2

In the fabrication process for the TFT of the present example, in the first process step ST1D, because substrate 10 is not exposed to atmosphere from the formation of under-level protection layer 11 to the formation of first gate insulator layer 13, the surface of semiconductor layer 12 is not subjected to contamination from the surface of under-level protection layer 11. Also, the surface of semiconductor layer 12 is not affected by dirty oxidation or contaminants. Additionally, because first gate insulator layer 13 is formed during the first process step ST1D prior to patterning of semiconductor layer 12 in the third process step ST3D, the surface of semiconductor layer 12 is not contaminated by resist. Consequently, the interface condition between channel region 17 and gate insulator layer 13 is good; and the effects are essentially equivalent to those found for Example 1.

Although the surface of first gate insulator layer 13 is contaminated by resist mask 22 used during the patterning of semiconductor layer 12 by photolithography as shown in FIG. 18(A), because the surface of first gate insulator layer 13 is removed and cleaned under vacuum in the fourth process step ST4D as shown in FIG. 18(C), the electrical characteristics of the TFT are stable. Additionally, because only the surface of first gate insulator layer 13 is etched during the cleaning of the surface of gate insulator layer 13, semiconductor layer 12 is not exposed to atmosphere during this time as well. Consequently, it is possible to absolutely avoid contamination of the surface of semiconductor layer 12, and the electrical characteristics of the TFT are stable.

EXAMPLE 3

Although in Examples 1 and 2, it was assumed that the low temperature process is used throughout, this example differs from Examples 1 and 2 in that thermal oxidation (high temperature process) is used to form second gate insulator layer 14. Because the fundamental process steps in the fabrication process of this example are partially in common with those of Example 2, however, the common process steps will be explained with reference to FIG. 17. This example corresponds to the fabrication process explained with reference to FIG. 6.

(First Process Step ST1F)

In this example as well, as shown in FIG. 17(A), a glass or other type of substrate 10 is placed in oxidizing atmosphere chamber 140, which is at reduced pressure. Next, as shown in FIG. 17(B), underlevel protection layer 11 consisting of a silicon oxide film is formed by plasma CVD over the entire surface of substrate 10 at a substrate temperature of between approximately 150° C. and 450° C. (underlevel protection layer formation process).

Next, substrate 10 is moved into reducing atmosphere chamber 120 without exposing it to atmosphere. Inside reducing atmosphere chamber 120 which is at a reduced pressure and contains argon and silane, semiconductor layer 12 consisting of an amorphous silicon film is formed by plasma CVD at a substrate temperature of between approximately 150° C. and 450° C. (semiconductor layer formation process ST12). Next, substrate 10 is transferred into crystallization chamber 130 without exposure to atmosphere. As shown in FIG. 17(C), at least the surface layers of semiconductor layer 12 are crystallized through irradiation by high energy light from lamp L or laser light while either under vacuum (reduced pressure) or in a non-oxidizing atmosphere such as a hydrogen-containing atmosphere or a forming gas atmosphere at a pressure of 1 atmosphere or greater (crystallization process ST13/melt crystallization such as by laser annealing ST131 or solid phase crystallization by rapid thermal annealing process ST132). Next, substrate 10 is transferred into oxidizing atmosphere chamber 140 without exposure to atmosphere. In oxidizing atmosphere chamber 140, as shown in FIG. 17(D), substrate 10 is maintained at a reduced pressure, and first gate insulator layer 13 consisting of a silicon oxide film is formed by plasma CVD (first gate insulator layer formation process ST16). The advisability of consecutively performing hydrogenation and oxidation immediately prior to this first gate insulator layer formation is the same as discussed previously.

(Second Process Step ST2F)

Next, as shown in FIG. 17(E), rapid thermal processing of semiconductor layer 12 and first gate insulator layer 13 is carried out. This process step may be carried out consecutively with the first process step (substrate not exposed to atmosphere) or non-consecutively (substrate exposed to atmosphere). If they are performed consecutively, atmospheric contaminants are kept to a minimum. On the other hand, if they are not performed consecutively, it is possible to use a conventional annealing furnace for the second process step which is helpful in reducing costs.

(Third Process Step ST3F)

Figure 19A:
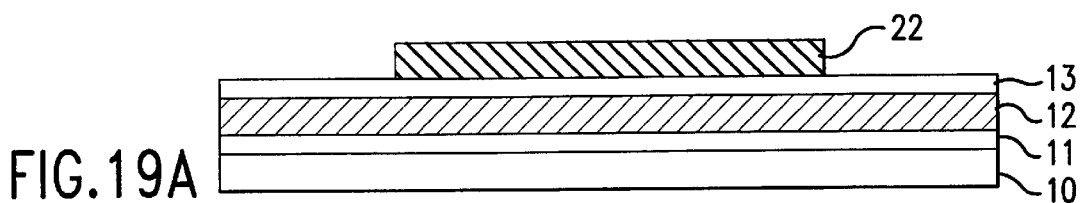
FIGS. 19(A)–19(F) are a cross-section process diagram of one portion of the TFT fabrication process of Example 3 of the present invention.
Figure 19B:
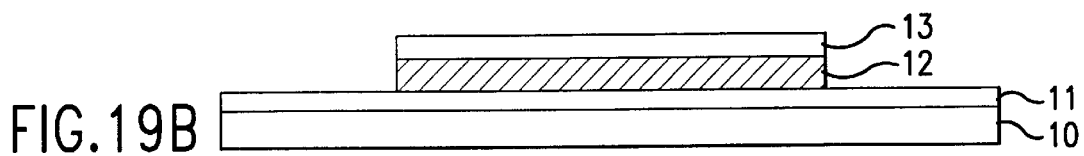

Next, as shown in FIG. 19(A), resist mask 22 with the prescribed mask pattern is formed on the surface of gate insulator layer 13. As shown in FIG. 19(B), first gate insulator layer 13 and semiconductor layer 12 are patterned using photolithography technology.

(Fourth Process Step ST4F)

Figure 19C:
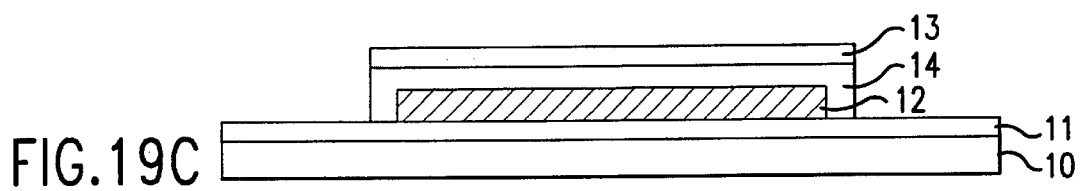

Next, as shown in FIG. 19(C), second gate insulator layer 14 consisting of silicon oxide is formed on the surface (between first gate insulator layer 13 and semiconductor layer 12) and side walls of semiconductor layer 12 by thermal oxidation in an oxidizing environment. As a result, second gate insulator layer 14 covers both the surface and sides of semiconductor layer 12; and it is possible to maintain the insulating properties at the edge regions. Immediately prior to second gate insulator layer formation, it is desirable to clean and etch the surface of the first gate insulator layer, contaminated during the third process step, using a solution of aqueous hydrofluoric acid, for example.

(Process Steps Following the Fourth Process Step)

Figure 19D:
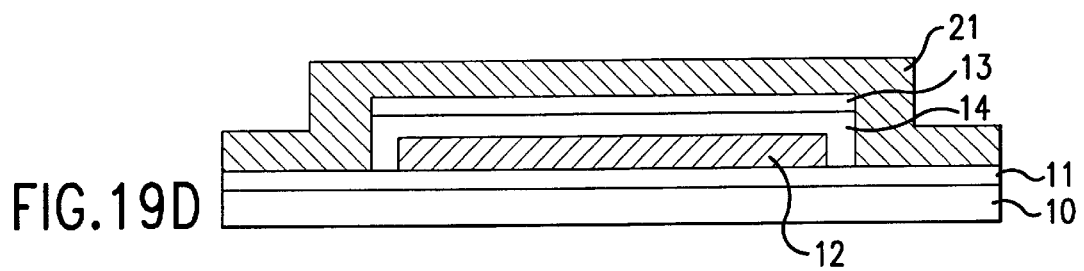
Figure 19E:
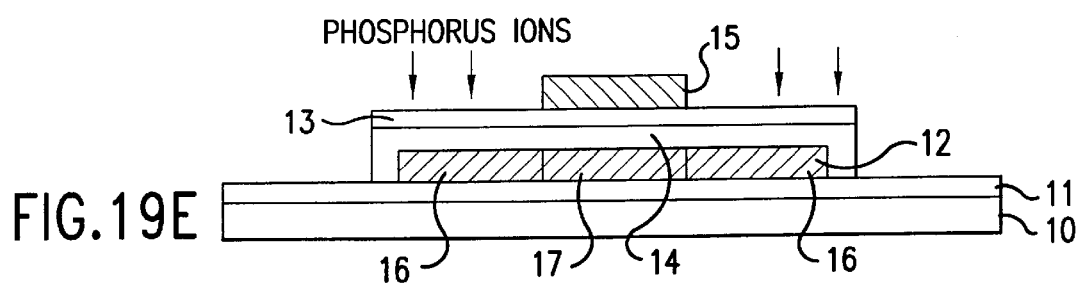
Figure 19F:
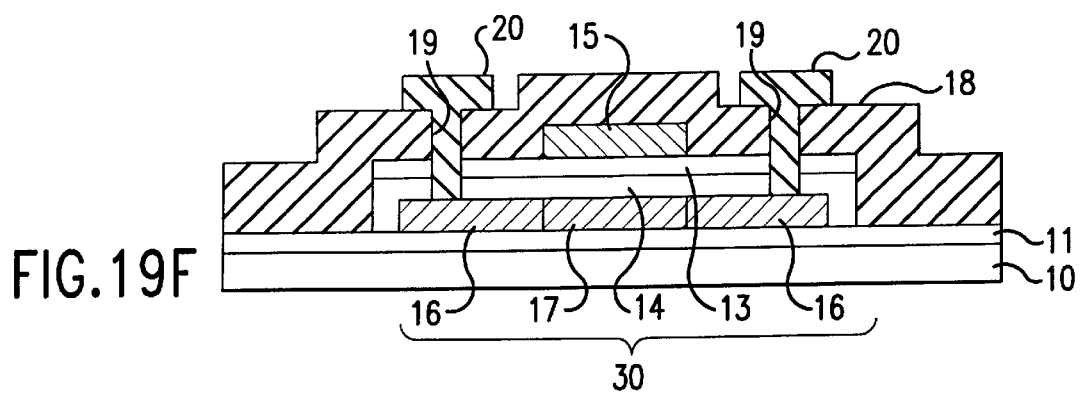

Subsequent processing steps, as shown in FIGS. 19(D) to (F) are the same as in Example 1; and the detailed explanations will be omitted.

The Principle Effects of Example 3

In the first process step ST1F of this fabrication process which uses the high temperature process, as was the case in Examples 1 and 2, substrate 10 is not exposed to atmosphere from formation of underlevel protection layer 11 to formation of first gate insulator layer 13. As a result, the surface of semiconductor layer 12 and the side surface of the underlevel protection layer are not subjected to contamination. In the second gate insulator layer process step, oxygen or other oxide material diffuses through the gate insulator layer; and an oxide is formed on the surface of the semiconductor layer. Consequently, if the interface between semiconductor layer 12 and first gate insulator layer 13 is contaminated, the interface between second gate insulator layer 14 and first gate insulator layer 13 will be contaminated following thermal oxidation. The result is a low quality gate insulator layer. In contrast, in the present invention, because the interface between semiconductor layer 12 and first gate insulator layer 13 is cleaned, a high quality gate insulator layer is obtained even following thermal oxidation. Additionally, the formation of a normal gate insulator layer requires a long time. In the present example, however, because the first gate insulator layer is formed by CVD or other method, it is possible to decrease the time to form the gate insulator layer. This is especially effective in lowering the temperature of the high temperature process (for example, bringing the maximum process temperature to under approximately 1000° C.). In the past, when reduction of the temperature of the high temperature process has been attempted, the semiconductor quality has been degraded and non-exceptional TFT characteristics have resulted. In the present example, however, because a high quality semiconductor layer has been produced in the first process step, it is possible to produce TFTs having exceptional characteristics even when lowering the maximum processing temperature to below approximately 1000° C. In that sense, it can be said that the present invention is optimum especially for a high temperature process in which the maximum processing temperature is less than about 1000° C.

In the fourth process step ST4F, because annealing is performed during the formation of an oxide layer which acts as second gate insulator layer 14 on the surface of the semiconductor layer, the stress in semiconductor layer 12 is released. As a result, it is possible to obtain an excellent semiconductor layer 12. Simultaneously, first gate insulator layer 13 is also heated improving its quality through densification such that TFTs produced using such a process have high reliability. Also, because the second gate insulator layer is formed after patterning of first gate insulator layer 13 and semiconductor layer 12 and covers the side walls of the semiconductor layer, shorts do not occur. Consequently, yield and reliability are high in the present example. cl Examples of Other TFT Fabrication Equipment (Fabrication in Other Multichamber TFT Fabrication Equipment)

Although all of the examples above have been explained with reference to the TFT fabrication unit shown in FIGS. 9 to 11, the TFT fabrication unit (vacuum unit) shown in FIG. 20 may also be used.

Figure 20:
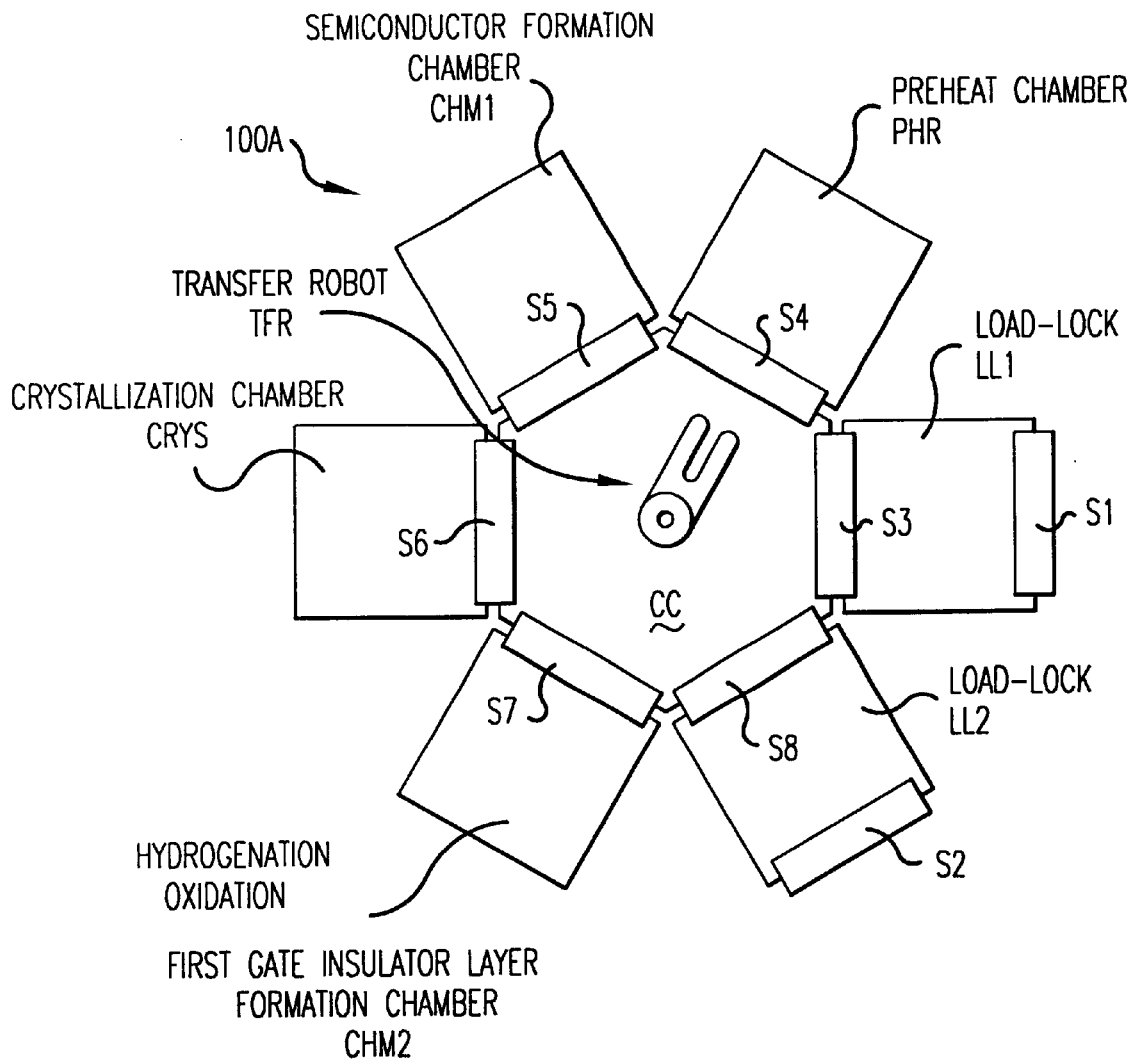
FIG. 20 is a schematic diagram showing one typical example of another TFT fabrication unit aside from the unit shown in FIG. 9.

FIG. 20 is a schematic diagram of a TFT fabrication unit which can be used to accomplish the present invention. As can be seen from this figure, in TFT fabrication unit 100A, transfer chamber CC containing transfer robot TFR is surrounded in order by the following components: first load-lock chamber LL1; preheat chamber PHR; semiconductor deposition chamber CHM1 in which semiconductor layers are formed by CVD or PVD; crystallization chamber CRYS in which crystallization by means such as laser annealing, RTA, and ion bombardment is performed; processing chamber CHM2 in which silicon oxide films (first gate insulator layer) are formed as well as in which hydrogenation and oxidation are performed; and second load-lock chamber LL2. These processing chambers are connected to transfer chamber CC through shutters, S3, S4, S5, S6, S7, and S8. First load-lock chamber LL1 and second load-lock chamber LL2 are equipped with shutters S1 and S2, respectively, for substrate introduction and substrate removal.

The process steps for Example 1 shown in FIG. 14(B) through FIG. 14(E) will be explained for the case in which they are performed using TFT fabrication unit 100A configured as described above.

First, 20 substrates, sub1 to sub20 (substrate 10), are loaded into first load-lock chamber LL1. Next, transfer robot TFR loads substrates sub1 to sub20 into preheat chamber PHR which is set at about 425° C. After confirming that substrates sub1 to sub20 have been accommodated in preheat chamber PHR for an interval of 20 minutes or longer, transfer robot TFR transfers the first substrate, sub1, out of the 20 substrates sub1 to sub20, from the preheat chamber into semiconductor deposition chamber CHM1.

Semiconductor deposition chamber CHM1 consists of a PECVD reactor, with a susceptor temperature set at approximately 400° C., for forming the underlevel protection layer and amorphous silicon film (semiconductor layer) on the surface of the substrate. Prior to the beginning of deposition on substrate sub1 which has been transferred into semiconductor deposition chamber CHM1, the following conditions are established with the aim of stabilizing the layer deposition.

| | |
|---|---|
| Nitrous oxide gas flow rate = | 7000 SCCM |
| Monosilane gas flow rate = | 250 SCCM |
| Pressure = | 1.5 Torr |
| Substrate spacing = | 24 mm |

-continued

| | |
|---|---|
| RF power = | 0 W (plasma not excited) |
| Time = | 30 seconds. |

Next, underlevel protection layer 11 consisting of a silicon oxide film is formed on the surface of substrate sub1 in semiconductor deposition chamber CHM1 (refer to FIG. 14(B)). This deposition step is done under the following conditions:

| | |
|---|---|
| Nitrous oxide gas flow rate = | 7000 SCCM |
| Monosilane gas flow rate = | 250 SCCM |
| Pressure = | 1.5 Torr |
| Substrate spacing = | 24 mm |
| RF power = | 900 W |
| Time = | 60 seconds. |

As a result, underlevel protection layer 11 consisting of a silicon oxide film 2400 angstroms thick is formed on the surface of substrate sub1. Next, in order to switch the deposition conditions of semiconductor deposition chamber CHM1, substrate sub1 sits in semiconductor deposition chamber CHM1 under the following conditions:

| | |
|---|---|
| Argon gas flow rate = | 6500 SCCM |
| Monosilane gas flow rate = | 75 SCCM |
| Pressure = | 2.25 Torr |
| Substrate spacing = | 24 mm |
| RF power = | 0 W (plasma not excited) |
| Time = | 30 seconds. |

Next, semiconductor layer 12 consisting of an amorphous silicon film is formed on the surface of substrate sub1 in semiconductor deposition chamber CHM1 (refer to FIG. 14(B)). This deposition step is done under the following conditions:

| | |
|---|---|
| Argon gas flow rate = | 6500 SCCM |
| Monosilane gas flow rate = | 75 SCCM |
| Pressure = | 2.25 Torr |
| Substrate spacing = | 24 mm |
| RF power = | 600 W (plasma not excited) |
| Time = | 280 seconds. |

Next, transfer robot TFR transfers the first substrate sub1 from semiconductor deposition chamber CHM1 in crystallization chamber CRYS and transfers the second substrate sub2 from preheat chamber PHR into semiconductor deposition chamber CHM1.

In crystallization chamber CRYS, laser annealing of the first substrate transferred, sub1, is performed under the following conditions; and semiconductor layer 12 is crystallized (refer to FIG. 14(C)):

| | |
|---|---|
| Susceptor temperature = | 400° C. |
| Hydrogen gas flow rate = | 100 SCCM |
| Pressure = | 3.0 Torr |
| Laser = | KrF (248 nm) line beam |
| Laser beam half width = | 100 μm |
| Laser peak energy density = | 220 mJ · cm$^{-2}$ |
| Laser irradiation condition = | 95% overlap (5 μm/shot) |

| | |
|---|---|
| Oscillation frequency = | 200 Hz |
| Time = | 400 seconds. |

During this time, a silicon oxide film (underlevel protection layer 11) and amorphous silicon film (semiconductor layer 12) are deposited on the second substrate, sub2, which has been transferred into semiconductor deposition chamber CHM1, under the conditions mentioned above.

Next, transfer robot TFR transfers the first substrate sub1 from crystallization chamber CRYS into second processing chamber CHM2 and transfers the second substrate sub1 from semiconductor deposition chamber CHM1 into crystallization chamber CRYS. Additionally, transfer robot TFR transfers the third substrate sub3 from preheat chamber PHR into semiconductor deposition chamber CHM1.

First substrate sub1 which has been transferred into processing chamber CHM2 is hydrogenated under the following conditions (refer to FIG. 14(D)):

| | |
|---|---|
| Susceptor temperature = | 400° C. |
| Hydrogen gas flow rate = | 1400 SCCM |
| Pressure = | 190 mTorr |
| Substrate spacing = | 12 mm |
| RF power = | 100 W (0.0478 W/cm²) |
| Time = | 180 seconds. |

Next, in order to switch the processing conditions of processing chamber CHM2, substrate sub1 sits in processing chamber CHM2 under the following conditions:

| | |
|---|---|
| Oxygen gas flow rate = | 3000 SCCM |
| Pressure = | 1 Torr |
| Substrate spacing = | 12 mm |
| RF power = | 0 W (plasma not excited) |
| Time = | 30 seconds. |

Next, first substrate sub is oxidized in processing chamber CHM2 under the following conditions (refer to FIG. 14(D)):

| | |
|---|---|
| Susceptor temperature = | 400° C. |
| Oxygen gas flow rate = | 3000 SCCM |
| Pressure = | 1 Torr |
| Substrate spacing = | 12 mm |
| RF power = | 900 W (0.430 W/cm²) |
| Time = | 30 seconds. |

Next, in order to switch the processing conditions of processing chamber CHM2, the following conditions are attained in processing chamber CHM2:

| | |
|---|---|
| TEOS flow rate = | 60 SCCM |
| oxygen gas flow rate = | 1500 SCCM |
| Pressure = | 650 mTorr |
| Substrate spacing = | 12 mm |
| RF power = | 0 W (plasma not excited) |
| Time = | 30 seconds. |

Next, first gate insulator layer 13 consisting of a silicon oxide film is formed on the surface of substrate sub1 in processing chamber CHM2 (refer to FIG. 14(E)). This step is performed under the following conditions:

| | |
|---|---|
| TEOS flow rate = | 60 SCCM |
| oxygen gas flow rate = | 1500 SCCM |
| Pressure = | 650 mTorr |
| Substrate spacing = | 12 mm |
| RF power = | 900 W (0.430 W/cm²) |
| Time = | 120 seconds. |

In this fashion, in processing chamber CHM2, semiconductor layer 12 formed on substrate sub1 is subjected to hydrogenation and oxidation; and first gate insulator layer 13 is deposited. The time needed during this interval is 390 seconds. During this time, a silicon oxide film (underlevel protection layer 11) and amorphous silicon film (semiconductor layer 12) are deposited on the third substrate, sub3, transferred into semiconductor deposition chamber CHM1 under the conditions mentioned above. Additionally, semiconductor layer 12 of the second substrate, sub2, transferred into crystallization chamber CRYS is crystallized by laser irradiation under the conditions described previously.

Following this, by repeating these steps, each substrate of sub1 to sub20 is processed sequentially; and substrates which have been transferred to second load-lock chamber LL2 are sequentially removed for subsequent processing.

(Fabrication in Yet Another TFT Fabrication Unit)

Figure 21A:
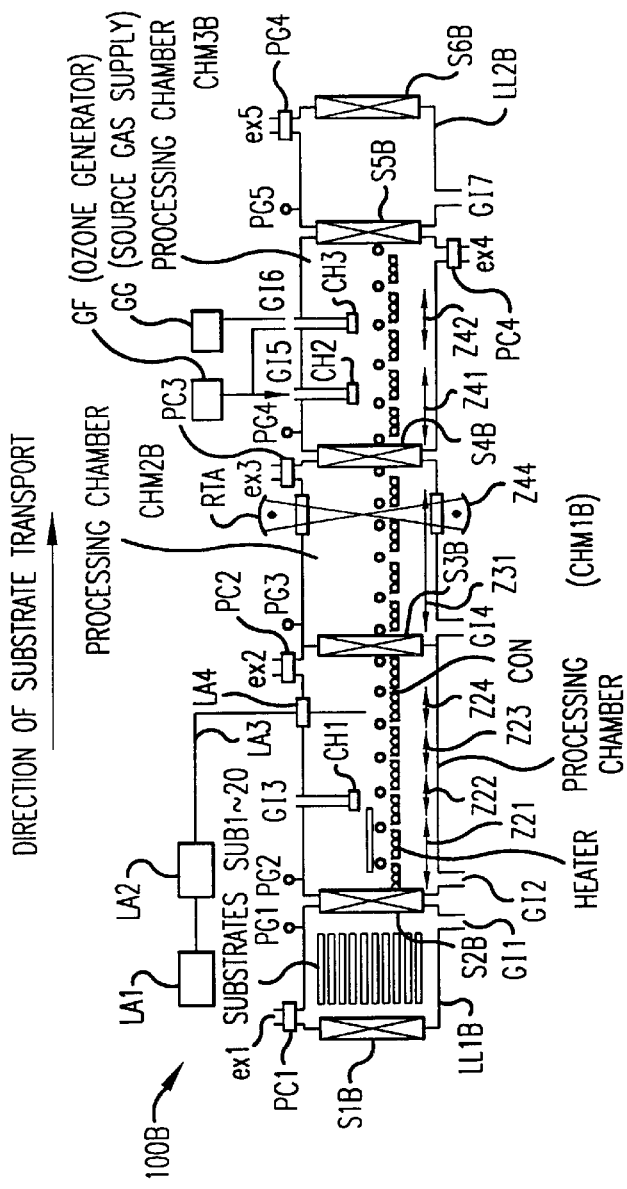
FIGS. 21(A)–21(C) are a schematic diagram showing one typical example of another TFT fabrication unit aside from the unit shown in FIG. 9.
Figure 21C:
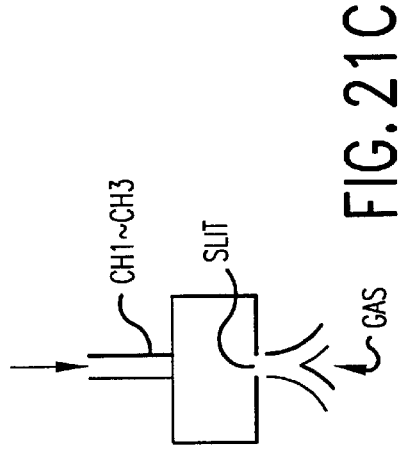
Figure 21B:
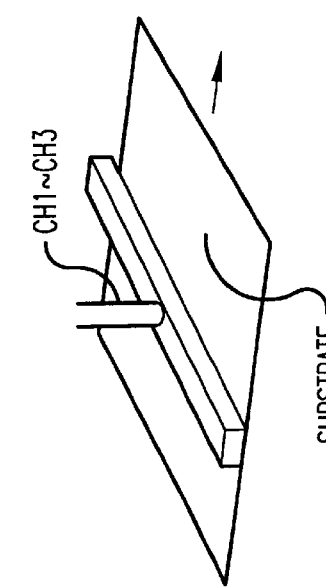

FIG. 21 is a schematic diagram of a TFT fabrication unit (atmospheric pressure unit) which can be used to accomplish the present invention. As can be seen from this figure, viewing in the direction of substrate movement from up stream side to down stream side, TFT fabrication unit 100B is composed, in order, of first load-lock chamber LL1B, first processing chamber CHM1B, second processing chamber CHMB2, third processing chamber CHM3B, and second load-lock chamber LL2B. In between these processing chambers are shutters S2B, S3B, S4B, and S5B. Substrate transport unit CON which uses a rolling conveyor exists in first processing chamber CHM1B, second processing chamber CHM2B, and third processing chamber CHM3B. Exhaust ports ex1 to ex5 are connected to the various process chambers. The pressure inside the processing chambers can be controlled by pressure control units PC1 to PC5 which control the amount of exhaust gases from ex1 to ex5. Additionally, the pressure inside the various process chambers can be monitored by the first through fifth pressure gauges PG1 to PG5.

Substrate introduction shutter S1B and first gas introduction port G11 are connected to first load-lock chamber LL1B.

First processing chamber CHM1B consists of approximately 180 cm long preheat zone Z21, film deposition zone Z22, postheat zone Z23, and crystallization zone Z24 with each zone equipped with a heater. Within first processing chamber CHM1B, second gas introduction port GI2 and third gas introduction port GI3 are connected to preheat zone Z21 and deposition zone Z22, respectively. First deposition head CH1 is connected to third gas introduction port GI3. Postheat zone Z24 is equipped with laser oscillator LA1, optical system LA2, laser beam path LA3, and laser introduction window LA4 which allow laser irradiation of substrates which pass under window LA4.

Second processing chamber CHM2B consists of hydrogenation zone Z31. At the end of hydrogenation zone 31, substrates which pass through can be irradiated with light from an RTA lamp via light introduction window Z44. Fourth gas introduction port GI4 is connected to the beginning stage of hydrogenation zone Z31 within second processing chamber CHM2B.

Third processing chamber CHM3B consists of oxidation zone Z41 and oxide layer formation zone Z42. Inside fourth processing chamber CHM4B, ozone generator GF and fifth gas introduction port GI5 are connected in series to oxidation zone Z41. Second deposition head CH2 is connected to fifth gas introduction port GI5. Also, ozone generator GF and source gas supply unit GG are connected in series to sixth gas introduction port GI6 which is connected to oxide layer formation zone Z42. Third deposition head CH3 is connected to sixth gas introduction port GI6.

Shutter S6B is located at the substrate exit port of second load-lock LL2B; and seventh gas introduction port GI7 is also connected to second load-lock LL2B.

The process steps for Example 1 shown in FIG. 14(B) through FIG. 14(E) (except for underlevel protection layer formation) will be explained for the case in which they are performed using TFT fabrication unit 100B configured as described above.

First, shutter S1B is opened and 20 substrates, sub1 through sub20, are inserted into first load-lock chamber LL1B. Next, shutter S1B is closed and a gas mixture of argon and hydrogen (approximately 3% hydrogen) is introduced into first load-lock chamber LL1B through gas introduction port GI1. The pressure inside first load-lock chamber LL1B is set to the desired value between approximately 1 and 5 atm using pressure control unit PC1. When the partial pressure of oxygen in first load-lock chamber LL1B is less than about 0.5 Torr, and after the processing pressure in first through third processing chambers CHM1B to CHM3B is controlled by pressure control unit PC1 to be between approximately 1 and 5 atm, shutter S2B is opened and first substrate sub1 is introduced into processing chamber CHM1B.

In processing chamber CHM1B, substrate sub1 is heated to about 400° C. by the heater. Substrate sub1 is transported by substrate conveyor CON at a speed of approximately 1 cm/sec. The length of preheat zone Z21 is more than about 180 cm such that substrate sub1 is heated for more that about 3 minutes. When substrate sub1 reaches the spot directly beneath first deposition head CH1 (deposition zone Z22), semiconductor layer 12 consisting of an amorphous silicon film is formed (refer to FIG. 14(B)) through the pyrolitic decomposition of trisilane, which is introduced through third gas introduction port GI3 at approximately 500 SCCM and directed toward substrate sub1 from the slit (refer to FIG. 20(B) and (C)) of first deposition head CH1. The pyrolitic decomposition of trisilane is given by

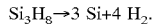

$Si_3H_8 \rightarrow 3\ Si + 4\ H_2$.

At this time, an argon/monosilane mixture (approximately 0.1% monosilane) is introduced through second gas introduction port GI2. Because second gas introduction port GI2 is on the side of shutter S2B, all the gases generated from deposition head CH1 such as hydrogen and unreacted trisilane flow in the direction of substrate transport from up stream to down stream inside first processing chamber CHM1B. Here, the distance between deposition head CH1 and substrate sub1 is held between approximately 1 mm and 5 mm; and the width of the slit is between about 0.5 mm and 2 mm. Substrate sub1 which has had semiconductor layer 12 formed on it is then transported into heating zone Z23; and, after annealing for about 1 minute, is then transferred into crystallization zone Z24. In crystallization zone Z24, substrate sub1 which has been heated to about 400° C. is laser irradiated (refer to FIG. 14(C)). At this point, because gases such as argon/monosilane, trisilane, and hydrogen flow in the direction of substrate transport from up stream to down stream inside first processing chamber CHM1B, the crystallization is performed in an argon-containing reducing atmosphere.

After crystallization is complete, shutter S3B is opened and substrate sub1 is transported into second processing chamber CHM2B. In second processing chamber CHM2B, a mixture of hydrogen and argon gas is introduced through fourth gas introduction port GI4; and, along with the production of a hydrogen atmosphere (total pressure of around 1 atm to 5 atm with a hydrogen partial pressure of approximately 0.03 atm to 3 atm), heating by the heater to about 350° C. takes place. In second processing chamber CHM2B, semiconductor layer 12 formed on substrate sub1 is irradiated with light from an RTA lamp for approximately 1 second; and the maximum temperature of the substrate surface reaches between roughly 600° C. and 900° C. Here, hydrogenation and annealing occur together (refer to FIG. 14(D)).

After the completion of hydrogenation and prior to the opening of shutter S4B, at least one of second processing chamber CHM2B and third processing chamber CHM3B is filled with an inert gas atmosphere. Ideally, after the hydrogen partial pressure in second processing chamber CHM2B is less than 0.1 atm and the oxygen partial pressure of third processing chamber CHM3B is less than 0.1 atm, shutter S4B is opened and substrate sub1 is transported into third processing chamber CHM3B.

In oxidation zone Z41 of third processing chamber CHM3B, oxygen containing from approximately 1 to 10% ozone flows from second deposition head CH2; and semiconductor layer 12 formed on the surface of substrate sub1 is oxidized (oxidation process/refer to FIG. 14(D)). Next, in oxide layer formation zone Z42 of third processing chamber CHM3B, a gas mixture of TEOS, ozone, and oxygen flows from third deposition head CH3 (total pressure between about 1 and 5 atm, TEOS flow rate=100 SCCM, oxygen containing 5% ozone flow rate=5 SLM) and first gate insulator layer 13 is formed (refer to FIG. 14(E)).

Following formation of first gate insulator layer 13, substrate sub1 is transferred into second load-lock chamber LL2B. Processing of substrates sub2 through sub20 proceeds in the same sequence as above but with the timing such that adjacent shutters do not open at the same time. When all 20 substrates sub1 through sub20 are transferred into second load-lock chamber LL2B, shutter S6B is opened after confirming that shutter S5B is closed; and substrates sub1 through sub20 are removed from second load-lock chamber LL2B.

EXAMPLE 4

Although in each of the examples above, gate insulator layer 13 and semiconductor layer 12 are thermally processed following formation of gate insulator layer 13, as shown in the example below, because it is even possible to form a high quality semiconductor layer 12 by not exposing substrate 10 to atmosphere between formation of semiconductor layer 12 and first gate insulator layer 13 and hydrogenating or oxidizing semiconductor layer 12, high reliability TFTs with high yield can be fabricated.

(Schematic Outline of TFT Fabrication Unit)

A schematic outline of the multichamber TFT fabrication unit which employs the TFT fabrication procedure in the present example will be explained with reference to FIG. 22.

Figure 22:
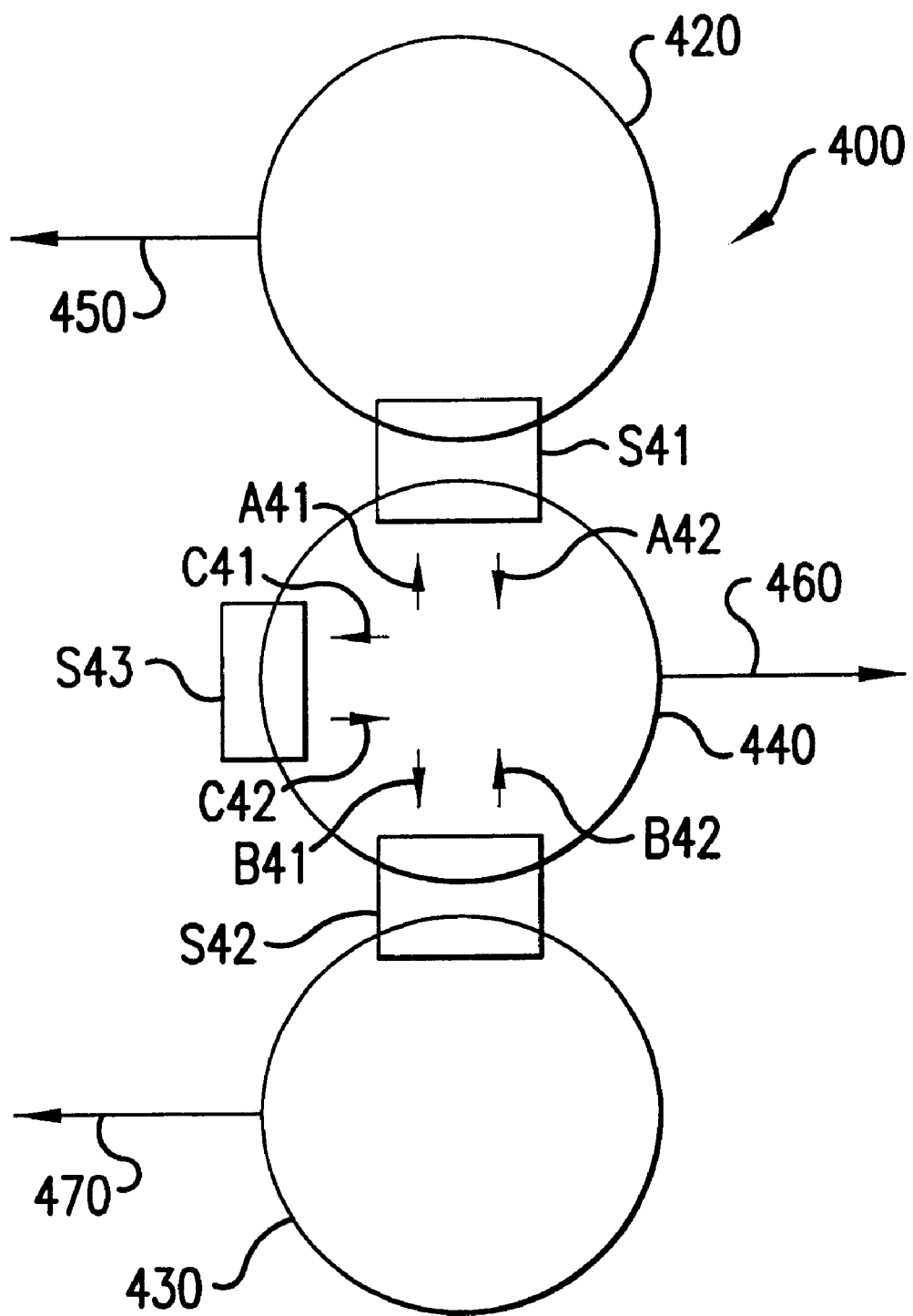
FIG. 22 is a schematic diagram showing still another example of a TFT fabrication unit.

TFT fabrication unit 400 of the present example shown in FIG. 22 consists of plasma CVD reactor 420 in which film deposition by plasma CVD and hydrogen or oxygen plasma processing occur, annealing chamber 430 in which rapid thermal annealing (RTA) or laser annealing occurs, and transfer chamber 440 which connects chambers 420 and 430. Transfer chamber 440 is equipped with a robot arm to transfer substrates between plasma CVD reactor 420 and annealing chamber 430 (the arm is not shown in the figure, but the directions of substrate movement are indicated by arrows A41, A42, B41, and B42). Plasma CVD reactor 420, annealing chamber 430, and transfer chamber 440 are equipped with vacuum systems 450, 460, and 470 which are provided with dry pumps or turbomolecular pumps such that substrates can be handled at reduced pressures, in non-oxidizing atmospheres, reducing gas atmospheres, or inert gas atmospheres. Plasma CVD reactor 420 and transfer chamber 440, and annealing chamber 430 and transfer chamber 440 are separated by shutters S41 and S42, respectively, which open and close and are related to sample introduction and removal as illustrated by arrows A41, A42, B41, and B42. Also, transfer chamber 440 and the outside world are separated by shutter S43 which opens and closes and is related to sample introduction and removal as illustrated by arrows C41 and C42. It is possible for the plasma CVD reactor and annealing chamber to use the configurations shown explained previously in FIGS. 12 and 13, respectively.

(TFT Fabrication Process)

Next, the TFT fabrication process of the present example will be explained with reference to FIGS. 22 and 23. FIG. 23 is a cross-section of the TFT fabrication process of the present example, and within these process steps, those shown from FIG. 23(B) to those shown in FIG. 23(E) are performed in TFT fabrication unit 100 shown in FIG. 22. The present example corresponds to the fabrication process explained with reference to FIG. 7.

Figure 23A:
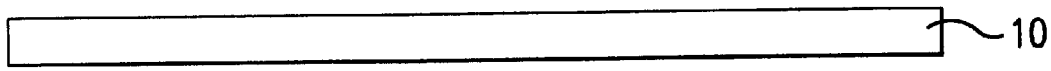
FIGS. 23(A)–23(E) are a cross-section process diagram of one portion of the TFT fabrication process of Example 4 and Example 5 of the present invention.

First, as shown in FIG. 23(A), a glass or other type of substrate 10 which has been cleaned by ultrasonic cleaning is prepared and inserted into transfer chamber 440 of TFT fabrication unit 400. After reaching a pressure of between approximately $10^{-7}$ Torr and $10^{-1}$ Torr, substrate 10 is transferred from transfer chamber 440 to reaction chamber 401 in plasma CVD reactor 420.

Figure 23B:
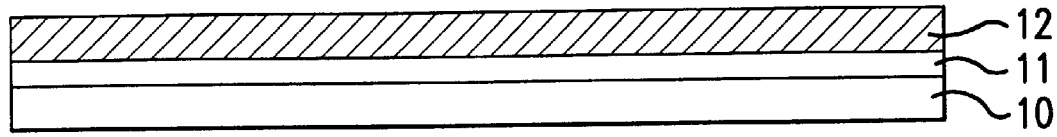
Figure 23C:
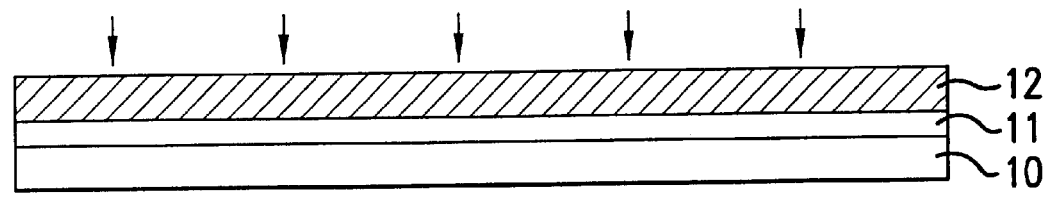

As shown in FIG. 23(B), after the substrate has been set in reaction chamber 401 of plasma CVD reactor 420 which is at reduced pressure, underlevel protection layer 11 consisting of a silicon oxide film or silicon nitride film is formed by plasma CVD over the entire surface of substrate 10 at a substrate temperature of between approximately 150° C. and 450° C. (underlevel protection layer formation process). In addition to a single layer insulator film of silicon oxide or silicon nitride as underlevel protection layer 12, it is also possible to use multilayer films of these materials.

(First Process Step ST1G)

Next, without exposing substrate 10 to atmosphere, semiconductor layer 12 consisting of an amorphous silicon film, for example, is formed in the interior of reactor chamber 201 of plasma CVD reactor 420 by plasma CVD over the entire surface of substrate 10 at a substrate temperature of between approximately 150° C. and 450° C. while keeping substrate 10 at reduced pressure (semiconductor layer formation process ST12). At this point, it is possible to use disilane or monosilane, for example, as the source gas.

Next, after substrate 10 is removed from reaction chamber 401 in plasma CVD reactor 420 and transferred to transfer chamber 440, substrate 10 is transferred from transfer chamber 440 to annealing chamber 430. During this period, reaction chamber 401 of plasma CVD reactor 420, transfer chamber 440, and the interior of annealing chamber 430 are all maintained either at reduced pressure or in a non-oxidizing atmosphere; and the substrate is not exposed to atmosphere. As shown in FIG. 24(C), at least the surface layers of semiconductor layer 12 are crystallized through irradiation by high energy light (RTA light or laser light) from the light source, while either at reduced pressure or in a non-oxidizing atmosphere (hydrogen-containing atmosphere or an argon-containing reducing atmosphere) (melt crystallization process ST131 or solid phase crystallization process ST132). Here, the surface of substrate 10 and the surface of semiconductor layer 12 are not contaminated by resist or other contaminants; and, further, because no oxide layer is formed on the semiconductor surface, semiconductor layer 12 after crystallization has no impurity incorporation from the crystallization step and is extremely pure. Additionally, because there are no impurities in the semiconductor layer, there are no excess nuclei generated and large crystalline grains can be obtained.

Figure 23D:
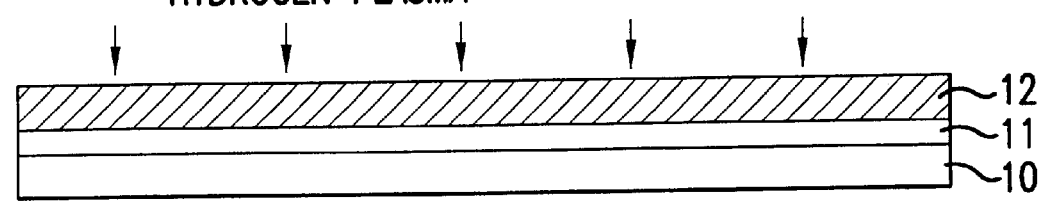
Figure 23E:
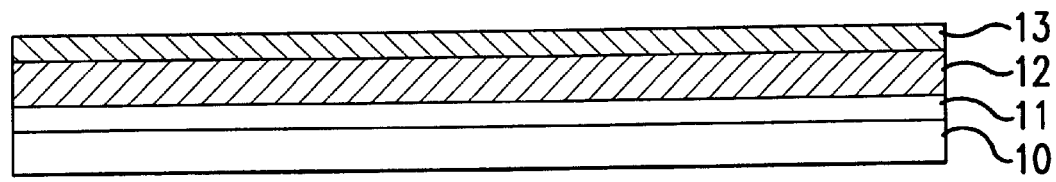

Next, after substrate 10 is removed from annealing chamber 430 and transferred to transfer chamber 440, substrate 10 is transferred from transfer chamber 440 to reaction chamber 401 in plasma CVD reactor 420. During this period as well, all of plasma CVD reactor 420 is maintained either at reduced pressure or in a non-oxidizing atmosphere; and the substrate is not exposed to atmosphere. In reaction chamber 401 of plasma CVD reactor 420, as shown in FIG. 23(D), substrate 10 is held at reduced pressure and irradiated with hydrogen plasma to decrease the defects which exist in crystallized semiconductor layer 12. That is, the irregular bonds in semiconductor layer 12 are terminated (hydrogenation process ST14). Oxygen plasma processing may also be used as this plasma processing step (oxidation process ST15). In this case, the defects in the semiconductor layer are terminated by oxygen. Because oxide layer formation follows plasma processing, the oxidation of the surface of the semiconductor layer by oxygen plasma is desirable to obtain a good MOS interface. Ideally, consecutive processing which includes oxygen plasma irradiation following hydrogen plasma irradiation without breaking vacuum, and then formation of first gate insulator layer following oxygen plasma irradiation, again without breaking vacuum, is desirable. Although normally the surface of a crystalline layer crystallized for a short time on the order of seconds in vacuum or a non-oxidizing atmosphere is extremely active such that it is easily contaminated by air-borne particulates if exposed to air, this active surface is terminated by hydrogen or oxygen in the present invention and therefore stabilized. A purity of approximately 99.9999% or more is desirable for the hydrogen or oxygen gas used to create the hydrogen or oxygen plasma, and a background pressure of approximately $10^{-6}$ Torr or better with respect to the pressure during plasma processing is required. For example, when oxygen plasma processing takes place at 1 Torr, a high vacuum of better than approximately $10^{-6}$ Torr is necessary for the background pressure.

Next, without exposing substrate 10 to atmosphere, first gate insulator layer 13 consisting of a silicon oxide film is formed by plasma CVD over the entire surface of substrate 10 at a substrate temperature of between approximately 150° C. and 450° C. (first gate insulator layer formation process ST16). At this point, a mixture of monosilane and nitrous oxide or TEOS and oxygen, for example, may be used as the source gas.

Next, after substrate 10 is removed from reaction chamber 401 in plasma CVD reactor 420 and transferred to transfer chamber 440, substrate 10 is removed from transfer chamber 440.

(Second Process Step ST2G)

Because the steps following the above are similar to those of Example 1 (FIG. 16), they will be explained briefly with reference to the same FIG. 16. First, as shown in FIG. 16(A), resist mask 22 with the prescribed mask pattern is formed; and, as shown in FIG. 16(B), first gate insulator layer 13 and semiconductor layer 12 are patterned using photolithography technology.

(Third Process Step ST3G)

Next, as shown in FIG. 16(C), second gate insulator layer 14 consisting of silicon oxide or silicon nitride is formed over the entire surface of substrate 10 by plasma CVD at a substrate temperature of between approximately 150° C. and 450° C. As a result, second gate insulator layer 14 covers both the surface and sides of semiconductor layer 12 (second gate insulator layer process). It is desirable to make second gate insulator layer 14 have excellent step coverage by using TEOS, for example. Of course, it is also acceptable to use a mixture of monosilane and nitrous oxide as the source gas for this purpose. It is also good to use a nitride film to increase the on current by increasing the dielectric constant of the insulating layer.

(Process Steps Following the Third Process Step)

Subsequent processing steps are the same as in Example 1, and the detailed explanations will be omitted.

Effects of Example 4

In the fabrication process described above, substrate 10 is not exposed to atmosphere through the formation of first gate insulator layer 13. Consequently, the surface of semiconductor layer 12 which has been crystallized by the annealing process does not oxidize through reactions with gas species, and is also not contaminated by hydrocarbons or other contaminants. Additionally, from the formation of the underlevel protection layer, the semiconductor layer also is processed continuously while isolated from atmosphere so that the semiconductor layer is also not contaminated from the surface of the underlevel protection layer. Thus, a high quality semiconductor layer can be easily produced. Because the interface between channel region 17 and gate insulator layer 13 is good, the electrical characteristics of TFT 30 such as TFT on current and threshold voltage improve. And, because the surface of semiconductor layer 10 is not exposed to atmosphere prior to hydrogenation ST14 (hydrogen plasma processing) and oxidation ST15 (oxygen plasma processing) following crystallization, there is no contamination of the MOS interface from the atmosphere. Since there are no effects from a natural oxide in hydrogenation ST14 and oxidation ST15, it is possible to uniformly obtain a large effect from short-time hydrogen plasma processing. As a result, the electrical conductivity of semiconductor layer 10 is stable; and the electrical characteristics of TFT 30 such as TFT on current improve. In particular, it is possible to easily form a stable, clean MOS interface by oxidation ST15.

In this example, as a result of the formation of first gate insulator layer 13 prior to patterning of semiconductor layer 12, following these patternings first gate insulator layer 13 does not remain on the side walls of semiconductor layer 12. The side walls of semiconductor layer 12 are covered, however, by second gate insulator 14 because second gate insulator layer 14 having good step coverage is formed prior to formation of gate electrode 15 consisting of conducting layer 21. Consequently, the number of defect components resulting from shorts is drastically reduced.

Because first gate insulator layer 13 is formed prior to patterning of semiconductor layer 12, resist mask 22 is formed on the surface of first gate insulator layer 13, and not formed on the surface of semiconductor layer 12. As a result, there is no contamination of the surface of semiconductor layer 12 from the resist; and the condition of the MOS interface between channel region 17 and gate insulator layer 13 is remarkably good.

In this example, substrate 10 is removed from TFT fabrication unit 400 following formation of first gate insulator layer 13; and superior results are obtained. If, as shown in FIG. 23(D), the surface of semiconductor layer 12 has been stabilized through hydrogen or oxygen plasma irradiation following crystallization ST13, however, it is also possible to remove the substrate. That is, after completion of the plasma processing of FIG. 23(D), it is possible to fabricate a TFT using process steps identical to process steps of the prior art. Although the MOS interface is inferior to those produced using the present invention when such a process is used, it is possible to produce TFTs with characteristics far superior to TFTs of the prior art while using similar process steps.

EXAMPLE 5

Next, the TFT fabrication process of the present example will be explained with reference to FIG. 24. In the TFT fabrication process of the present example, prior to the process steps shown in FIG. 24, the process steps shown in FIG. 23(A) through FIG. 23(E) are performed similar to Example 4. In this example as well, the process steps shown from FIG. 23(B) to those shown in FIG. 23(E) are performed in TFT fabrication unit 400 shown in FIG. 22. Within the fabrication process of the TFT in this example, the explanation for those which are shown in FIG. 23(A) to FIG. 23(D) will be omitted; and the explanation will begin with the process step shown in FIG. 23(E). The present example corresponds to the fabrication process explained with reference to FIG. 8.

(First Process Step ST1H)

Following insertion of substrate 10 shown in FIG. 23(A) into TFT fabrication unit 400, the process steps through the formation of the first gate insulator layer shown in FIG. 23(E) are exactly the same as those of the first process step in Example 4.

(Second Process Step ST2H)

Figure 24A:
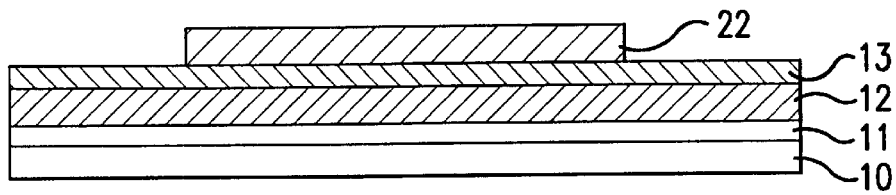
FIGS. 24(A)–24(G) are a cross-section process diagram showing process steps following the steps shown in FIGS. 23(A)–23(E) for the TFT fabrication process of Example 5 of the present invention.
Figure 24B:
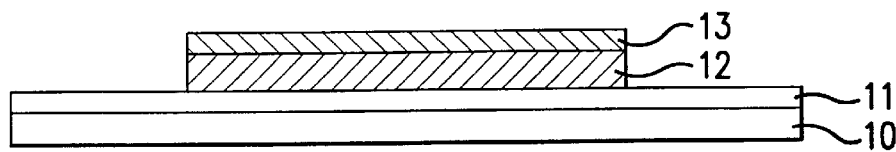
Figure 24C:
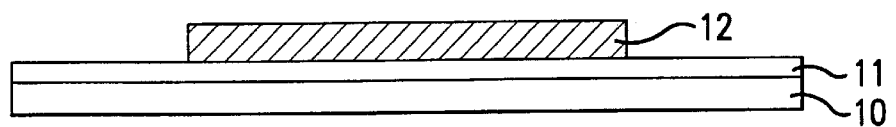

Next, as shown in FIG. 24(A), resist mask 22 with the prescribed mask pattern is formed; and, as shown in FIG. 24(B), first gate insulator layer 13 and semiconductor layer 12 are patterned using photolithography technology (patterning process).

(Third Process Step ST3H)

As shown in FIG. 24(C), first gate insulator layer 13 is removed under reduced pressure using dry etching (first gate insulator layer cleaning process). This process can also be accomplished using an aqueous solution of hydrofluoric acid or other etchant.

(Fourth Process Step ST4H)

Figure 24D:
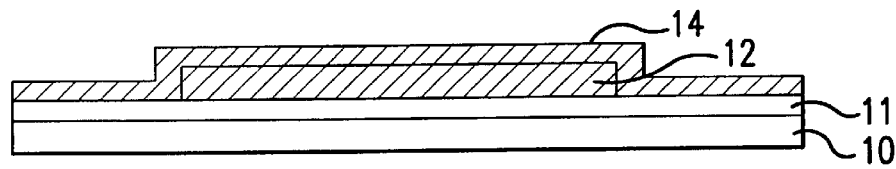
Figure 24E:
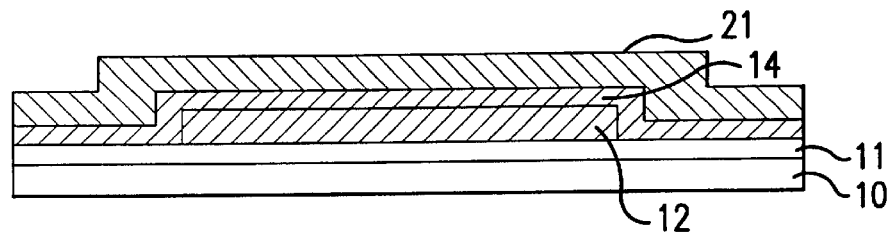
Figure 24F:
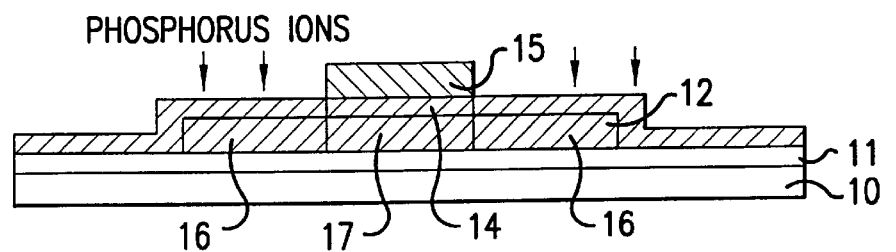
Figure 24G:
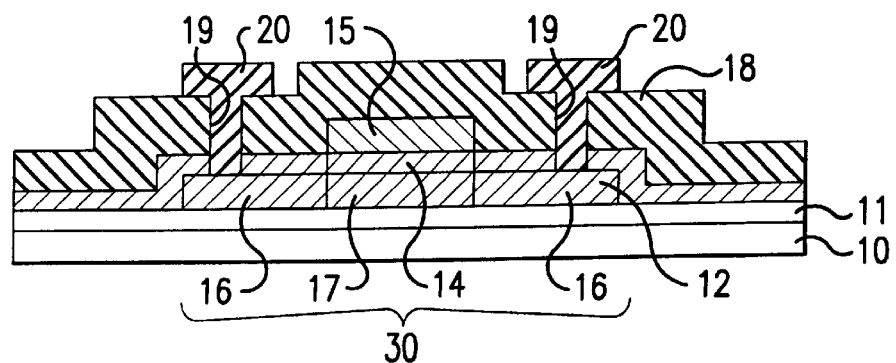
Figure 25A:
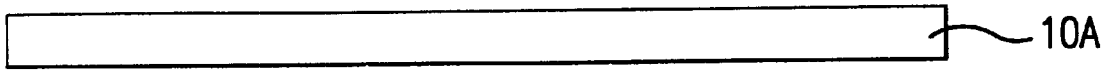
FIGS. 25(A)–25(C) are a cross-section process diagram of one portion of the TFT fabrication process of the prior art.
Figure 25B:
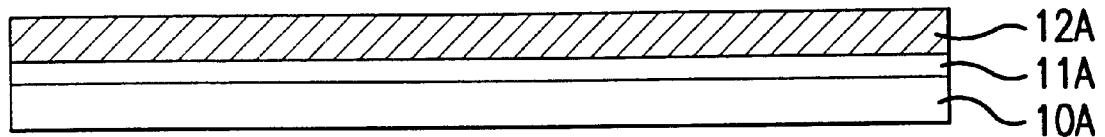
Figure 25C:
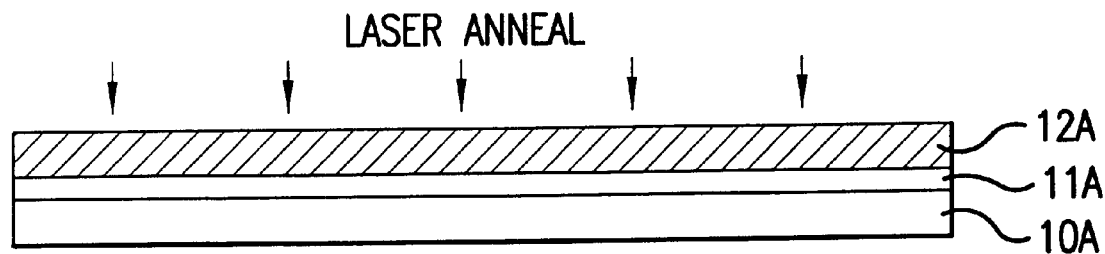
Figure 26A:
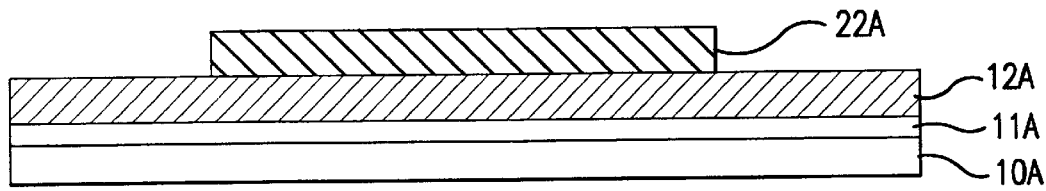
FIGS. 26(A)–26(E) are a cross-section process diagram showing process steps following the steps shown in FIGS. 25(A)–25(C) for the TFT fabrication process of the prior art.
Figure 26B:
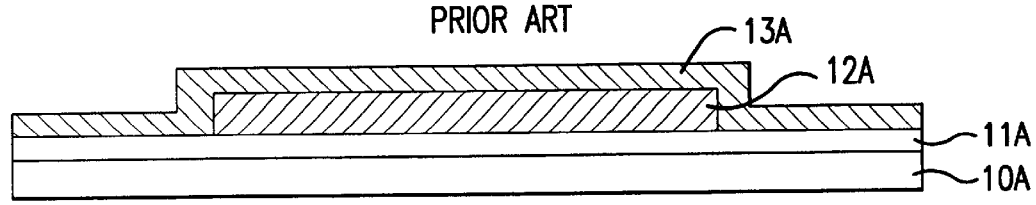
Figure 26C:
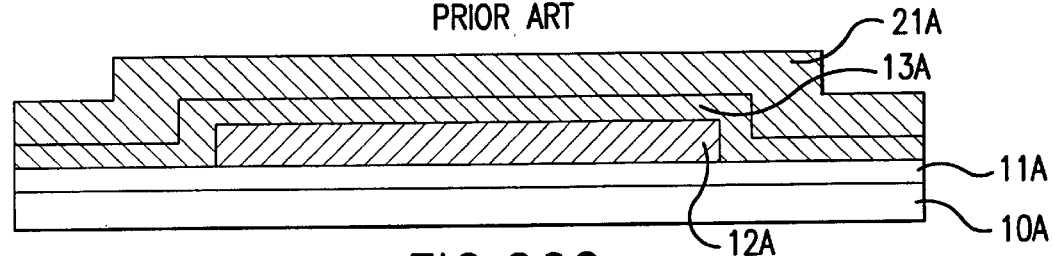
Figure 26D:
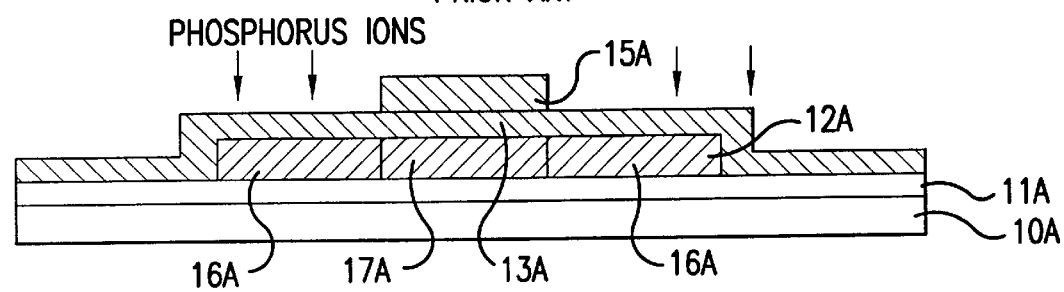
Figure 26E:
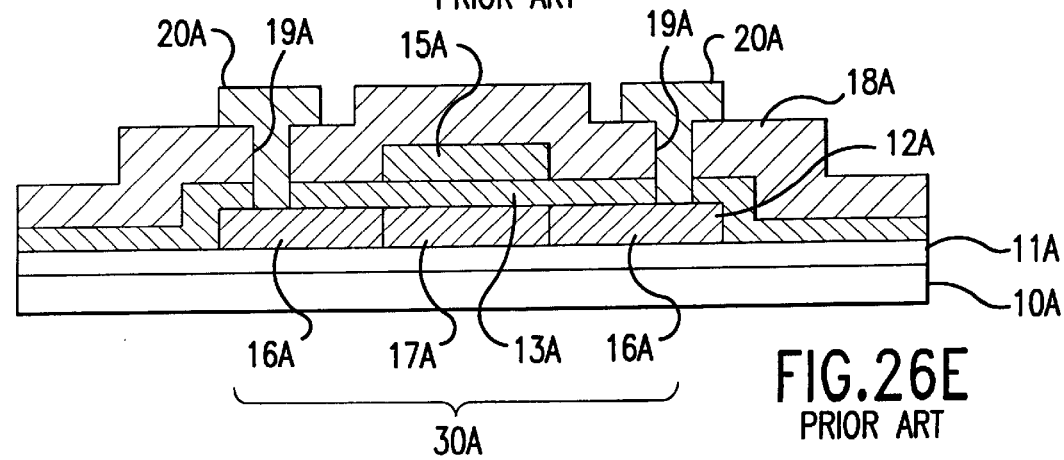
Figure 27A:
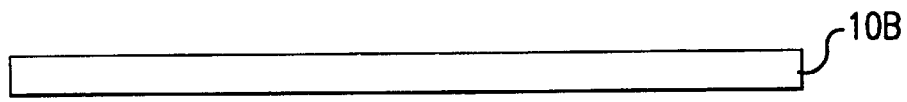
FIGS. 27(A)–27(F) are a cross-section process diagram of one portion of another TFT fabrication process of the prior art.
Figure 27B:
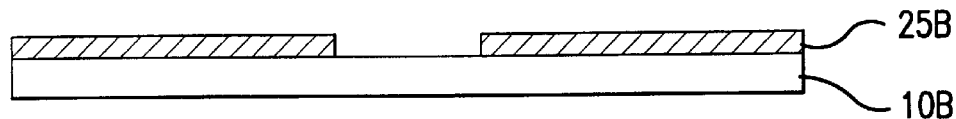
Figure 27C:
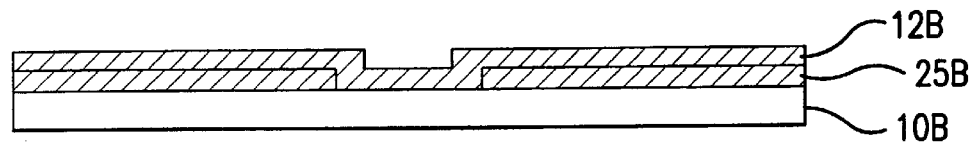
Figure 27D:
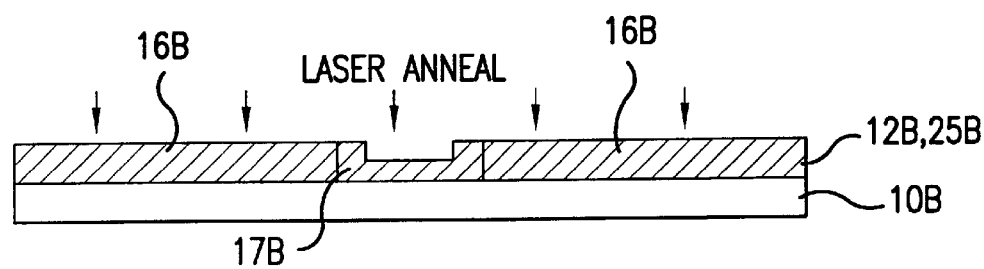
Figure 27E:
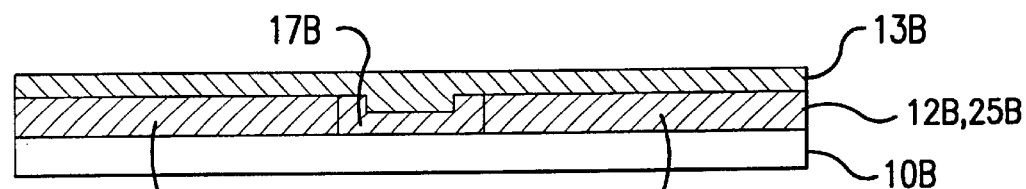
Figure 27F:
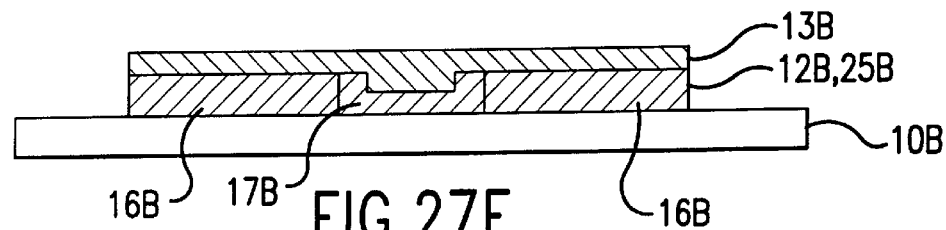
Figure 28A:
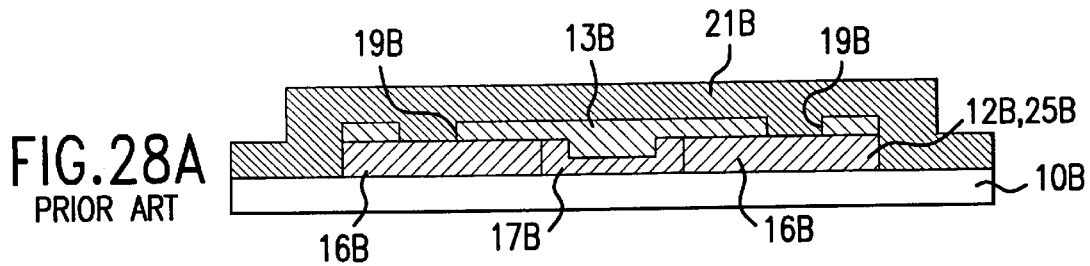
FIGS. 28(A)–28(E) are a cross-section process diagram showing process steps following the steps shown in FIGS. 27(A)–27(F) for a TFT fabrication process of the prior art.
Figure 28B:
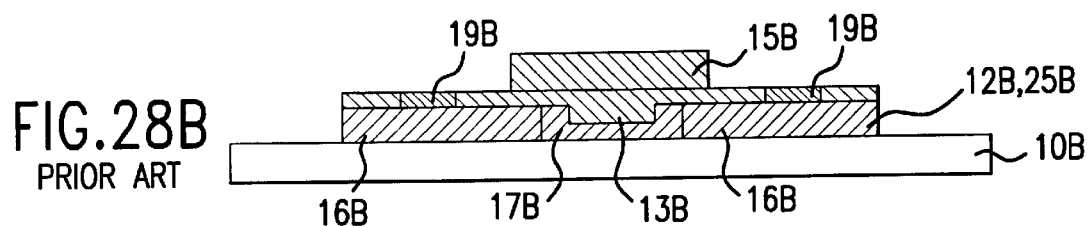
Figure 28C:
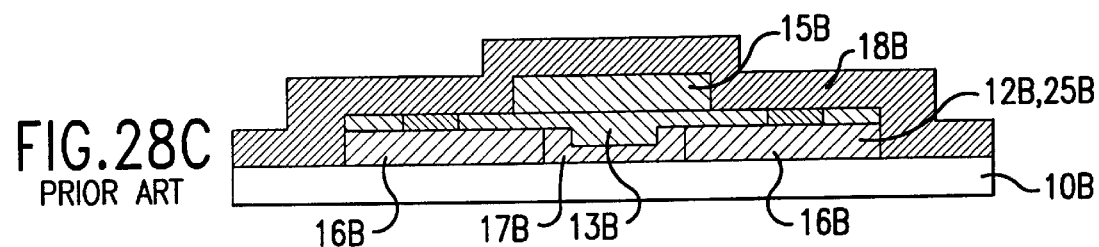
Figure 28D:
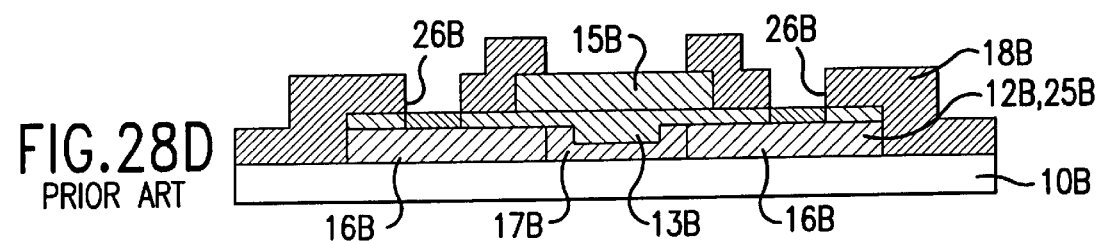
Figure 28E:
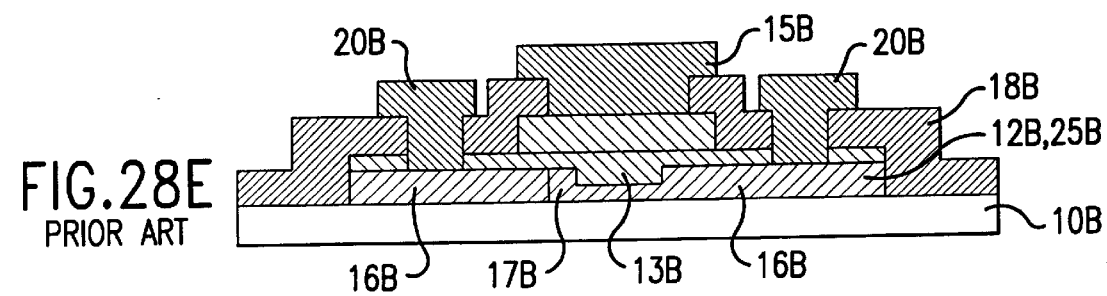

Next, as shown in FIG. 24(D), second gate insulator layer 14 consisting of a silicon oxide or silicon nitride film is formed over the entire surface of substrate 10 by plasma CVD or other method at a substrate temperature of between approximately 150° C. and 450° C. As a result, second gate insulator layer 14 covers both the surface and sides of semiconductor layer 12 (second gate insulator layer formation process). This step is the same as second gate insulator formation processing in Example 4. If the third process step is done using dry processing, the desirability of performing the fourth process step consecutively and using hydrogen or oxygen as the etching gas is the same as explained for the previous example.

(Process Steps Following the Fourth Process Step)

Subsequent processing steps are the same as in Example 1, and the detailed explanations will be omitted.

Effects of Example 5

In addition to all of the effects for Example 4, the following effects may also be obtained using the fabrication process described above. As shown in FIG. 24(B), although the surface of first gate insulator layer 13 is contaminated by resist mask 22 during the patterning of semiconductor layer 12 using photolithography, all or most of contaminated first gate insulator layer 13 is removed. Especially using dry processing, because clean, second gate insulator layer 14 is deposited consecutively following etching without exposing the substrate to atmosphere, the electrical characteristics of the TFT are stable. Additionally, because it is possible to make second gate insulator layer 14 thicker by the amount of first gate insulator layer 13 removed, the side walls of semiconductor layer 12 are more perfectly covered.

Although in Example 5 first gate insulator layer 13 contaminated by resist mask 22 is almost completely removed, in reality because only the surface is contaminated by resist, it is also acceptable to remove only the surface of first gate insulator layer 13. In this case, because the surface of semiconductor layer 12 is not exposed at all, even if the etching of first gate insulator layer 13 is done by wet etching, semiconductor layer 12 is not contaminated by the etching solution.

Other Examples Related to Examples 4 and 5

Although up to this point the examples have been explained while using plasma CVD for the formation of underlevel protection layer 11 and semiconductor layer 12 consisting of intrinsic amorphous silicon, sputtering may be used instead. For hydrogenation ST14 and other steps, the use of an ECR-CVD reactor employing microwave excitation and electromagnetic resonance phenomenon is also acceptable.

From the viewpoint of terminating the dangling bonds in semiconductor layer 12, performing only oxidation ST15 (oxygen plasma processing) instead of hydrogenation ST14 (hydrogen plasma processing) is good. When using both hydrogenation ST14 and oxidation ST15 and looking from the viewpoint of oxidizing the silicon atoms as much as possible, it is better to perform hydrogenation ST14 after oxidation ST15.

For the TFT fabrication units, it is also acceptable to use machines which do not have a single CVD chamber but rather individual CVD chambers each devoted to a different purpose such as shown in FIGS. 9, 10, 11, 20, and 21. Further, units which have the CVD chamber directly connected to the annealing chamber are also satisfactory.

Although making both first gate insulator layer 13 and second gate insulator layer 14 silicon oxide can suppress the influence of the space charge, it is also acceptable to make first gate insulator layer 13 silicon oxide and make second gate insulator layer 14 a different insulator layer such as aluminum oxide or tantalum oxide.

EXAMPLE 6

An active matrix substrate for a color LCD having 200 (rows)×320 (columns)×3 (colors)=192,000 pixel switching elements using NMOS thin film semiconductor devices obtained as described in the examples above and integrated 6-bit digital data drivers (column drivers) and scanning drivers (row drivers) using CMOS thin film semiconductor devices obtained as described in the examples above was produced. The digital data driver of this example is comprised of a clock signal line and clock generator circuit, shift register circuit, NOR gates, digital video signal lines, latch circuit 1, latch pulse line, latch circuit 2, reset line 1, AND gates, reference voltage line, reset line 2, 6-bit capacitance division D/A converter, CMOS analog switches, common voltage line, and a source line reset transistor. The outputs from the CMOS analog switches are connected to the pixel source lines. The capacitance of the D/A converter portion satisfies the relationship $C_0=C_1/2=C_2/4=C_3/8=C_4/16=C_5/32$. Digital video signals output from the video random access memory (VRAM) of a computer can be input directly to the digital video signal lines. In the pixel portion of the active matrix substrate described in this example, the source electrodes, source interconnects, and drain electrode (pixel electrode) are comprised of aluminum, forming a reflective LCD. A liquid crystal panel was produced that employed an active matrix substrate achieved as described for one of the two substrates in the substrate pair. A normally-black mode (the display is black when a voltage is not being applied to the liquid crystal) reflective liquid crystal panel was made using a polymer-dispersed liquid crystal (PDLC) with dispersed black pigment for the liquid crystal held between the substrate pair. This liquid crystal panel was connected to external wiring to produce a liquid crystal display. The result was a liquid crystal display device having high display quality: both the on resistance and transistor capacitance of the NMOS and PMOS were equal; moreover, the TFTs offered high performance, while the parasitic capacitance of the transistors was extremely low; and, because the characteristics were uniform over the entire substrate, both 6-bit digital data drivers and scanning drivers operated normally in a wide operating region. In the pixel region, since the aperture ratio was high, a high display quality liquid crystal device was achieved even with a dispersed black pigment PDLC. In addition, because the manufacturing process for the active matrix substrate is reliable, liquid crystal display devices can be manufactured reliably and at low cost.

This liquid crystal display was installed in the body of a full-color portable personal computer (notebook PC). Since the active matrix substrate was equipped with integrated 6-bit digital data drivers and since digital video signals from the computer were input directly to the liquid crystal display device, the circuit configuration was simplified, while power consumption was simultaneously reduced to an extremely low level. The high performance of the liquid crystal thin film semiconductor device gave this notebook PC an extremely attractive display screen and made it a good electronic device. In addition, because this is a reflective liquid crystal display device with high aperture ratio, a backlight was unnecessary. The absence of a backlight made it possible to decrease the size and weight of the batteries while simultaneously extending the length of time they can be used. Accordingly, an extremely small, light-weight electronic device with a beautiful display screen which has the potential for long-time use was fabricated.

POSSIBLE INDUSTRIAL APPLICATIONS

As stated above, the method of fabricating thin film semiconductor devices described by this invention enables the manufacture of high performance thin film semiconductor devices using a low temperature process in which inexpensive glass substrates can be used. Therefore, applying this invention to the manufacture of active matrix liquid crystal display devices permits large-size, high-quality liquid crystal display devices to be manufactured easily and reliably. Moreover, when this invention is applied to the manufacture of other electronic circuits, high quality electronic circuits can also be manufactured easily and reliably; and high performance electronic devices can be produced.

Additionally, because of their low cost and high performance, the thin film semiconductor devices of this invention are perfectly suited for the active matrix substrate of an active matrix liquid crystal display device. They are optimum devices to use as integrated-driver active matrix substrates which demand particularly high performance.

Their low cost and high performance also make the liquid crystal displays of the present invention optimum for full-color notebook PCs and other types of displays. Because of their low cost and high performance, the electronic devices of this invention will likely gain wide general acceptance.

What is claimed is:

1. A fabrication process for a thin film transistor that includes at least:

a first process step comprising:

formation of a semiconductor layer on a substrate without exposing the substrate to atmosphere;

crystallization of the semiconductor layer without exposing the substrate to atmosphere, followed by oxidation treatment of the substrate without exposing the substrate to atmosphere, followed by formation of a first gate insulator layer on the semiconductor layer during which the substrate is not exposed to atmosphere;

a second process step, following completion of the first step, which involves a patterning of the semiconductor layer and the first gate insulator layer by using a single mask; and a third process step, following completion of the second step, which involves formation of a second gate insulator layer at least on the first gate insulator layer.

2. A manufacturing method for a display device using the fabrication process in claim 1.

3. A manufacturing method for an electronic apparatus using the fabrication process in claim 1.

4. A fabrication process for a thin film transistor, which includes at least:

a first process step comprising:

formation of a semiconductor layer on a substrate, followed by crystallization of the semiconductor layer during which the substrate is isolated from atmosphere;

formation of a first gate insulator layer on the semiconductor layer without exposing the substrate to atmosphere, a second process step, following completion of the first step, which involves a patterning of the semiconductor layer and the first gate insulator layer by using a single mask;

a third process step, following completion of the second step, which involves formation of a second gate insulator layer at least on the first gate insulator layer; and a fourth process step, following completion of the third process step, which involves thermal processing of the first gate insulator layer, the second gate insulator layer, and the semiconductor layer.

5. A manufacturing method for a display device using the fabrication process in claim 4.

6. A manufacturing method for an electronic apparatus using the fabrication process in claim 4.

7. A fabrication process for a thin film transistor that includes at least:

a first process step comprising:

formation of an underlevel protection layer on a substrate without exposing the substrate to atmosphere;

formation of a semiconductor layer on the underlevel protection layer without exposing the substrate to atmosphere;

crystallization of the semiconductor layer without exposing the substrate to atmosphere, followed by formation of a first gate insulator layer on the semiconductor layer during which the substrate is not exposed to atmosphere, a second process step, following completion of the first step, which involves a patterning of the semiconductor layer and the first gate insulator layer by using a single mask; and a third process step, following completion of the second step, which involves formation of a second gate insulator layer at least on the first gate insulator layer.

8. A manufacturing method for a display device using the fabrication process in claim 7.

9. A manufacturing method for an electronic apparatus using the fabrication process in claim 7.

10. A fabrication process for a thin film transistor which includes at least:

a first process step which involves the formation of a semiconductor layer on a substrate which is isolated from atmosphere, followed by crystallization of said semiconductor layer in a non-oxidizing atmosphere without exposing said substrate to atmosphere, followed by formation of a first gate insulator layer on top of said semiconductor layer during which said substrate is not exposed to atmosphere;

a second process step, following completion of the first process step, which involves thermal processing of said first gate insulator layer and said semiconductor layer;

a third process step, following completion of the second process step, which involves patterning of said first gate insulator layer and said semiconductor layer;

and a fourth process step, following completion of the third process step, which involves hydrogenation of said substrate followed by formation of a second gate insulator layer on the surface of said first gate insulator layer.

11. A manufacturing method for a display device using the fabrication process in claim 10.

12. A manufacturing method for an electronic apparatus using the fabrication process in claim 10.

* * * * *